United States Patent
Lochun et al.

(10) Patent No.: US 12,299,210 B2
(45) Date of Patent: May 13, 2025

(54) HUMAN-COMPUTER INTERFACE SYSTEM

(71) Applicant: Sensel, Inc., Sunnyvale, CA (US)

(72) Inventors: Darren Lochun, Sunnyvale, CA (US); Ilya Daniel Rosenberg, Sunnyvale, CA (US); Shuangming Li, Sunnyvale, CA (US); Ninad Sathe, Sunnyvale, CA (US); Harsha Rao, Sunnyvale, CA (US)

(73) Assignee: Sensel, Inc., Sunnyvale, CA (US)

( * ) Notice: Subject to any disclaimer, the term of this patent is extended or adjusted under 35 U.S.C. 154(b) by 0 days.

(21) Appl. No.: 18/205,998

(22) Filed: Jun. 5, 2023

(65) Prior Publication Data

US 2023/0315214 A1 Oct. 5, 2023

Related U.S. Application Data

(63) Continuation-in-part of application No. 18/204,818, filed on Jun. 1, 2023, and a continuation-in-part of
(Continued)

(51) Int. Cl.
*G06F 3/01* (2006.01)
*G06F 3/02* (2006.01)
(Continued)

(52) U.S. Cl.
CPC ............ *G06F 3/0202* (2013.01); *G06F 3/016* (2013.01); *H01H 13/85* (2013.01);
(Continued)

(58) Field of Classification Search
CPC ...... G06F 3/0202; G06F 3/016; G06F 1/1643; G06F 1/169; G06F 3/03547;
(Continued)

(56) References Cited

U.S. PATENT DOCUMENTS

| | | |
|---|---|---|
| 4,959,631 A | 9/1990 | Hasegawa et al. |
| 8,981,242 B2 | 3/2015 | Bayramoglu |

(Continued)

FOREIGN PATENT DOCUMENTS

| | | |
|---|---|---|
| CN | 102007465 A | 4/2011 |
| CN | 102341768 A | 2/2012 |

(Continued)

OTHER PUBLICATIONS

International Search Report received in PCT/US19/21466 dated Jun. 21, 2019.
International Search Report received in PCT/US21/0753 dated Jul. 27, 2021.
ISR received in PCT/US2021/040404 dated Oct. 20, 2021.
ISR received in PCT/US21/53660 dated Dec. 30, 2021.
(Continued)

*Primary Examiner* — Ibrahim A Khan
(74) *Attorney, Agent, or Firm* — Run8 Patent Group, LLC; Peter Miller; Alexander Rodriguez

(57) ABSTRACT

One variation of a touch sensor system includes a set of touch layers: spanning a first area; and including a set of electrodes. The system further includes a set of inductor layers: arranged below the set of touch layers; spanning a second area less than the first area; and including a set of spiral traces defining an inductor. The system also includes a magnetic element arranged below the set of inductor layers and defining a first polarity facing the inductor. The system further includes a controller configured to: read a set of electrical values from the set of electrodes; interpret a force magnitude of a touch input based on the set of electrical values; and in response to the force magnitude exceeding a force magnitude, drive an oscillating voltage across the inductor to induce alternating magnetic coupling between the inductor and the magnetic element.

19 Claims, 28 Drawing Sheets

Related U.S. Application Data application No. 18/099,698, filed on Jan. 20, 2023, now Pat. No. 12,050,748, and a continuation-in-part of application No. 17/946,931, filed on Sep. 16, 2022, now Pat. No. 12,093,458, said application No. 18/204,818 is a continuation of application No. 17/855,747, filed on Jun. 30, 2022, now Pat. No. 11,703,950, said application No. 18/099,698 is a continuation of application No. 17/669,209, filed on Feb. 10, 2022, now Pat. No. 11,592,935, said application No. 17/946,931 is a continuation of application No. 17/626,669, filed as application No. PCT/US2021/053660 on Oct. 5, 2021, now Pat. No. 11,880,506, said application No. 17/855,747 is a continuation of application No. 17/367,572, filed on Jul. 5, 2021, now Pat. No. 11,422,631, said application No. 17/669,209 is a continuation of application No. 17/191,636, filed on Mar. 3, 2021, now Pat. No. 11,281,330, said application No. 17/367,572 is a continuation-in-part of application No. 17/092,002, filed on Nov. 6, 2020, now Pat. No. 11,360,563, which is a continuation of application No. 16/297,426, filed on Mar. 8, 2019, now Pat. No. 10,866,642, which is a continuation-in-part of application No. 15/845,751, filed on Dec. 18, 2017, now Pat. No. 10,564,839, which is a continuation-in-part of application No. 15/476,732, filed on Mar. 31, 2017, now Pat. No. 10,331,265.

(60) Provisional application No. 63/446,756, filed on Feb. 17, 2023, provisional application No. 63/395,175, filed on Aug. 4, 2022, provisional application No. 63/348,677, filed on Jun. 3, 2022, provisional application No. 63/088,359, filed on Oct. 6, 2020, provisional application No. 63/063,168, filed on Aug. 7, 2020, provisional application No. 63/048,071, filed on Jul. 3, 2020, provisional application No. 63/040,433, filed on Jun. 17, 2020, provisional application No. 62/984,448, filed on Mar. 3, 2020, provisional application No. 62/640,138, filed on Mar. 8, 2018, provisional application No. 62/343,453, filed on May 31, 2016, provisional application No. 62/316,417, filed on Mar. 31, 2016.

(51) Int. Cl.
  *H01H 13/85* (2006.01)
  *H01H 3/00* (2006.01)
  *H01H 13/785* (2006.01)

(52) U.S. Cl.
  CPC ..... *H01H 2003/008* (2013.01); *H01H 13/785* (2013.01); *H01H 2201/036* (2013.01); *H01H 2215/05* (2013.01)

(58) Field of Classification Search
  CPC . G06F 2203/04105; G06F 2203/04107; G06F 3/0445; G06F 3/0446; G06F 3/0447; G06F 3/04886; H01H 13/85; H01H 13/785; H01H 2003/008; H01H 2201/036; H01H 2215/05; H03K 2217/96062; H03K 17/98
  See application file for complete search history.

(56) References Cited

U.S. PATENT DOCUMENTS

| | | | |
|---|---|---|---|
| 9,019,207 B1 | 4/2015 | Hamburgen et al. | |
| 9,158,377 B2 | 10/2015 | Shinozaki | |
| 9,229,592 B2 | 1/2016 | Bulea et al. | |
| 9,454,268 B2 | 9/2016 | Badaye et al. | |
| 9,829,981 B1 | 11/2017 | Ji | |
| 10,101,859 B2 | 10/2018 | Jin | |
| 10,209,846 B2 | 2/2019 | Wang et al. | |
| 10,459,542 B1 | 10/2019 | Costante et al. | |
| 10,564,839 B2 | 2/2020 | Rosenberg et al. | |
| 10,585,481 B2 | 3/2020 | Czelnik et al. | |
| 10,635,248 B2 | 4/2020 | Hinson et al. | |
| 10,866,642 B2 * | 12/2020 | Rosenberg | G06F 3/045 |
| 10,963,059 B2 | 3/2021 | Rosenberg et al. | |
| 11,360,563 B2 | 6/2022 | Rosenberg et al. | |
| 11,394,385 B1 | 7/2022 | Wang et al. | |
| 11,422,631 B2 * | 8/2022 | Junus | G06F 3/045 |
| 11,592,903 B2 | 2/2023 | Rosenberg et al. | |
| 11,842,022 B2 * | 12/2023 | Kim | G06F 3/03545 |
| 11,989,362 B1 * | 5/2024 | Glad | H01F 27/2885 |
| 12,003,196 B2 * | 6/2024 | Kim | G06F 3/016 |
| 2002/0149561 A1 | 10/2002 | Fukumoto et al. | |
| 2003/0095095 A1 | 5/2003 | Pihlaja | |
| 2005/0038944 A1 | 2/2005 | Harada et al. | |
| 2005/0180082 A1 | 8/2005 | Nakamura et al. | |
| 2007/0015966 A1 | 1/2007 | Niwa et al. | |
| 2008/0202251 A1 | 8/2008 | Serban et al. | |
| 2009/0091548 A1 | 4/2009 | Fujii et al. | |
| 2009/0256817 A1 | 10/2009 | Perlin et al. | |
| 2010/0128002 A1 | 5/2010 | Stacy et al. | |
| 2010/0141411 A1 * | 6/2010 | Ahn | G06F 3/0445 345/173 |
| 2010/0141606 A1 | 6/2010 | Bae et al. | |
| 2010/0156818 A1 | 6/2010 | Burrough et al. | |
| 2010/0231530 A1 | 9/2010 | Lin et al. | |
| 2010/0253633 A1 | 10/2010 | Nakayama et al. | |
| 2011/0025631 A1 | 2/2011 | Han | |
| 2011/0025648 A1 | 2/2011 | Laurent et al. | |
| 2011/0090151 A1 | 4/2011 | Huang et al. | |
| 2011/0134061 A1 | 6/2011 | Lim | |
| 2011/0248957 A1 | 10/2011 | Park | |
| 2012/0050207 A1 | 3/2012 | Westhues et al. | |
| 2012/0068938 A1 | 3/2012 | Kontio | |
| 2012/0068971 A1 | 3/2012 | Pemberton-Pigott | |
| 2012/0154316 A1 | 6/2012 | Kono | |
| 2012/0188194 A1 | 7/2012 | Sulem et al. | |
| 2012/0235942 A1 | 9/2012 | Shahoian et al. | |
| 2012/0286847 A1 * | 11/2012 | Peshkin | G06F 3/0446 327/517 |
| 2012/0293450 A1 | 11/2012 | Dietz et al. | |
| 2012/0306798 A1 * | 12/2012 | Zoller | G06F 3/0488 345/173 |
| 2013/0187742 A1 | 7/2013 | Porter et al. | |
| 2013/0264179 A1 | 10/2013 | Ryonai et al. | |
| 2014/0002113 A1 | 1/2014 | Schediwy et al. | |
| 2014/0008203 A1 | 1/2014 | Nathan et al. | |
| 2014/0168124 A1 * | 6/2014 | Park | G06F 3/0488 345/173 |
| 2014/0176478 A1 * | 6/2014 | Kern | G06F 3/0488 345/173 |
| 2014/0347311 A1 | 11/2014 | Joharapurkar et al. | |
| 2014/0362014 A1 | 12/2014 | Ullrich et al. | |
| 2015/0002416 A1 | 1/2015 | Koike et al. | |
| 2015/0002446 A1 * | 1/2015 | Ayzenberg | G06F 3/0446 345/174 |
| 2015/0054768 A1 | 2/2015 | Grant et al. | |
| 2015/0091858 A1 | 4/2015 | Rosenberg et al. | |
| 2015/0153829 A1 | 6/2015 | Shiraishi | |
| 2015/0185842 A1 | 7/2015 | Picciotto et al. | |
| 2015/0185848 A1 | 7/2015 | Levesque et al. | |
| 2016/0062574 A1 | 3/2016 | Anzures et al. | |
| 2016/0165931 A1 | 6/2016 | Lengerich et al. | |
| 2016/0209441 A1 | 7/2016 | Mazzeo et al. | |
| 2016/0259411 A1 | 9/2016 | Yoneoka et al. | |
| 2016/0370899 A1 | 12/2016 | Chang et al. | |
| 2017/0076885 A1 | 3/2017 | Stryker | |
| 2017/0285848 A1 | 10/2017 | Rosenberg et al. | |
| 2017/0336891 A1 | 11/2017 | Rosenberg et al. | |
| 2017/0336904 A1 | 11/2017 | Hsieh et al. | |
| 2017/0344115 A1 | 11/2017 | Ji | |
| 2018/0039351 A1 | 2/2018 | Zhu et al. | |
| 2018/0059791 A1 | 3/2018 | Hajati | |

(56) References Cited

U.S. PATENT DOCUMENTS

| | | | |
|---|---|---|---|
| 2018/0081483 A1* | 3/2018 | Camp | G06F 3/016 |
| 2018/0085786 A1* | 3/2018 | Songatikamas | B06B 1/045 |
| 2018/0090253 A1* | 3/2018 | Songatikamas | G06F 3/0416 |
| 2018/0218859 A1* | 8/2018 | Ligtenberg | H01H 13/85 |
| 2019/0196646 A1 | 6/2019 | Rosenberg et al. | |
| 2019/0212874 A1 | 7/2019 | Nathan et al. | |
| 2019/0265834 A1 | 8/2019 | Rosenberg et al. | |
| 2019/0339776 A1* | 11/2019 | Rosenberg | G06F 3/045 |
| 2021/0109615 A1 | 4/2021 | Hu et al. | |
| 2021/0278966 A1* | 9/2021 | Rosenberg | G06F 3/016 |
| 2021/0333880 A1* | 10/2021 | Junus | G06F 3/045 |
| 2022/0011868 A1* | 1/2022 | Junus | G06F 3/045 |
| 2022/0334645 A1* | 10/2022 | Junus | G06F 3/045 |
| 2023/0260314 A1* | 8/2023 | Rosenberg | G06V 40/1306 |
| 2024/0402854 A1* | 12/2024 | Glad | G06F 3/016 |

FOREIGN PATENT DOCUMENTS

| | | |
|---|---|---|
| CN | 102929422 A | 2/2013 |
| CN | 101828161 B | 4/2013 |
| CN | 104199563 B | 3/2017 |
| CN | 2017800447924 | 9/2021 |
| EP | 0469255 A1 | 2/1992 |
| EP | 0469255 B1 | 6/1995 |
| EP | 2375308 A1 | 10/2011 |
| EP | 3043240 A1 | 7/2016 |
| WO | 2011111906 A1 | 9/2011 |
| WO | 2019021466 A1 | 1/2019 |
| WO | 2019156672 A1 | 8/2019 |

OTHER PUBLICATIONS

Non-Final Office Action for U.S. Appl. No. 17/557,024 dated Aug. 9, 2022.
Non-Final Office Action for U.S. Appl. No. 17/946,931 dated Aug. 2, 2023.
Non-Final Office Action for U.S. Appl. No. 18/099,698 dated Aug. 2, 2023.
Non-Final Office Action for U.S. Appl. No. 18/102,519 dated Jul. 5, 2023.
Notice of Allowance and Fees Due for U.S. Appl. No. 17/367,572 dated Apr. 18, 2022.
Notice of Allowance and Fees Due for U.S. Appl. No. 17/367,572 dated Nov. 12, 2021.
Notice of Allowance and Fees Due for U.S. Appl. No. 17/367,576 dated Jun. 23, 2022.
Notice of Allowance and Fees Due for U.S. Appl. No. 17/586,524 dated Feb. 6, 2023.
Notice of Allowance and Fees Due for U.S. Appl. No. 17/669,209 dated Nov. 3, 2022.
Notice of Allowance Received in U.S. Appl. No. 17/092,002 dated Feb. 16, 2022.
Notice of Allowance received in U.S. Appl. No. 17/191,636 dated Oct. 1, 2021.
Notice of Allowance received in U.S. Appl. No. 17/367,572 dated Feb. 3, 2022.
Notice of Allowance received in U.S. Appl. No. 17/191,631 dated Oct. 27, 2021.
Office Action received in U.S. Appl. No. 16/297,426 dated Apr. 22, 2020.
Office Action received in CN 202180032862.0 dated Mar. 29, 2023.

* cited by examiner

HUMAN-COMPUTER INTERFACE SYSTEM

CROSS-REFERENCE TO RELATED APPLICATIONS

This application claims the benefit of U.S. Provisional Patent Application Nos. 63/348,677, filed on 3 Jun. 2022, 63/395,175, filed on 4 Aug. 2022, and 63/446,756, filed on 17 Feb. 2023, each of which is incorporated in its entirety by this reference.

This application is a continuation-in-part application of U.S. patent application Ser. No. 17/946,931, filed on 16 Sep. 2022, which is a continuation of U.S. patent application Ser. No. 17/626,669, filed on 12 Jan. 2022, which claims the benefit under 35 U.S.C. 371 to International Application No. PCT/US21/53660, filed on 5 Oct. 2021, which claims priority to U.S. Provisional Patent Application 63/088,359, filed on 6 Oct. 2020, each of which is incorporated in its entirety by this reference.

This Application is also a continuation-in-part application of U.S. patent application Ser. No. 18/204,818, filed on 1 Jun. 2023, which is a continuation of U.S. patent application Ser. No. 17/855,747, filed on 30 Jun. 2022, which is a continuation of U.S. patent application Ser. No. 17/367,572, filed on 5 Jul. 2021, which claims priority to U.S. Provisional Application No. 63/048,071, filed on 3 Jul. 2020, which is incorporated in its entirety by this reference.

U.S. patent application Ser. No. 17/367,572 is also a continuation-in-part application of U.S. patent application Ser. No. 17/092,002, filed on 6 Nov. 2020, which is a continuation application of U.S. patent application Ser. No. 16/297,426, filed on 8 Mar. 2019, which claims the benefit of U.S. Provisional Application No. 62/640,138, filed on 8 Mar. 2018, each of which is incorporated in its entirety by this reference.

U.S. patent application Ser. No. 16/297,426 is also a continuation-in-part application of U.S. patent application Ser. No. 15/845,751, filed on 18 Dec. 2017, which is a continuation-in-part application of U.S. patent application Ser. No. 15/476,732, filed on 31 Mar. 2017, which claims the benefit of U.S. Provisional Application No. 62/316,417, filed on 31 Mar. 2016, and U.S. Provisional Application No. 62/343,453, filed on 31 May 2016, each of which is incorporated in its entirety by this reference.

This application is also a continuation-in-part application of U.S. patent application Ser. No. 18/099,698, filed on 20 Jan. 2023, which is a continuation of U.S. Non-Provisional patent application Ser. No. 17/669,209, filed on 10 Feb. 2022, which is a continuation of U.S. Non-Provisional patent application Ser. No. 17/191,636, filed on 3 Mar. 2021, and claims the benefit of U.S. Provisional Patent Application Nos. 62/984,448, filed on 3 Mar. 2020, 63/040,433, filed on 17 Jun. 2020, and 63/063,168, filed on 7 Aug. 2020, each of which is incorporated in its entirety by this reference.

TECHNICAL FIELD

This invention relates generally to the field of touch sensors and more specifically to a new and useful human-computer interface system in the field of touch sensors.

DESCRIPTION OF THE EMBODIMENTS

The following description of embodiments of the invention is not intended to limit the invention to these embodiments but rather to enable a person skilled in the art to make and use this invention. Variations, configurations, implementations, example implementations, and examples described herein are optional and are not exclusive to the variations, configurations, implementations, example implementations, and examples they describe. The invention described herein can include any and all permutations of these variations, configurations, implementations, example implementations, and examples.

1. System

Figure 27A:
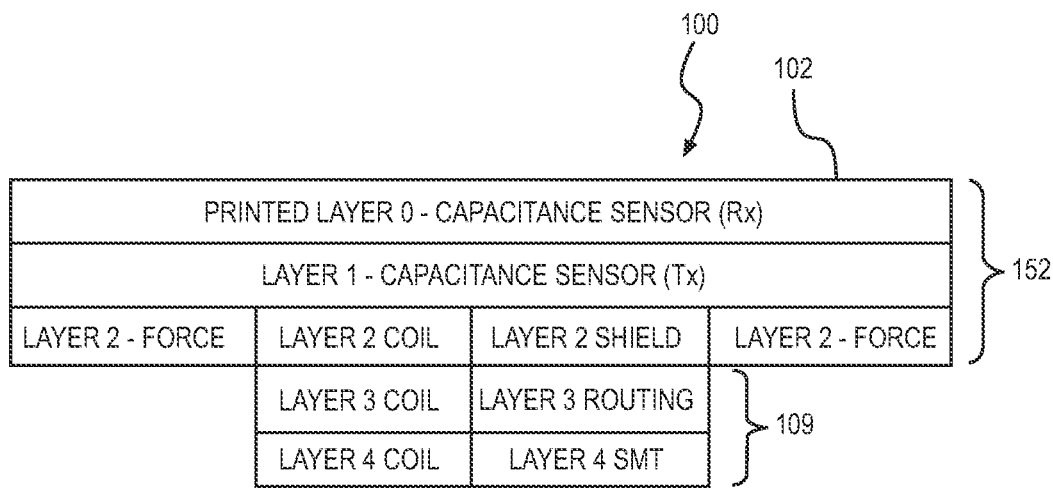
FIGS. 27A and 27B are a schematic representation of one variation of the system.
Figure 27B:
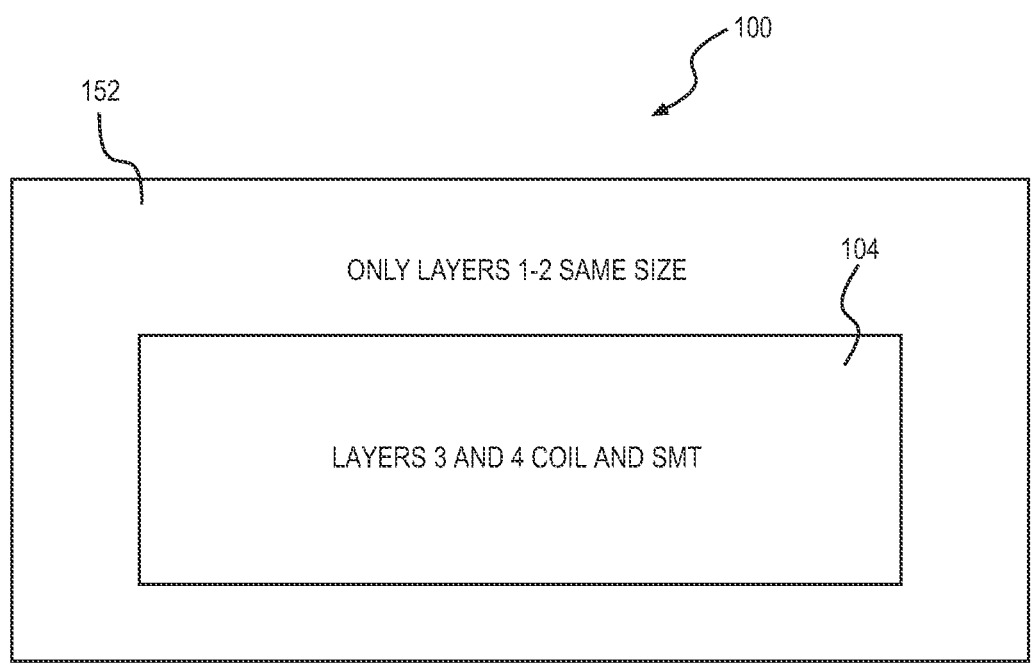
Figure 28A:
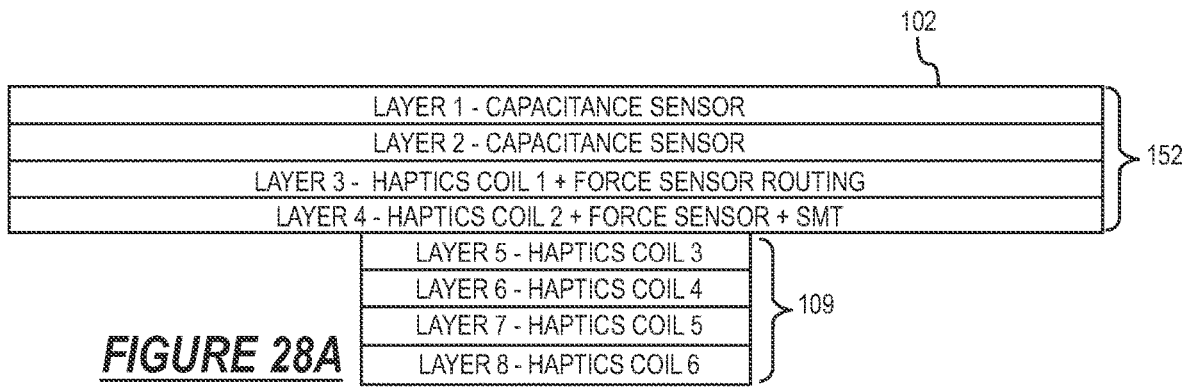
FIGS. 28A, 28B, 28C, and 28D are a schematic representation of one variation of the system.
Figure 28B:
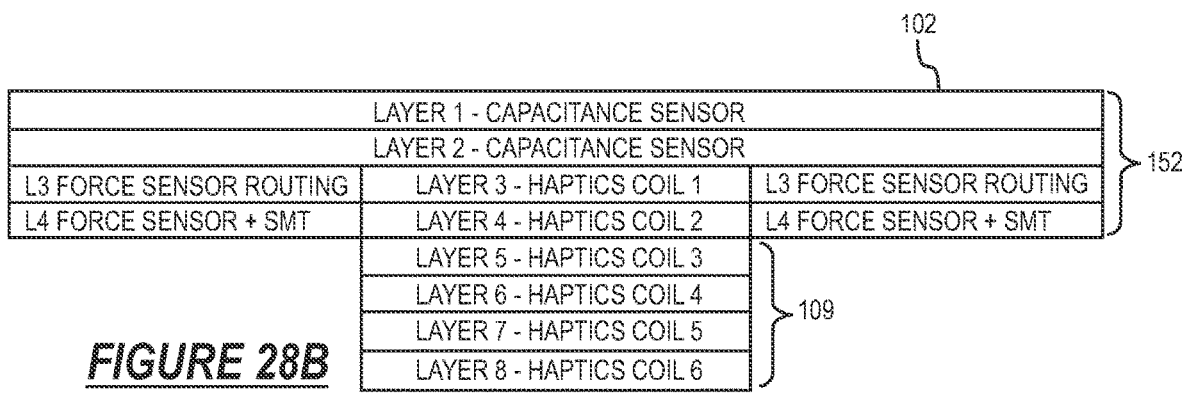
Figure 28C:
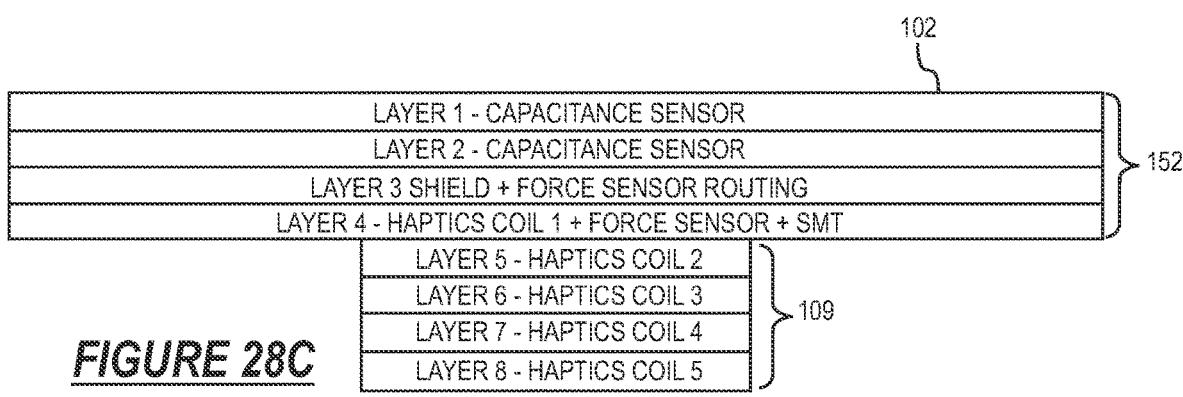
Figure 28D:
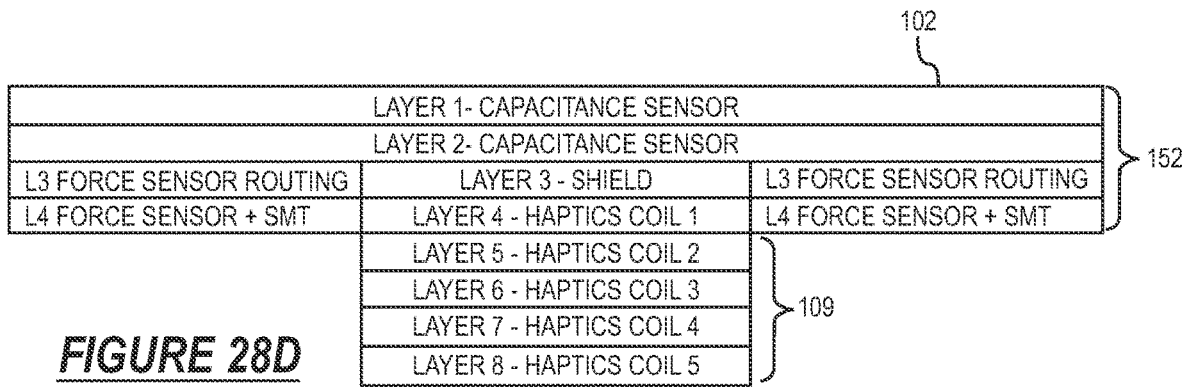
Figure 29:
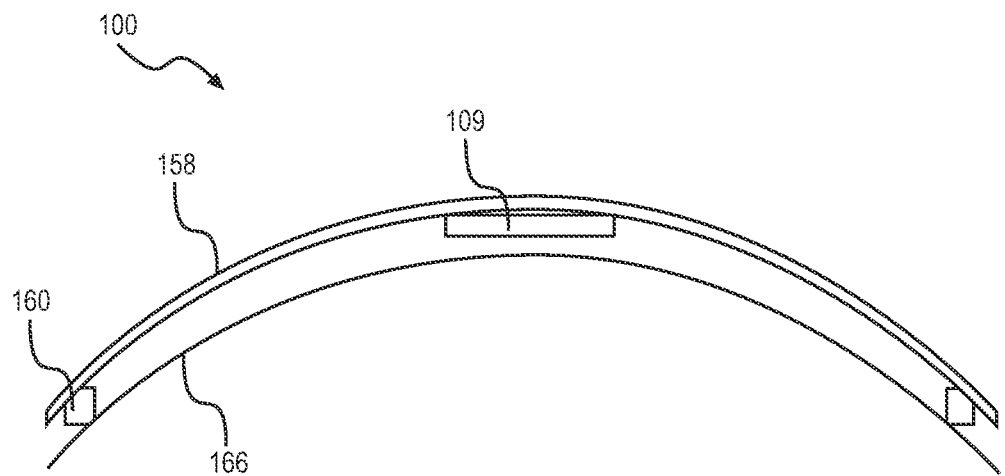
FIG. 29 is a schematic representation of one variation of the system.

As shown in FIGS. 27A and 27B, a touch sensor system 100 (hereinafter the system 100) includes: a set of touch layers 152 (e.g., two touch layers); a set of inductor layers 109 (e.g., two inductor layers); a magnetic element 181; and a controller 190.

The set of touch layers 152: spans a first area; and includes a first set of electrodes 146 arranged across the set of touch layers 152.

The set of inductor layers 109: are arranged below the set of touch layers 152; spans a second area less than the first area; and includes a first set of spiral traces arranged across the set of inductor layers 109 to define a first multi-layer inductor 150.

The magnetic element 181 is arranged below the set of inductor layers 109 and defines a first polarity facing the first multi-layer inductor 150.

The controller 190 is configured to: detect a first touch input at a first location over the set of touch layers 152; read a first set of electrical values from the first set of electrodes 146; interpret a first force magnitude of the first touch input based on the first set of electrical values; and, in response to the first force magnitude exceeding a target force magnitude, drive an oscillating voltage across the first multi-layer inductor 150 to induce alternating magnetic coupling between the first multi-layer inductor 150 and the first magnetic element 181.

1.1 Variation: Touch Layer+Inductor Layer for Multi-Layer Inductor

Figure 25A:
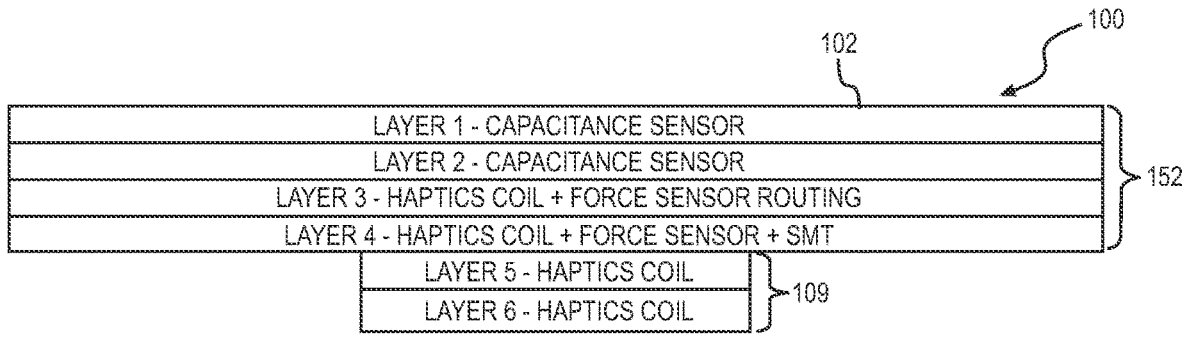
FIGS. 25A, 25B, 25C, and 25D are a schematic representation of one variation of the system.
Figure 25B:
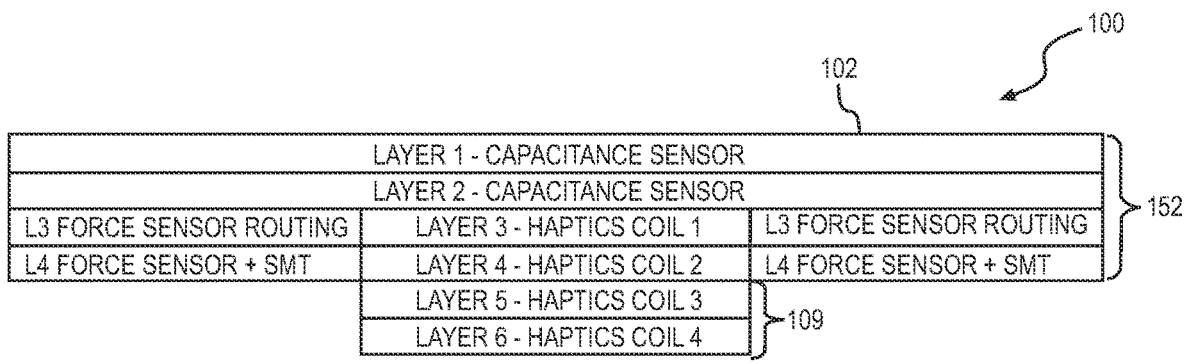
Figure 25C:
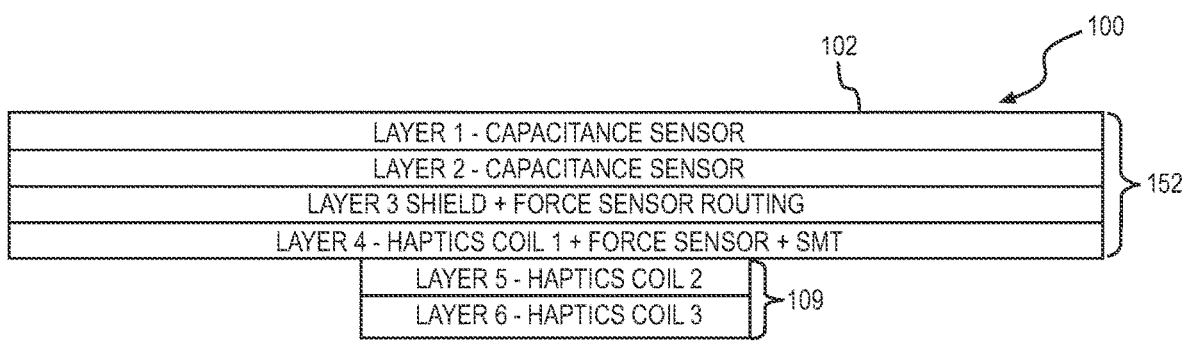
Figure 25D:
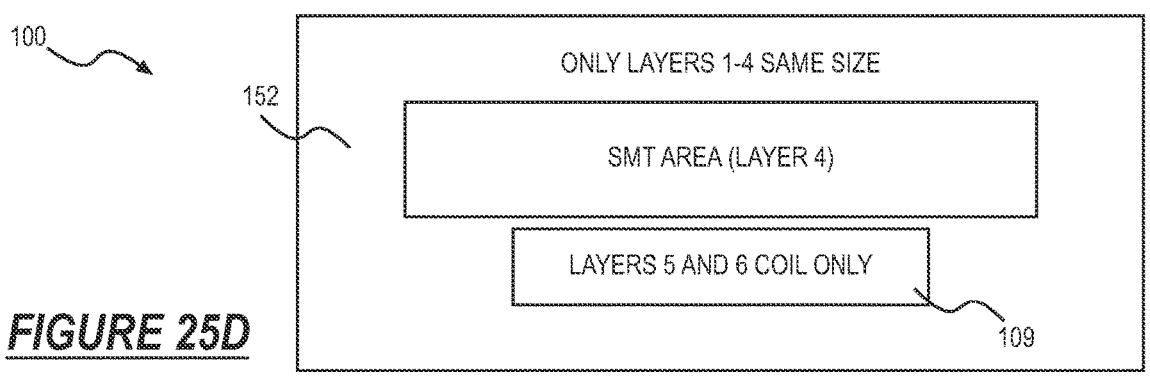

In one variation shown in FIGS. 25A and 25B, the system 100 includes: a set of touch layers 152 (e.g., four touch layers); a set of inductor layers 109 (e.g., two inductor layers); and a first magnetic element 181.

The set of touch layers 152 spans a first area and includes: a first subset of touch layers 152 and a second subset of touch layers 152. The first subset of touch layers 152 includes an array of drive and sense electrode pairs 105. The second subset of touch layers 152 are arranged below the first subset of touch layers 152 and includes: an intermediate layer including a first spiral trace 111 coiled in a first direction across the intermediate layer; and a bottom layer arranged below the intermediate layer. The bottom layer includes: a second spiral trace 122 coupled to the first spiral trace in and coiled in a second direction, opposite the first direction, across the bottom layer; and a set of electrodes 146 arranged proximal a set of support locations at the bottom layer.

The set of inductor layers 109 spans a second area, less than the first area, below the set of touch layers 152 and includes: a first inductor layer 110; and a second inductor layer 120. The first inductor layer 110 includes a third spiral trace 133 coupled to the second spiral trace 122 and coiled in the first direction across the first inductor layer 110. The second inductor layer 120 includes a fourth spiral trace: coupled to the third spiral trace 133; coiled in the second direction, opposite the first direction, across the second inductor layer 120; and cooperating with the third spiral trace 133, the second spiral trace 122, and the first spiral trace 111 to form an inductor.

The first magnetic element 181 defines a first polarity facing the inductor and is configured to magnetically couple the inductor to oscillate the set of touch layers 152.

1.2 Variation: Independent Multi-Layer Inductor

Figure 26A:
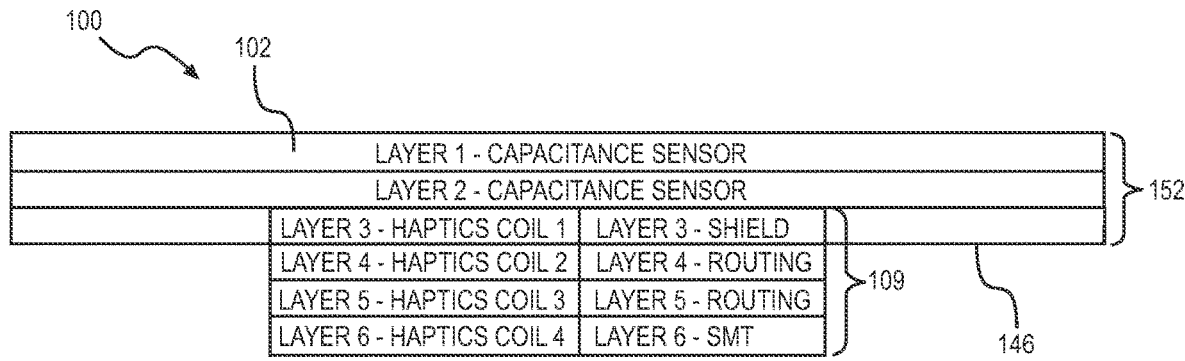
FIGS. 26A, 26B, and 26C are a schematic representation of one variation of the system.
Figure 26B:
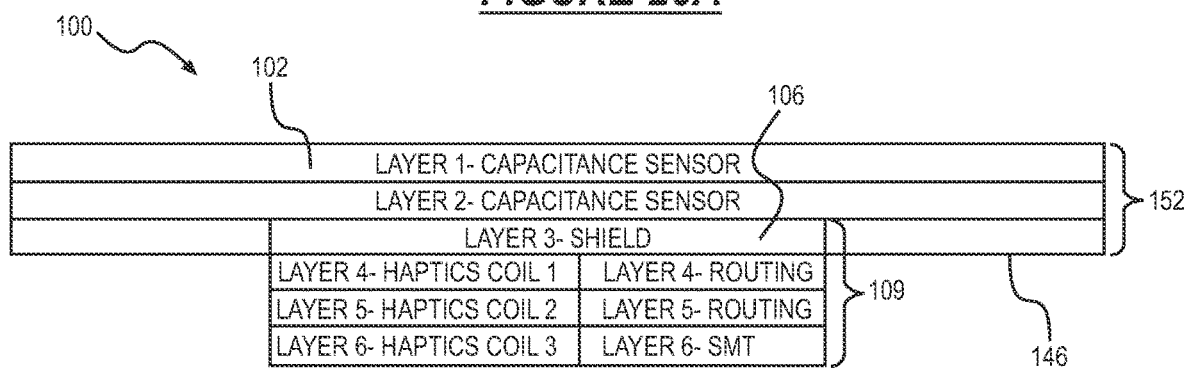

In another variation shown in FIGS. 26A and 26B, the system 100 includes: a set of touch layers 152 (e.g., two touch layers); a set of inductor layers 109 (e.g., four touch layers); and a first magnetic element 181.

The set of touch layers 152 spans a first area and includes: a first touch layer 154; and a second touch layer 156. The first touch layer 154 includes an array of drive and sense electrode pairs 105. The second touch layer 156: is arranged below the first touch layer 154; defines a set of support locations about a bottom surface of the second touch layer 156; and includes a set of electrodes 146 arranged proximal the set of support locations.

The set of inductor layers 109 spans a second area, less than the first area, below the set of touch layers 152 and includes: a first inductor layer 110; a second inductor layer 120; a third inductor layer 130; and a fourth spiral trace 144.

The first inductor layer no includes a first spiral trace 111 coiled in a first direction across the first inductor layer no. The second inductor layer 120 includes a second spiral trace 122 coupled to the first spiral trace in and coiled in a second direction, opposite the first direction, across the second inductor layer 120. The third inductor layer 130 includes a third spiral trace 133 coupled to the second spiral trace 122 and coiled in the first direction across the third inductor layer 130. The fourth spiral trace 144 includes a fourth spiral trace: coupled to the third spiral trace 133; coiled in the second direction opposite the first direction across the fourth spiral trace 144; and cooperating with the third spiral trace 133, second spiral trace 122, and first spiral trace 111 to form an inductor.

The first magnetic element 181 defines a first polarity facing the inductor and is configured to magnetically couple the inductor to oscillate the set of touch layers 152.

2. Applications

Generally, the system 100 can operate as a touch sensor to: detect a touch input applied to a touch sensor surface 172 of the touch sensor; interpret a force magnitude of the touch input applied on the touch sensor surface 172; and generate haptic feedback oscillations across the touch sensor surface 172. In particular, the system 100 can include a substrate 102 including: a set of touch layers 152 that form the touch sensor and the force sensor; and a set of inductor layers 109 that form a multi-layer inductor 150 configured to magnetically couple a magnetic element 181 to generate haptic feedback oscillations.

In one example, the system 100 includes: a set of touch layers 152 spanning a first area (e.g., rectangular area) and configured to form a touch sensor and a force sensor; and a set of inductor layers 109 arranged below the set of touch layers 152 and spanning a second area less than the first area. In this example, the set of touch layers 152 can include: a first subset of touch layers 152 (e.g., flexible layers) including an array of drive and sense electrode pairs 105 forming the touch sensor; and a second subset of touch layers 152 arranged below the first subset of touch layers 152 including a set of electrodes 146 (e.g., sense electrodes) forming the force sensor. In this example, touch inputs applied on the touch sensor surface 172 will result in changes in electrical values across the array of drive and sense electrode pairs 105 and the set of electrodes 146 across the set of touch layers 152. Thus, the system 100 can: serially read electrical values from the array of drive and sense electrode pairs 105 and the set of electrodes 146; and interpret touch inputs and force magnitudes applied on the touch sensor surface 172 based on the electrical values.

Additionally, the set of inductor layers 109: are arranged below the set of touch layers 152; and span an area less than the area of the set of touch layers 152, thereby conserving costs and weight of the touch sensor. In this example, the set of inductor layers 109 can include a set of spiral traces: formed in the set of inductor layers 109; and forming a multi-layer inductor 150 configured to magnetically couple a magnetic element 181 facing the multi-layer inductor 150. Thus, the system 100 can: responsive to interpreting a touch input at the touch sensor surface 172, drive an oscillating voltage across the multi-layer inductor 150 to induce magnetic coupling between the multi-layer inductor 150 and the magnetic element 181 in order to oscillate the touch sensor surface 172.

3. Substrate and Touch Sensor

Figure 6:
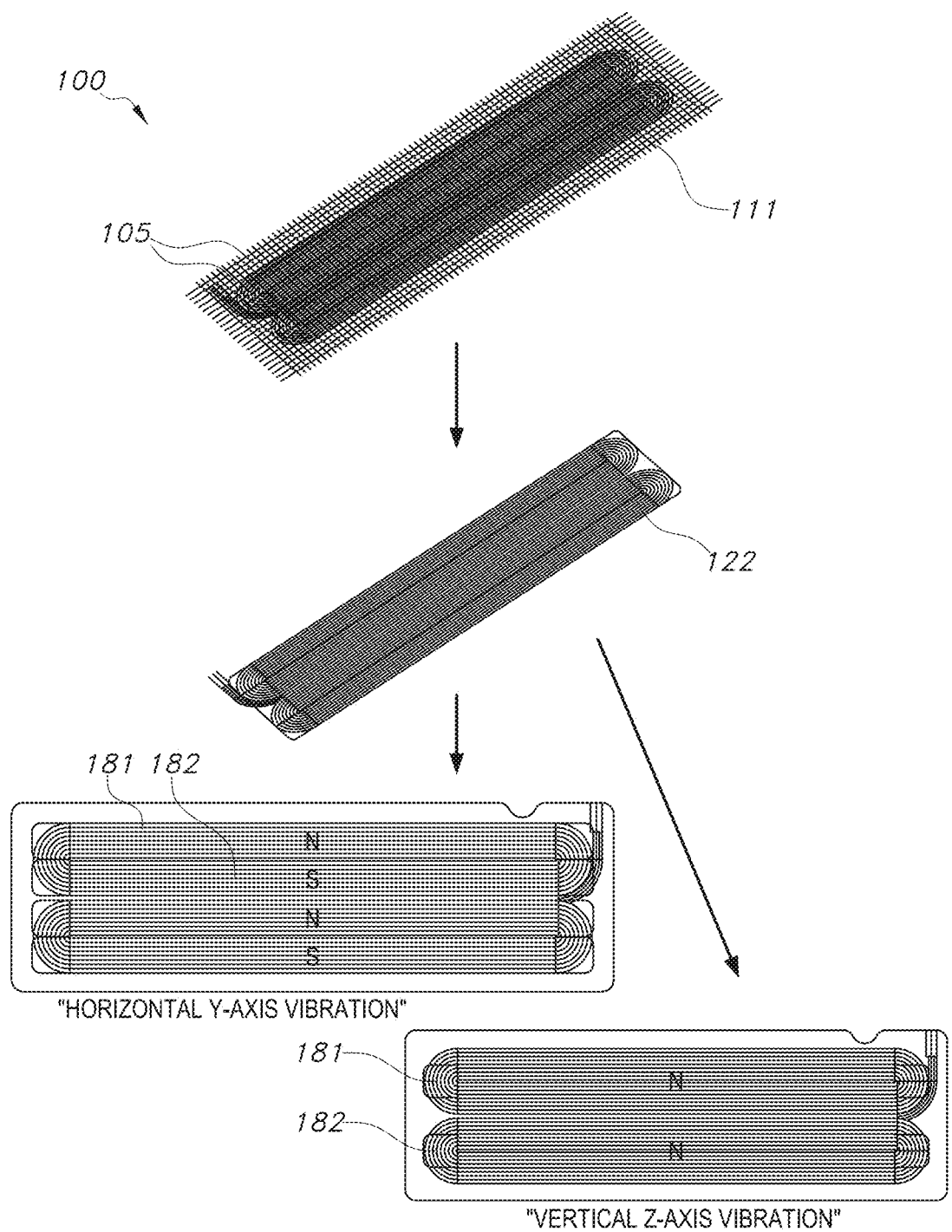
FIG. 6 is a schematic representation of one variation of the system.
Figure 12:
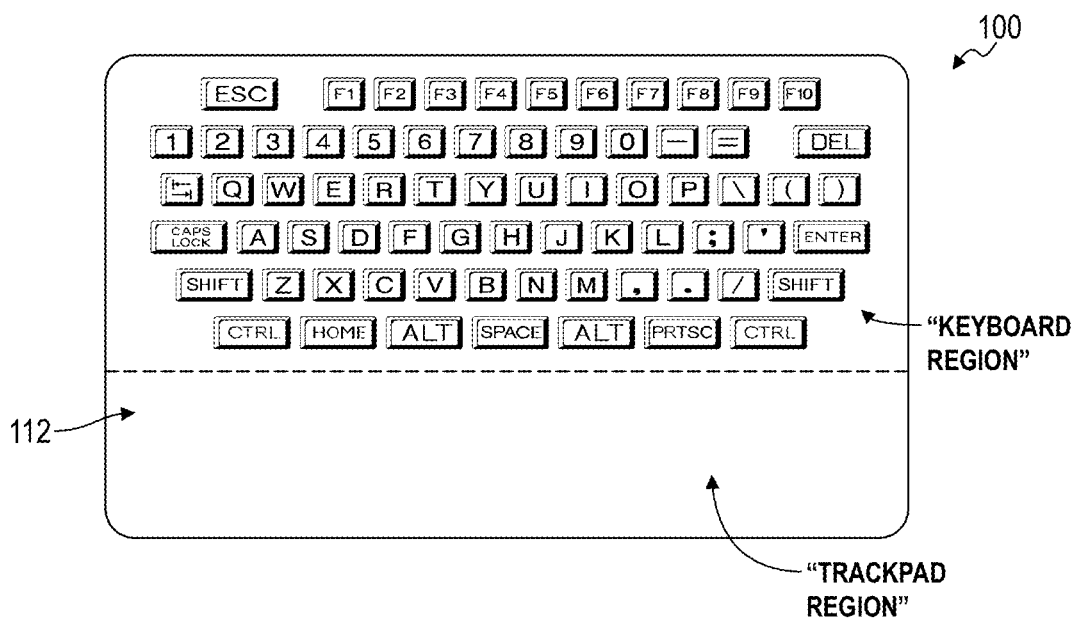
FIG. 12 is a schematic representation of one variation of the system.
Figure 13A:
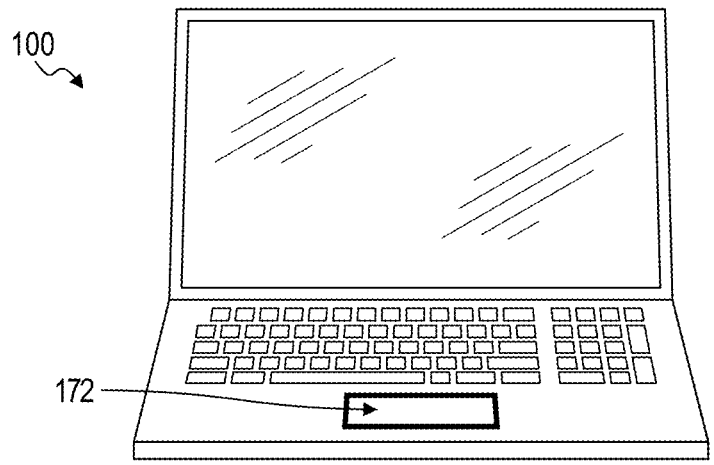
FIGS. 13A-13C are schematic representations of one variation of the system.
Figure 13B:
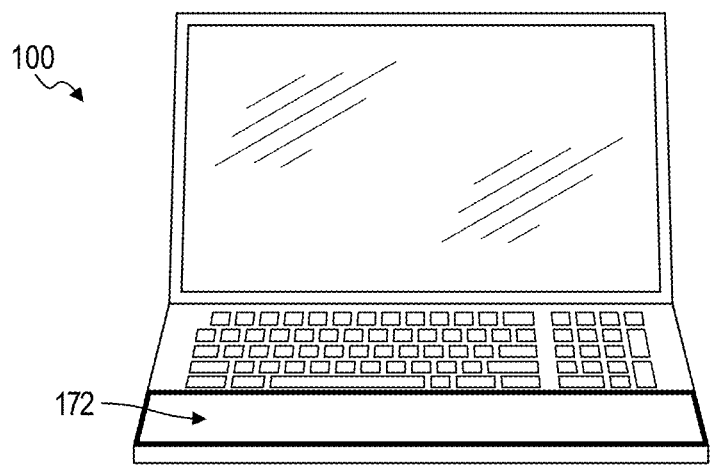
Figure 13C:
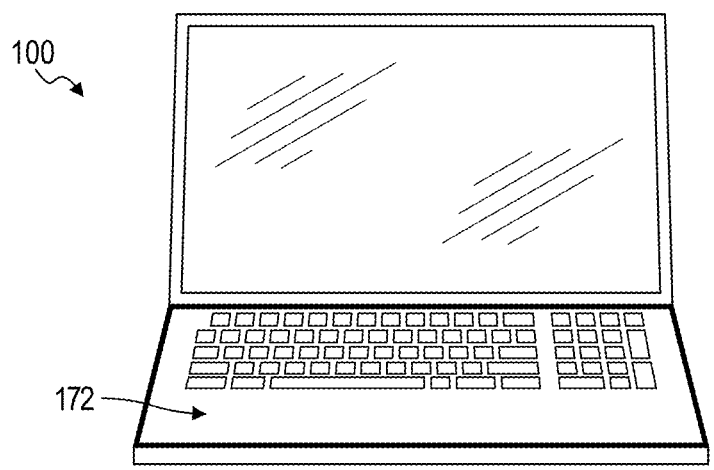
Figure 14:
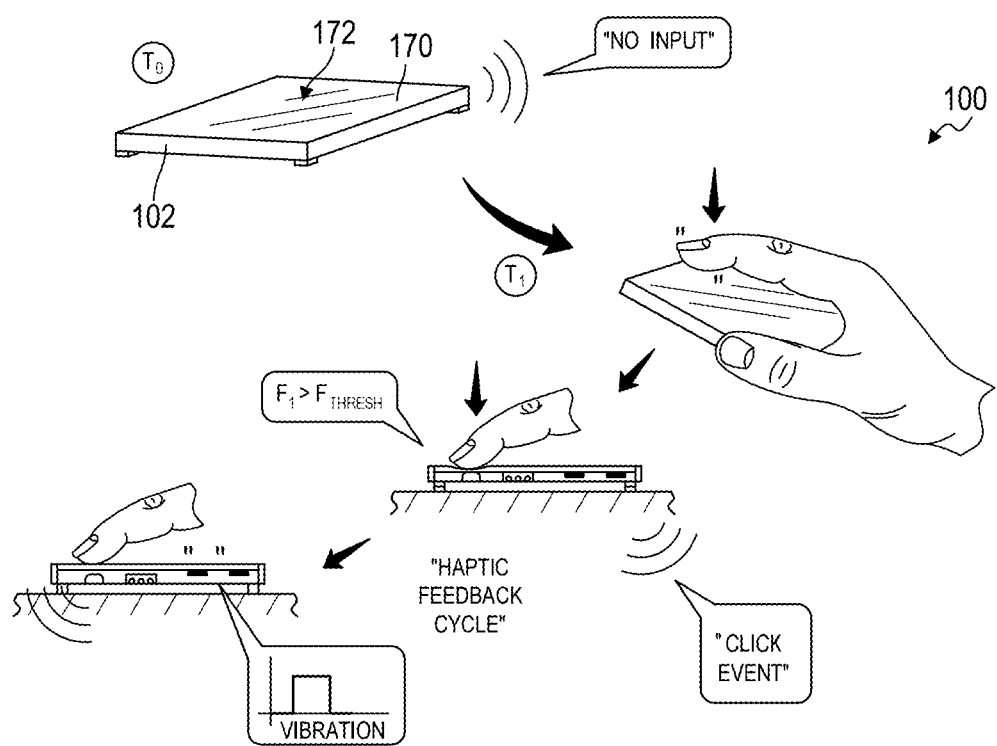
FIG. 14 is a flowchart representation of one variation of the system.
Figure 15:
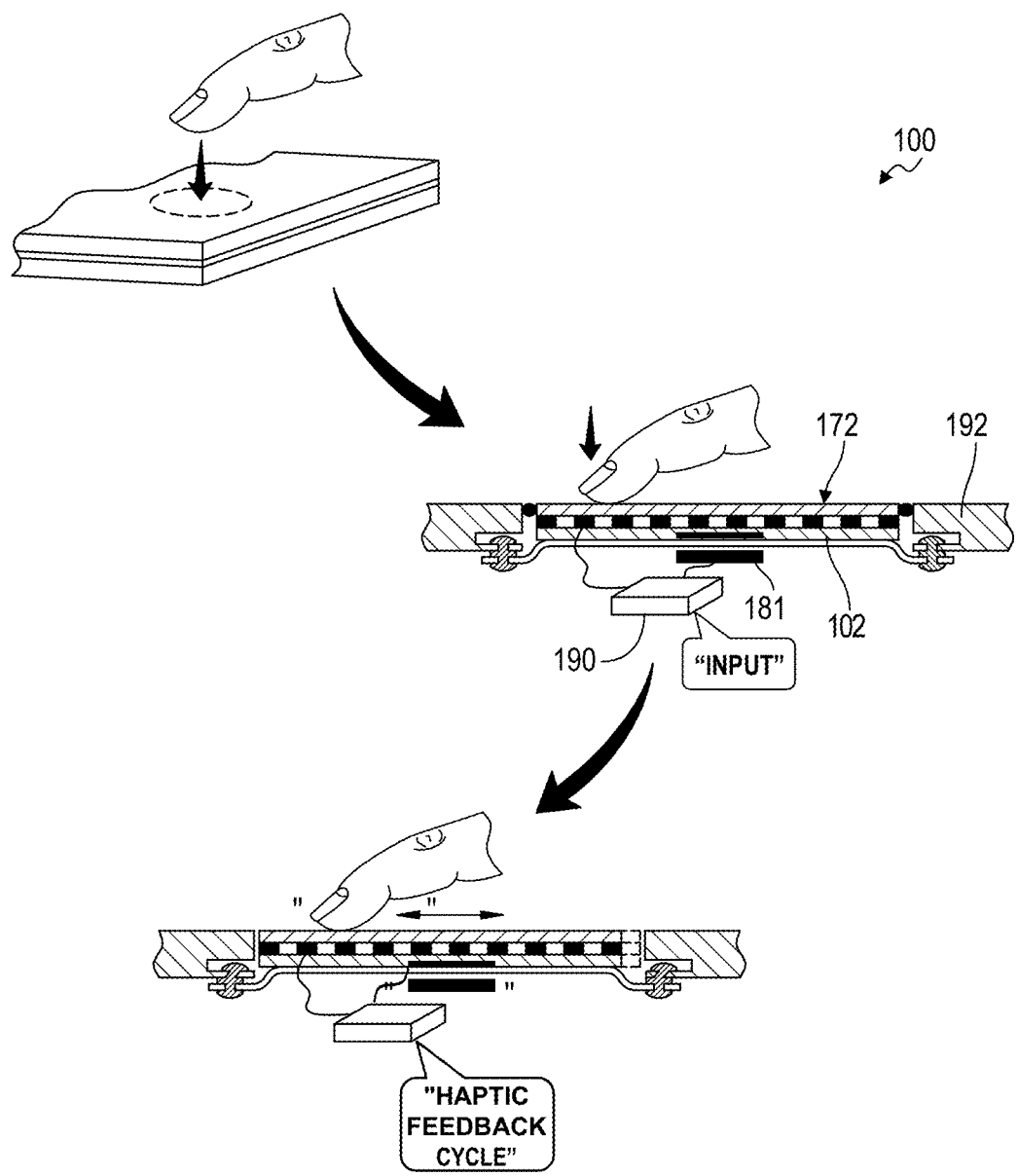
FIG. 15 is a flowchart representation of one variation of the system.

As shown in FIGS. 6 and 12, the system 100 includes a substrate 102 that includes a set of (e.g., six) conductive layers etched to form a set of conductive traces; a set of (e.g., five) substrate layers interposed between the stack of conductive layers; and a set of vias that connect the set of conductive tracers through the set of substrate layers. For example, the substrate 102 can include a six-layer, rigid fiberglass PCB.

In particular, a top conductive layer and/or a second conductive layer of the substrate 102 can include a set of traces that cooperate to form an array (e.g., a grid array) of drive and sense electrode pairs 105 within a touch sensor. Subsequent conductive layers of the substrate 102 below the touch sensor can include interconnected spiral traces that cooperate to form a single- or multi-core, single- or multi-winding, multi-layer inductor 150. Furthermore, a bottom conductive layer and/or a penultimate conductive layer of the substrate 102 can include a set of interdigitated electrodes distributed about the perimeter of the substrate 102 to form a sparse array of force sensors.

3.1 Resistive Touch Sensor

In one implementation, the first and second conductive layers of the substrate 102 include columns of drive electrodes and rows of sense electrodes (or vice versa) that terminate in a grid array of drive and sense electrode pairs 105 on the top layer 104 of the substrate 102. In this implementation, the system 100 further includes a force-sensitive layer 174: arranged over the top conductive layer of the substrate 102 (e.g., interposed between the top layer 104 of the substrate 102 and the cover layer 170); and exhibiting local changes in contact resistance across the set of drive and sense electrode pairs 105 responsive to local application of forces on the cover layer 170 (i.e., on the touch sensor surface 172.)

Accordingly, during a scan cycle, the controller 190 can: serially drive the columns of drives electrodes; serially read electrical values—(e.g., voltages) representing electrical resistances across drive and sense electrode pairs 105—from the rows of sense electrodes; detect a first input at a first location (e.g., an (x, y) location) on the touch sensor surface 172 based on deviation of electrical values—read from a subset of drive and sense electrode pairs 105 adjacent the first location—from baseline resistance-based electrical values stored for this subset of drive and sense electrode pairs 105; and interpret a force magnitude of the first input based on a magnitude of this deviation. As described below, the controller 190 can then drive an oscillating voltage across the multi-layer inductor 150 in the substrate 102 during a haptic feedback cycle in response to the force magnitude of the first input exceeding a threshold input force.

The array of drive and sense electrode pairs 105 on the first and second conductive layers of the substrate 102 and the force-sensitive layer 174 can thus cooperate to form a resistive touch sensor readable by the controller 190 to detect lateral positions, longitudinal positions, and force (or pressure) magnitudes of inputs (e.g., fingers, styluses, palms) on the touch sensor surface 172.

3.2 Capacitive Touch Sensor

In another implementation, the first and second conductive layers of the substrate 102 include columns of drive electrodes and rows of sense electrodes (or vice versa) that terminate in a grid array of drive and sense electrode pairs 105 on the top conductive layer (or on both the top and second conductive layers) of the substrate 102.

During a scan cycle, the controller 190 can: serially drive the columns of drive electrodes; serially read electrical values (e.g., voltage, capacitance rise time, capacitance fall time, resonant frequency)—representing capacitive coupling between drive and sense electrode pairs 105—from the rows of sense electrodes; and detect a first input at a first location (e.g., an (x, y) location) on the touch sensor surface 172 based on deviation of electrical values—read from a subset of drive and sense electrode pairs 105 adjacent the first location—from baseline capacitance-based electrical values stored for this subset of drive and sense electrode pairs 105. For example, the controller 190 can implement mutual capacitance techniques to read capacitance values between these drive and sense electrode pairs 105 and to interpret inputs on the touch sensor surface 172 based on these capacitance values.

The array of drive and sense electrode pairs 105 on the first and second conductive layers of the substrate 102 and the force-sensitive layer 174 can thus cooperate to form a capacitive touch sensor readable by the controller 190 to detect lateral and longitudinal positions of inputs (e.g., fingers, styluses, palms) on the touch sensor surface 172.

3.3 Touchscreen

In one variation, the system 100 includes (or interfaces with) a touchscreen 196 arranged over the substrate and that includes: a digital display; a touch sensor arranged across the display; and a cover layer arranged over the display and defining the touch sensor surface 172. Accordingly, in this variation, the controller is configured to drive the oscillating voltage across the multi-layer inductor during the haptic feedback cycle in response to the touchscreen 196 detecting the input on the touch sensor surface.

In particular, in this variation, the substrate 102 can: receive or integrate with a touch screen (i.e., an integrated display and touch sensor); and can cooperate with the first magnetic element 181 and the controller 190 to vibrate the touch sensor surface over the touchscreen 196 responsive to an input on the touch sensor surface, such as detected by a separate controller coupled to the touchscreen 196.

4. Multi-Layer Inductor

As described above, the system 100 includes a multi-layer inductor 150 formed by a set of interconnected spiral traces fabricated directly within conductive layers within the substrate 102.

Generally, the total inductance of a single spiral trace may be limited by the thickness of the conductive layer. Therefore, the system 100 can include a stack of overlapping, interconnected spiral traces fabricated on a set of adjacent layers of the substrate 102 to form a multi-layer, multi-turn, and/or multi-core inductor that exhibits greater inductance—and therefore greater magnetic coupling to the set of magnetic elements—than a single spiral trace on a single conductive layer of the substrate 102. These spiral traces can be coaxially aligned about a common vertical axis (e.g., centered over the set of magnetic elements) and electrically interconnected by a set of vias through the intervening substrate layers of the substrate 102.

Furthermore, the substrate 102 can include conductive layers of different thicknesses. Accordingly, spiral traces within thicker conductive layers of the substrate 102 can be fabricated with narrower trace widths and more turns, and spiral traces within thinner conductive layers of the substrate 102 can be fabricated with wider trace widths and fewer turns in order to achieve similar electrical resistances within each spiral trace over the same coil footprint. For example, lower conductive layers within the substrate 102 can include heavier layers of conductive material (e.g., one-ounce copper approximately 35 microns in thickness) in order to accommodate narrower trace widths and more turns within the coil footprint in these conductive layers, thereby increasing inductance of each spiral trace and yielding greater magnetic coupling between the multi-layer inductor 150 and the set of magnetic elements during a haptic feedback cycle. Conversely, in this example, the upper layers of the substrate 102—which include many (e.g., thousands of) drive and sense electrode pairs 105 of the touch sensor—can include thinner layers of conductive material.

4.1 Single Core+Even Quantity of Coil Layers

Figure 2:
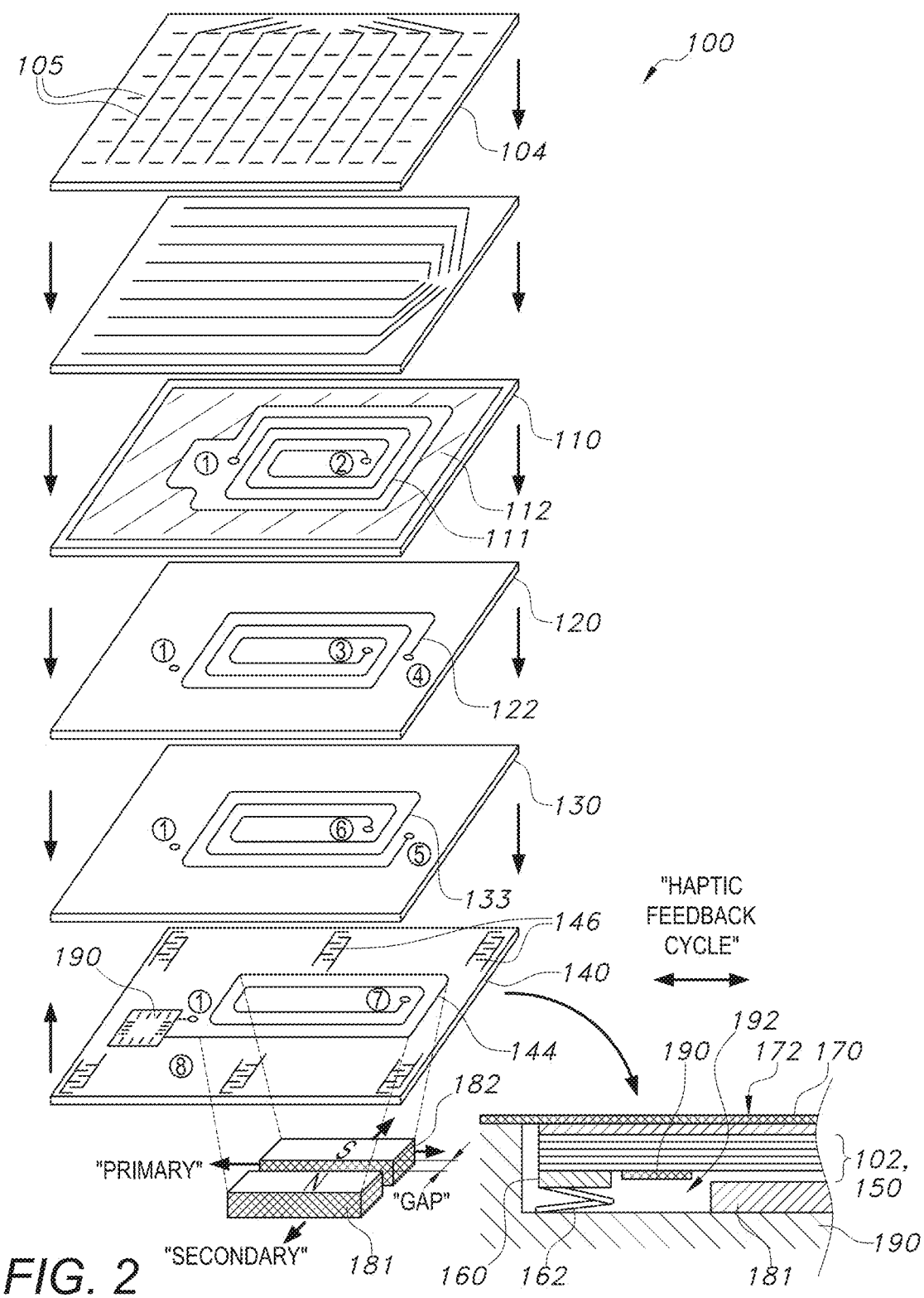
FIG. 2 is a schematic representation of one variation of the system.

In one implementation shown in FIG. 2, the substrate 102 includes an even quantity of spiral traces fabricated within an even quantity of substrate layers within the substrate 102 to form a single-coil inductor.

In one example, the substrate 102 includes: a top layer 104 and an intermediate layer 106 containing the array of drive and sense electrode pairs 105; a first inductor layer no; a second inductor layer 120; a third inductor layer 130; and a fourth (e.g., a bottom) layer. In this example, the first inductor layer 110 includes a first spiral trace 111 coiled in a first direction and defining a first end and a second end. In particular, the first spiral trace 111 can define a first planar coil spiraling inwardly in a clockwise direction from the first end at the periphery of the first planar coil to the second end proximal a center of the first planar coil. The second inductor layer 120 includes a second spiral trace 122 coiled in a second direction opposite the first direction and defining a third end—electrically coupled to the second end of the first spiral trace 111—and a fourth end. In particular, the second spiral trace 122 can define a second planar coil spiraling outwardly in the clockwise direction from the third end proximal the center of the second planar coil to the fourth end at a periphery of the second planar coil.

Similarly, the third inductor layer 130 includes a third spiral trace 133 coiled in the first direction and defining a fifth end—electrically coupled to the fourth end of the second spiral trace 122—and a sixth end. In particular, the third spiral trace 133 can define a third planar coil spiraling inwardly in the clockwise direction from the fifth end at the periphery of the third planar coil to the sixth end proximal a center of the third planar coil. Furthermore, the fourth layer includes a fourth spiral trace 144 coiled in the second direction and defining a seventh end—electrically coupled to the sixth end of the first spiral trace 111—and an eighth end. In particular, the fourth spiral trace 144 can define a fourth planar coil spiraling outwardly in the clockwise direction from the seventh end proximal the center of the fourth planar coil to the eighth end at a periphery of the fourth planar coil.

Accordingly: the second end of the first spiral trace 111 can be coupled to the third end of the second spiral trace 122 by a first via; the fourth end of the second spiral trace 122 can be coupled to the fifth end of the third spiral trace 133 by a second via; the sixth end of the third spiral trace 133 can be coupled to the seventh end of the fourth spiral trace 144 by a third via; and the first, second, third, and fourth spiral traces 111, 122, 133, 144 can cooperate to form a single-core, four-layer inductor. The controller 190 (or a driver): can be electrically connected to the first end of the first spiral trace in and the eighth end of the fourth spiral trace 144 (or "terminals" of the multi-layer inductor 150); and can drive these terminals of the multi-layer inductor 150 with an oscillating voltage during a haptic feedback cycle in order to induce an alternating magnetic field through the multi-layer inductor 150, which couples to the magnetic elements and oscillates the substrate 102 within the chassis 192. In particular, when the controller 190 drives the multi-layer inductor 150 at a first polarity, current can flow in a continuous, clockwise direction through the first, second, third, and fourth spiral traces 111, 122, 133, 144 to induce a magnetic field in a first direction around the multi-layer inductor 150. When the controller 190 reverses the polarity across terminals of the multi-layer inductor 150, current can reverse directions and flow in a continuous, counter-clockwise direction through the first, second, third, and fourth spiral traces 111, 122, 133, 144 to induce a magnetic field in a second, opposite direction at the multi-layer inductor 150.

Furthermore, in this implementation, because the multi-layer inductor 150 spans an even quantity of conductive layers within the substrate 102, the terminals of the multi-layer inductor 150 can be located on the peripheries of the first and last layers of the substrate 102 and thus enable direct connection to the controller 190 (or driver).

4.2 Single Core+Odd Quantity of Coil Layers

Figure 1:
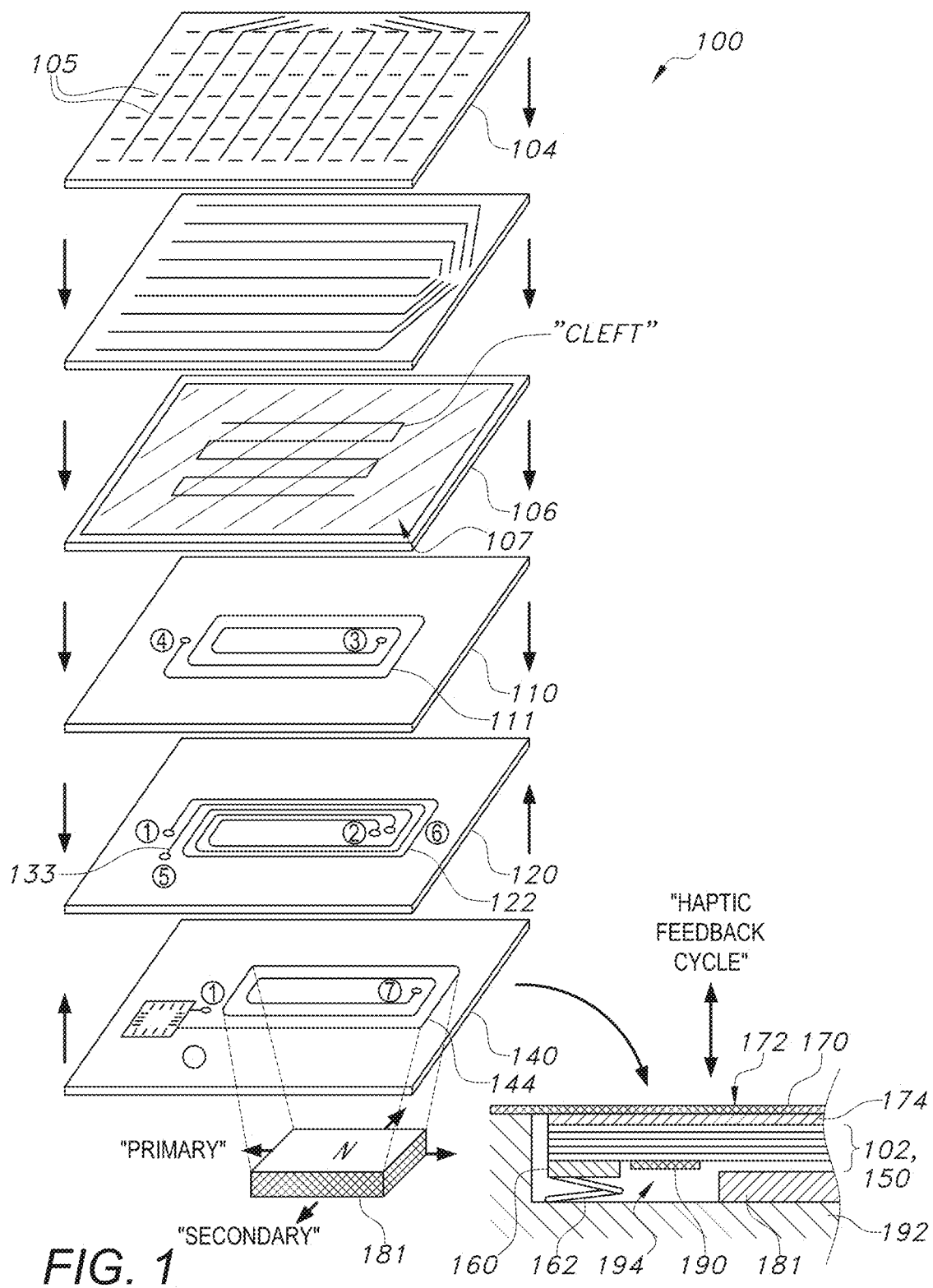
FIG. 1 is a schematic representation of a system.

In another implementation shown in FIG. 1, the multi-layer inductor 150 spans an odd number of (e.g., three, five) conductive layers of the substrate 102. In this implementation, a conductive layer of the substrate 102 can include two parallel and offset spiral traces that cooperate with other spiral traces in the multi-layer inductor 150 to locate the terminals of the multi-layer inductor 150 at the periphery of the multi-layer inductor 150 for direct connection to the controller 190 or driver.

In one example, the substrate 102 includes: a top layer 104 and an intermediate layer 106 containing the array of drive and sense electrode pairs 105; a first inductor layer 110; a second inductor layer 120; a third inductor layer 130; and a fourth (e.g., a bottom) layer. In this example, the first inductor layer 110 includes a ground electrode (e.g., a continuous trace): spanning the footprint of the array of drive and sense electrode pairs 105 in the top and intermediate layers 104, 106; driven to a reference potential by the controller 190; and configured to shield the drive and sense electrode pairs 105 from electrical noise generated by the multi-layer inductor 150.

In this example, the third inductor layer 130 includes a first spiral trace 111 coiled in a first direction and defining a first end and a second end. In particular, the first spiral trace 111 can define a first planar coil spiraling inwardly in a clockwise direction from the first end at the periphery of the first planar coil to the second end proximal a center of the first planar coil. The second inductor layer 120 includes a second spiral trace 122 coiled in a second direction opposite the first direction and defining a third end—electrically coupled to the second end of the first spiral trace 111 in the third inductor layer 130—and a fourth end. In particular, the second spiral trace 122 can define a second planar coil spiraling outwardly in the clockwise direction from the third end proximal the center of the second planar coil to the fourth end at a periphery of the second planar coil.

The third inductor layer 130 further includes a third spiral trace 133 coiled in the first direction and defining a fifth end—electrically coupled to the fourth end of the second spiral trace 122 in the second inductor layer 120—and a sixth end. In particular, the third spiral trace 133 can define a third planar coil: spiraling inwardly in the clockwise direction from the fifth end at the periphery of the third planar coil to the sixth end proximal a center of the third planar coil; and nested within the first planar coil that also spirals inwardly in the clockwise direction within the third inductor layer 130.

Furthermore, the fourth layer includes a fourth spiral trace 144 coiled in the second direction and defining a seventh end—electrically coupled to the sixth end of the first spiral trace 111—and an eighth end. In particular, the fourth spiral trace 144 can define a fourth planar coil spiraling outwardly in the clockwise direction from the seventh end proximal the center of the fourth planar coil to the eighth end at a periphery of the fourth planar coil.

Accordingly: the second end of the first spiral trace 111 within the third inductor layer 130 can be coupled to the third end of the second spiral trace 122 within the second inductor layer 120 by a first via; the fourth end of the second spiral trace 122 within the second inductor layer 120 can be coupled to the fifth end of the third spiral trace 133 within the third inductor layer 130 by a second via; the sixth end of the third spiral trace 133 within the third inductor layer 130 can be coupled to the seventh end of the fourth spiral trace 144 within the fourth layer by a third via; and the first, second, third, and fourth spiral traces 111, 122, 133, 144 can cooperate to form a single-core, three-layer inductor. The controller 190: can be electrically connected to the first end of the first spiral trace 111 within the third inductor layer 130 and the eight end of the fourth spiral trace 144 within the fourth layer (or "terminals" of the multi-layer inductor 150); and can drive these terminals of the multi-layer inductor 150 with an oscillating voltage during a haptic feedback cycle in order to induce an alternating magnetic field through the multi-layer inductor 150, which couples to the magnetic elements and oscillates the substrate 102 within the chassis 192. In particular, when the controller 190 drives the multi-layer inductor 150 at a first polarity, current can flow in a continuous, clockwise direction through the first, second, third, and fourth spiral traces 111, 122, 133, 144 within the second, third, and fourth layers of the substrate 102 to induce a magnetic field in a first direction around the multi-layer inductor 150. When the controller 190 reverses the polarity across terminals of the multi-layer inductor 150, current can reverse directions and flow in a continuous, counter-clockwise direction through the first, second, third, and fourth spiral traces 111, 122, 133, 144 to induce a magnetic field in a second, opposite direction at the multi-layer inductor 150.

Therefore, in this implementation, the substrate 102 can include an even number of single-coil layers and an odd number of two-coil layers selectively connected to form a multi-layer inductor 150 that includes two terminals located on the periphery of the multi-layer inductor 150.

4.3 Double Core+Even Quantity of Coil Layers

Figure 3:
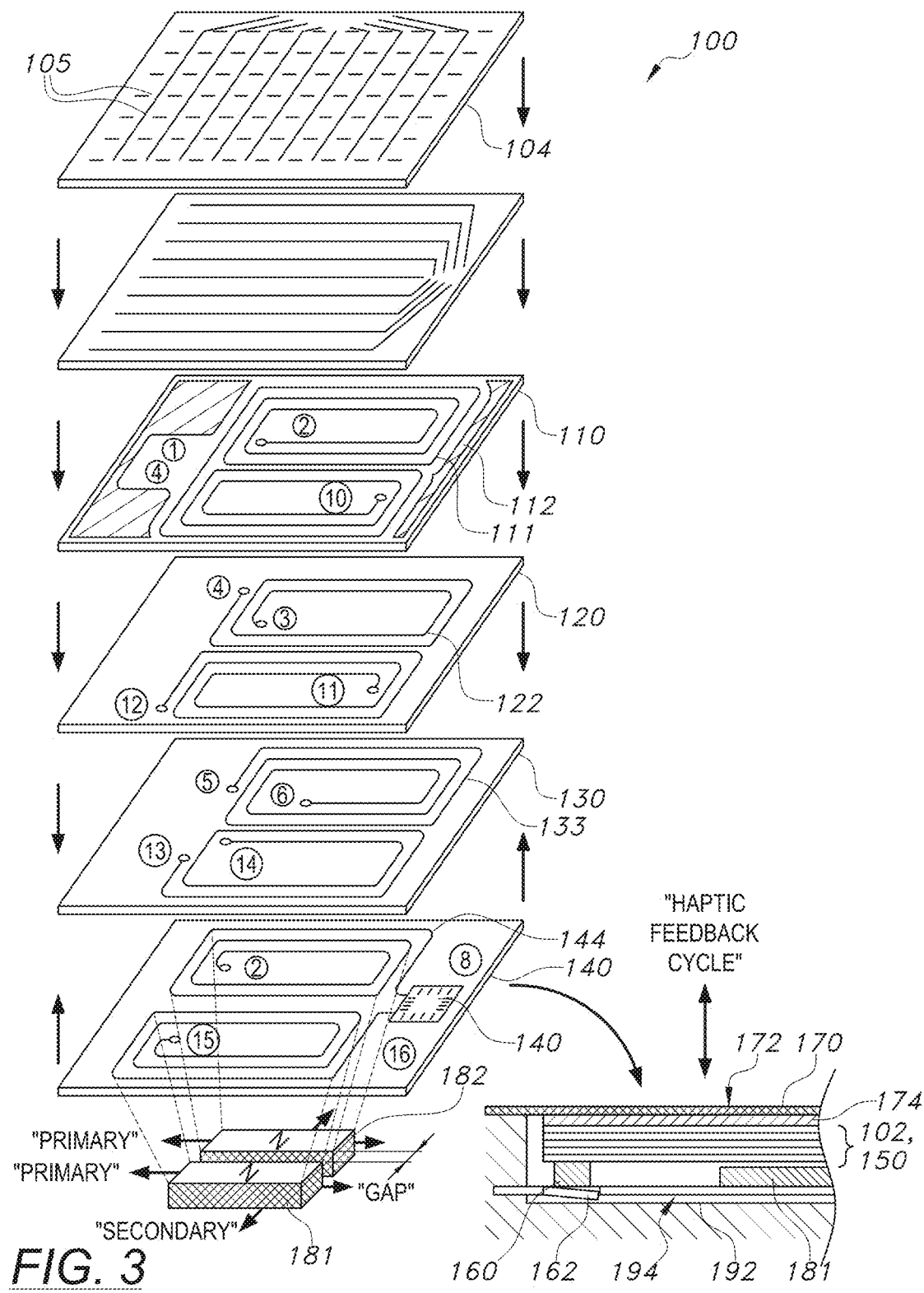
FIG. 3 is a schematic representation of one variation of the system.
Figure 7:
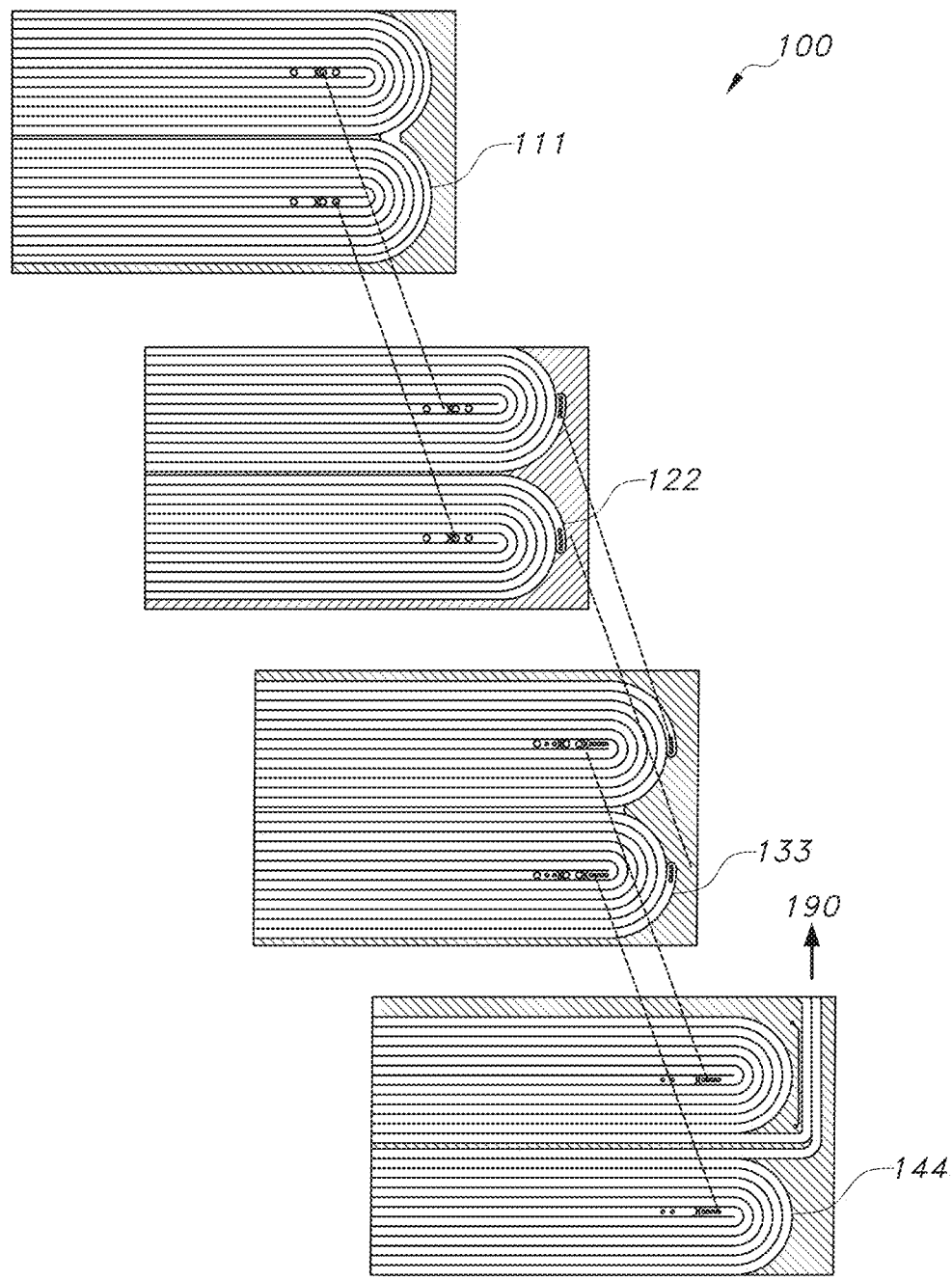
FIG. 7 is a schematic representation of one variation of the system.

In another implementation shown in FIGS. 3 and 7, the substrate 102 includes an even quantity of spiral traces fabricated within an even quantity of substrate layers within the substrate 102 to form a dual-core inductor (that is, two separate single-core inductors connected in series).

In one example, the substrate 102 includes: a top layer 104 and an intermediate layer 106 containing the array of drive and sense electrode pairs 105; a first inductor layer no; a second inductor layer 120; a third inductor layer 130; and a fourth (e.g., a bottom) layer.

In this example, the first inductor layer 110 includes a first spiral trace 111 coiled in a first direction and defining a first end and a second end. In particular, the first spiral trace 111 can define a first planar coil spiraling inwardly in a clockwise direction from the first end at the periphery of the first planar coil to the second end proximal a center of the first planar coil. The second inductor layer 120 includes a second spiral trace 122 coiled in a second direction opposite the first direction and defining a third end—electrically coupled to the second end of the first spiral trace 111—and a fourth end. In particular, the second spiral trace 122 can define a second planar coil spiraling outwardly in the clockwise direction from the third end proximal the center of the second planar coil to the fourth end at a periphery of the second planar coil. The third inductor layer 130 includes a third spiral trace 133 coiled in the first direction and defining a fifth end— electrically coupled to the fourth end of the second spiral trace 122—and a sixth end. In particular, the third spiral trace 133 can define a third planar coil spiraling inwardly in the clockwise direction from the fifth end at the periphery of the third planar coil to the sixth end proximal a center of the third planar coil. Furthermore, the fourth layer includes a fourth spiral trace 144 coiled in the second direction and defining a seventh end—electrically coupled to the sixth end of the first spiral trace 111—and an eighth end. In particular, the fourth spiral trace 144 can define a fourth planar coil spiraling outwardly in the clockwise direction from the seventh end proximal the center of the fourth planar coil to the eighth end at a periphery of the fourth planar coil.

Accordingly: the second end of the first spiral trace 111 can be coupled to the third end of the second spiral trace 122 by a first via; the fourth end of the second spiral trace 122 can be coupled to the fifth end of the third spiral trace 133 by a second via; the sixth end of the third spiral trace 133 can be coupled to the seventh end of the fourth spiral trace 144 by a third via; and the first, second, third, and fourth spiral traces 111, 122, 133, 144 can cooperate to form a first single-core, four-layer inductor.

Furthermore, in this example, the first inductor layer 110 includes a fifth spiral trace adjacent the first spiral trace 111, coiled in the second direction, and defining a ninth end— coupled to the first end of the first planar coil—and a tenth end. In particular, the fifth spiral trace can define a fifth planar coil spiraling inwardly in a clockwise direction from the ninth end at the periphery of the fifth planar coil to the tenth end proximal a center of the fifth planar coil. The second inductor layer 120 includes a sixth spiral trace adjacent the second spiral trace 122, coiled in the first direction, and defining an eleventh end—electrically coupled to the tenth end of the fifth spiral trace—and a twelfth end. In particular, the sixth spiral trace can define a sixth planar coil spiraling outwardly in the clockwise direction from the eleventh end proximal the center of the sixth planar coil to the twelfth end at a periphery of the sixth planar coil. The third inductor layer 130 includes a seventh spiral trace adjacent the third spiral trace 133, coiled in the second direction, and defining a thirteenth end—electrically coupled to the twelfth end of the sixth spiral trace—and a fourteenth end. In particular, the seventh spiral trace can define a seventh planar coil spiraling inwardly in the clockwise direction from the thirteenth end at the periphery of the seventh planar coil to the fourteenth end proximal a center of the seventh planar coil. Furthermore, the fourth layer includes an eighth spiral trace adjacent the fourth spiral trace 144, coiled in the first direction, and defining a fifteenth end—electrically coupled to the fourteenth end of the seventh spiral trace—and a sixteenth end. In particular, the eighth spiral trace can define an eighth planar coil spiraling outwardly in the clockwise direction from the fifteenth end proximal the center of the eighth planar coil to the sixteenth end at a periphery of the eighth planar coil.

Accordingly: the tenth end of the fifth spiral trace can be coupled to the eleventh end of the sixth spiral trace by a fourth via; the twelfth end of the sixth spiral trace can be coupled to the thirteenth end of the seventh spiral trace by a fifth via; the fourteenth end of the seventh spiral trace can be coupled to the fifteenth end of the eighth spiral trace by a sixth via; and the fifth, sixth, seventh, and eighth spiral traces can cooperate to form a second single-core, four-layer inductor.

Furthermore, the first end of the first spiral trace 111 can be coupled to (e.g., form a continuous trace with) the ninth end of the fifth spiral trace within the first conductive layer. The first and second single-core, four-layer inductors can therefore be fabricated in series to form a four-layer, dual-core inductor with the eighth and sixteenth ends of the fourth and eighth spiral traces, respectively, forming the terminals of the four-layer, dual-core inductor. Therefore, when these first and second multi-layer inductors are driven to a first polarity, current can flow in a continuous circular direction through both the first multi-layer inductor such that the first and second multi-layer inductors produce magnetic fields in the same phase and in the same direction.

The controller 190 (or a driver): can be electrically connected to these terminals and can drive these terminals with an oscillating voltage during a haptic feedback cycle in order to induce: a first alternating magnetic field through the first single-core, four-layer inductor (formed by the first, second, third, and fourth spiral traces 111, 122, 133, 144); and a second alternating magnetic field—in phase with the first alternating magnetic field—through the second single-core, four-layer inductor (formed by the fifth, sixth, seventh, and eighth spiral traces). In particular, when the controller 190 drives the four-layer, dual-core inductor at a first polarity, current can flow: in a continuous, clockwise direction through the first, second, third, and fourth spiral traces 111, 122, 133, 144 to induce a magnetic field in a first direction around the first single-core, four-layer inductor; and in a continuous, clockwise direction through the fifth, sixth, seventh, and eighth spiral traces to induce a magnetic field in the first direction around the second single-core, four-layer inductor. When the controller 190 reverses the polarity across terminals of the dual-core, four-layer inductor, current can reverse directions to: flow in a continuous, counter-clockwise direction through the first, second, third, and fourth spiral traces 111, 122, 133, 144 to induce a magnetic field in a second, opposite direction around the first single-core, four-layer inductor; and in a continuous, counter-clockwise direction through the fifth, sixth, seventh, and eighth spiral traces to induce a magnetic field in the second direction around the second single-core, four-layer inductor.

4.4 Double Core+Odd Quantity of Coil Layers

In a similar implementation, the substrate 102 includes an odd quantity of spiral traces fabricated within an odd quantity of substrate layers within the substrate 102 to form a dual-core inductor.

For example, in this implementation, the dual-core inductor can include two single-coil, three-layer inductors connected in series. In this example, each single-coil, three-layer inductors includes: an even number of single-coil layers; and an odd number of two-coil layers selectively connected to form a single-coil, three-layer inductor that includes two terminals located on the periphery of the single-coil, three-layer inductor, as described above.

5. Magnetic Element

Generally, the system 100 includes a set of magnetic elements: rigidly coupled to the chassis 192 beneath the multi-layer inductor 150; and configured to magnetically couple to the multi-layer inductor 150 during a haptic feedback cycle, thereby applying an oscillating force to the multi-layer inductor 150 and oscillating the substrate 102—and therefore the touch sensor surface 172—within the receptacle 194 during this haptic feedback cycle.

In particular, the spiral traces within the multi-layer inductor 150 can span a coil footprint, such as a rectangular or ellipsoidal footprint including: long sides parallel to a primary axis of the multi-layer inductor 150; and short sides parallel to a secondary axis of the multi-layer inductor 150. For example: the substrate 102 can be five-inches in width and three-inches in length; the touch sensor surface 172 can span an area approximately 5 inches by 3 inches over the substrate 102; and the coil footprint of each single-core multi-layer inductor 150 within the substrate 102 can be approximately 1.5 inches in length and 0.5 inches in width with the primary axis of the single-core multi-layer inductor 150 extending laterally across the width of the substrate 102.

5.1 Horizontal Oscillation: Single-Core Multi-Layer Inductor

In one implementation, the set of magnetic elements are arranged relative to the multi-layer inductor 150 in order to induce an oscillating force—between the multi-layer inductor 150 and the magnetic elements—parallel to the touch sensor surface 172 such that the substrate 102 oscillates horizontally in a plane parallel to the touch sensor surface 172 during a haptic feedback cycle, as shown in FIGS. two and 4A.

Figure 4A:
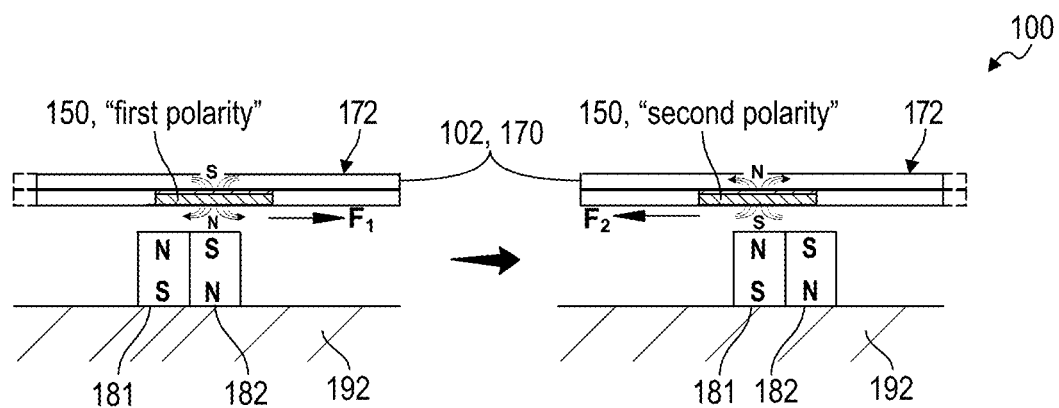
FIGS. 4A and 4B are flowchart representations of variations of the system.

In this implementation, the system 100 can include a first magnetic element 181: arranged in a receptacle 194 defined by the chassis 192 of the device; defining a first magnetic polarity facing the multi-layer inductor 150; and extending along a first side of the primary axis. In this implementation, the system 100 can similarly include a second magnetic element 182: arranged in the receptacle 194; defining a second magnetic polarity facing the multi-layer inductor 150; and extending along a second side of the primary axis adjacent the first magnetic element 181. In particular, the first magnetic element 181 can be arranged immediately adjacent and the second magnetic element. The first and second magnetic elements 181, 182 can be arranged directly under the multi-layer inductor 150 and can face the multi-layer inductor 150 with opposing polarities, as shown in FIG. 4A. When the controller 190 drives the multi-layer inductor 150 with an alternating voltage (or current), the multi-layer inductor 150 can generate a magnetic field that extends vertically through the substrate 102 (e.g., normal to the touch sensor surface 172) and interacts with the opposing magnetic fields of the first and second magnetic elements 181, 182. More specifically, when the controller 190 drives the multi-layer inductor 150 to a positive voltage during a haptic feedback cycle, the multi-layer inductor 150 can generate a magnetic field that extends vertically through the substrate 102 in a first vertical direction, which: attracts the first magnetic element 181 (arranged with the first polarity facing the multi-layer inductor 150; repels the second magnetic element 182 (arranged with the second polarity facing the multi-layer inductor 150; yields a first lateral force a first lateral direction; and shifts the substrate 102 laterally in the first lateral direction. When the controller 190 then reverses the voltage across the multi-layer inductor 150 during this haptic feedback cycle, the multi-layer inductor 150 can generate a magnetic field that extends vertically through the substrate 102 in the opposing vertical direction, which: repels the first magnetic element 181; attracts the second magnetic element 182; yields a second lateral force an second, opposite lateral direction; and shifts the substrate 102 laterally in the second lateral direction.

Therefore, by oscillating the polarity of the multi-layer inductor 150, the controller 190 can: induce oscillating interactions (i.e., alternating attractive and repelling forces)—parallel to the touch sensor surface 172—between the multi-layer inductor 150 and the magnetic elements; and thus oscillate the substrate 102 and touch sensor surface 172 horizontally (e.g., within a plane parallel to the touch sensor surface 172).

Therefore, in this implementation, the spiral traces of the single-core multi-layer inductor 150 can define: a first length (e.g., 1.5 inches) along the primary axis of the multi-layer inductor 150; and a first width (e.g., 0.5 inch)—less than first length—along the secondary axis of the multi-layer inductor 150. Furthermore, the first magnetic element 181 can define: a length parallel to and offset from the primary axis and approximating the first length of the spiral traces; and a second width parallel to the secondary axis of the multi-layer inductor 150 and approximately half of the first width of the spiral traces. The second magnetic element 182 can similarly define: a length parallel to and offset from the primary axis and approximating the first length of the spiral traces; and a width parallel to the secondary axis of the multi-layer inductor 150 and approximately half of the first width of the spiral traces. The first and second magnetic elements 181, 182 can be abutted and arranged on each side of the primary axis of the multi-layer inductor 150.

For example, the set of magnetic elements can include a permanent dipole magnet arranged in the receptacle 194 of the device and centered under the multi-layer inductor 150 such that the two poles of the set of magnetic elements are located on opposite sides of the primary axis of the multi-layer inductor 150. As described above, the set of magnetic elements can also include a set of permanent dipole magnets arranged in an antipolar configuration (e.g., a Halbach array).

The controller 190 (or the driver) can therefore polarize the multi-layer inductor 150 by applying an alternating voltage across the first and second terminals of the multi-layer inductor 150, thereby inducing an alternating current through the set of spiral traces, inducing an alternating magnetic field normal to the touch sensor surface, inducing oscillating magnetic coupling between the multi-layer inductor 150 and the set of magnetic elements, and thus vibrating the substrate 102 in a plane parallel to the touch sensor surface 172 during a haptic feedback cycle.

5.2 Horizontal Oscillation: Dual-Core Multi-Layer Inductor

Similarly, in the implementation described above in which the substrate 102 includes two adjacent single-core, multi-layer inductors 150 connected in series, the system 100 can include: a first magnetic element 181 arranged in the receptacle 194, defining a first magnetic polarity facing the first single-core multi-layer inductor 150, and extending along a first side of a first primary axis of the first single-core multi-layer inductor 150; a second magnetic element 182 arranged in the receptacle 194, defining a second magnetic polarity facing the first single-core multi-layer inductor 150, and extending along a second side of the first primary axis adjacent the first magnetic element 181; a third magnetic element arranged in the receptacle 194, defining the second magnetic polarity facing the second single-core multi-layer inductor 150, and extending along a first side of a second primary axis of the second single-core multi-layer inductor 150; and a fourth magnetic element arranged in the receptacle 194, defining the first magnetic polarity facing the second single-core multi-layer inductor 150, and extending along a second side of the second primary axis adjacent the third magnetic element, as shown in FIG. 6.

Accordingly, by oscillating the polarity of the first and second single-core multi-layer inductors 150—which include traces that spiral in the same direction and are therefore in phase—the controller 190 can: induce oscillating interactions parallel to the touch sensor surface 172 between the first single-core multi-layer inductor 150, the first magnetic element 181, and the second magnetic element 182 and between the second single-core multi-layer inductor 150, the third magnetic element, and the fourth magnetic element; and thus oscillate the substrate 102 and touch sensor surface 172 horizontally (e.g., within a plane parallel to the touch sensor surface 172).

5.2 Vertical Oscillation

Figure 4B:
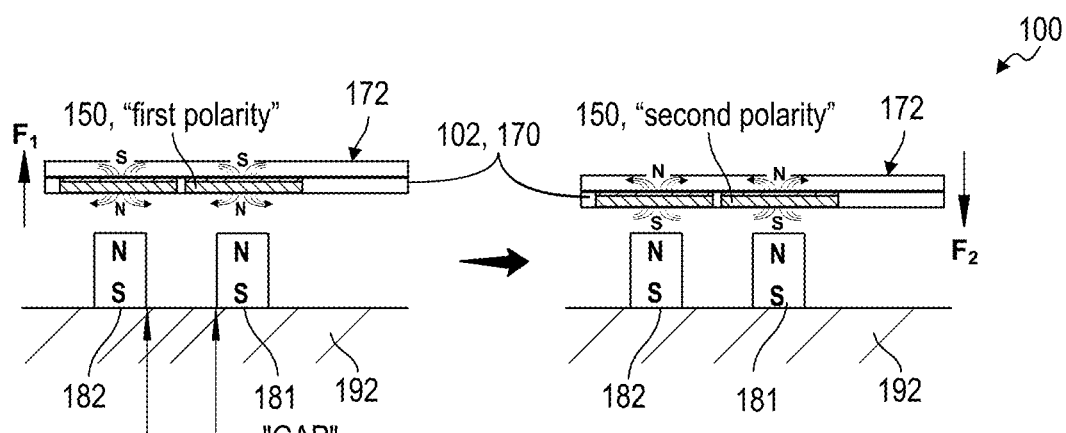
Figure 5A:
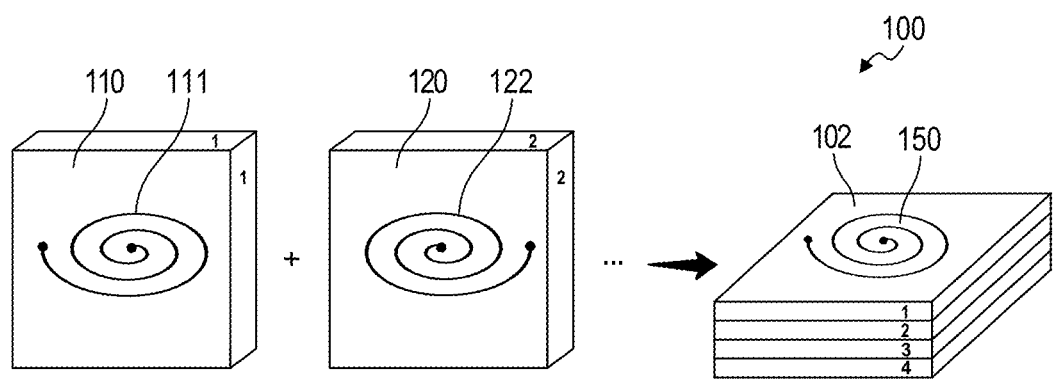
FIGS. 5A and 5B are flowchart representations of one variation of the system.
Figure 5B:
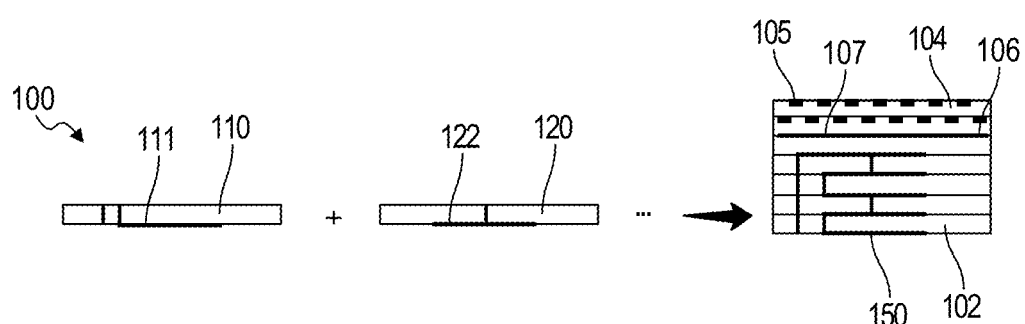

In another implementation, the set of magnetic elements are arranged relative to the multi-layer inductor 150 in order to induce an oscillating force—between the multi-layer inductor 150 and the magnetic elements—normal to the touch sensor surface 172 such that the substrate 102 oscillates vertically within the chassis 192 during a haptic feedback cycle, as shown in FIGS. 1 and 4B.

In the implementation described above in which the substrate 102 includes a single-core multi-layer inductor 150, the system 100 can include a first magnetic element 181: arranged in the receptacle 194 of the chassis 192; defining a first magnetic polarity facing the single-core multi-layer inductor 150; approximately centered under the multi-layer inductor 150; and extending laterally across the primary axis of the multi-layer inductor 150. The first magnetic element 181 can thus generate a magnetic field that extends predominantly vertically toward the multi-layer inductor 150 and that is approximately centered under the multi-layer inductor 150. More specifically, the first magnetic element 181 can generate a magnetic field that extends predominately normal to the touch sensor surface 172 proximal the center of the multi-layer inductor 150. As shown in FIG. 4B, when the controller 190 drives the multi-layer inductor 150 to a positive voltage during a haptic feedback cycle, the multi-layer inductor 150 can generate a magnetic field that extends vertically through the substrate 102 in a first vertical direction, which: repels the first magnetic element 181 (arranged with the first polarity facing the multi-layer inductor 150); yields a first vertical force in a first vertical direction; and lifts the substrate 102 vertically off of the first magnetic element 181. When the controller 190 then reverses the voltage across the multi-layer inductor 150 during this haptic feedback cycle, the multi-layer inductor 150 can generate a magnetic field that extends vertically through the substrate 102 in a second, opposite vertical direction, which: attracts the first magnetic element 181; yields a second vertical force in a second, opposite vertical direction; and draws the substrate 102 downward and back toward the first magnetic element 181.

Therefore, by oscillating the polarity of the multi-layer inductor 150, the controller 190 can: induce oscillating interactions (i.e., alternating attractive and repelling forces)—normal to the touch sensor surface 172—between the multi-layer inductor 150 and the first magnetic element 181; and thus oscillate the substrate 102 and touch sensor surface 172 vertically (e.g., normal to the touch sensor surface 172).

Furthermore, the system 100 can be reconfigured for vertical and horizontal oscillations of the touch sensor surface 172 by exchanging: a single magnetic element that spans the full width of and is centered under the multi-layer inductor 150; for a pair of opposing magnetic elements arranged under the multi-layer inductor 150 and on each of the primary axis of the multi-layer inductor 150 with no or minimal other modifications to the system 100, as shown in FIG. 6.

5.4 Vertical Oscillation: Dual-Core Multi-Layer Inductor

Similarly, in the implementation described above in which the substrate 102 includes two adjacent single-core, multi-layer inductors 150 connected in series and in phase (i.e., phased by zero degrees), the system 100 can include a first magnetic element 181: arranged in the receptacle 194; defining a first magnetic polarity facing the first single-core multi-layer inductor 150; approximately centered under the first single-core multi-layer inductor 150; and extending laterally across the primary axis of the first single-core multi-layer inductor 150. The system 100 can similarly include a second magnetic element 182: arranged in the receptacle 194 adjacent the first magnetic element 181; defining the first magnetic polarity facing the second single-core multi-layer inductor 150; approximately centered under the second single-core multi-layer inductor 150; and extending laterally across the primary axis of the second single-core multi-layer inductor 150, as shown in FIGS. 3 and 4B.

Accordingly, by oscillating the polarity of the first and second single-core multi-layer inductors 150—which are in phase—the controller 190 can: induce oscillating interactions normal to the touch sensor surface 172 between the first single-core multi-layer inductor 150 and the first magnetic element 181 and between the second single-core multi-layer inductor 150 and the second magnetic element 182; and thus oscillate the substrate 102 and touch sensor surface 172 vertically (e.g., normal to the touch sensor surface 172).

6. Chassis Integration

As described above, the substrate 102 is flexibly mounted to the chassis 192 (e.g., within or over a receptacle 194 defined by the chassis 192) to enable the substrate 102 to oscillate horizontally or vertically relative to the chassis 192 during a haptic feedback cycle.

6.1 Deflection Spacers

Figure 8A:
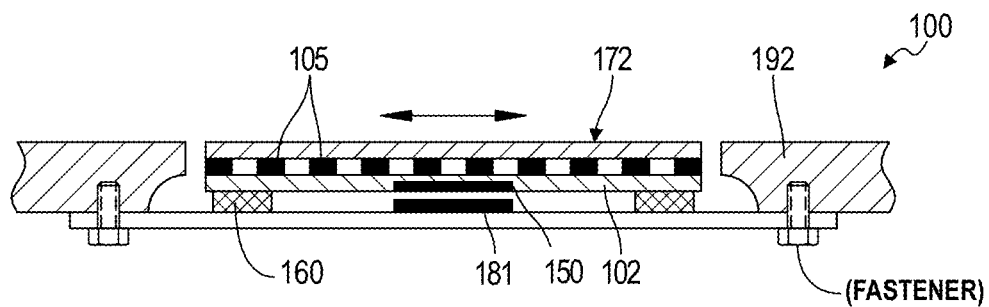
FIGS. 8A and 8B are schematic representations of one variation of the system.
Figure 8B:
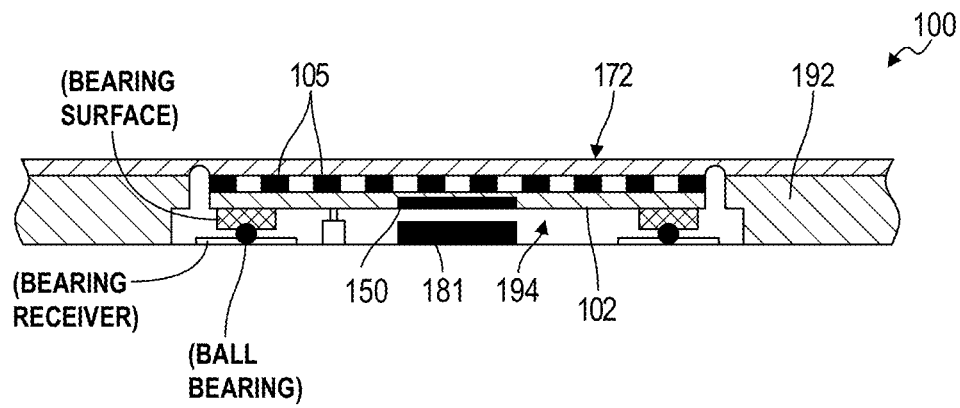
Figure 10:
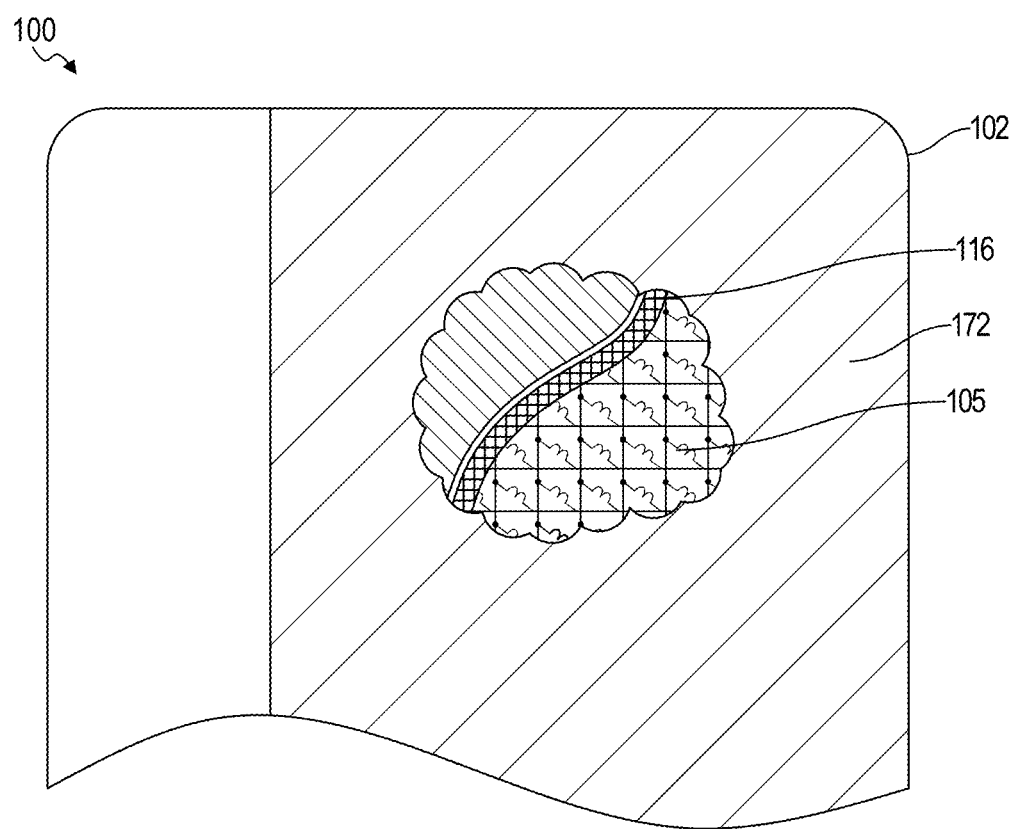
FIG. 10 is a schematic representation of one variation of the system.
Figure 11:
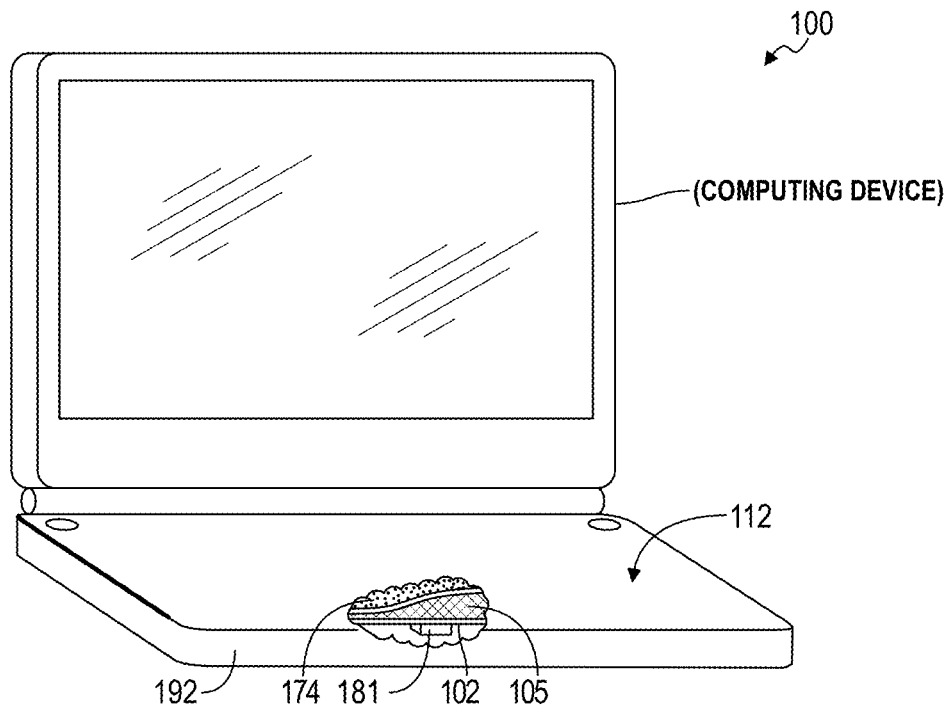
FIG. 11 is a schematic representation of one variation of the system.

In one configuration shown in FIGS. 2, 8, and 10A and as described in U.S. patent application Ser. No. 17/191,631, which is incorporated in its entirety by this reference: the top layer 104 of the substrate 102 includes an array of drive and sense electrode pairs 105 arranged in a grid array, at a first density, and in a mutual capacitance configuration; and a fourth inductor layer 140 of the substrate 102 includes a first set of electrodes 146 (e.g., a sparse perimeter array of interdigitated drive and sense electrode pairs 105) located proximal a perimeter of the substrate 102 at a second density less than the first density. In this implementation, the system 100 further includes a set of deflection spacers 160 (e.g., short elastic columns or buttons, adhesive films) coupled to the fourth inductor layer 140 of the substrate 102 over each sensor trace and configured to support the substrate 102 on the chassis 192 of the device. In particular, each deflection spacer 160 can include a force-sensitive layer 174: arranged across a sensor trace in the first set of electrodes 146; and exhibiting changes in contact resistance across the sensor trace responsive to a load on the touch sensor surface 172 that compresses the deflection space against the substrate 102.

Accordingly, in this implementation, the controller 190 can: read a first set of electrical values—representing capacitive coupling between drive and sense electrode pairs 105—from the set of drive and sense electrode pairs 105; and detect a first input at a first location on the touch sensor surface 172 based on deviation of electrical values—read from a subset of drive and sense electrode pairs 105 adjacent the first location—from baseline capacitance values stored for this subset of drive and sense electrode pairs 105. During this same scan cycle, the controller 190 can also: read a second set of electrical values (e.g., electrical resistances)—representing compression of the set of deflection spacers 160 against the first set of electrodes 146—from the first set of electrodes 146; interpret a force magnitude of the first input based on magnitudes of deviations of electrical (e.g., resistance) values from baseline electrical values across the set of electrodes; and drive an oscillating voltage across the multi-layer inductor 150 during a haptic feedback cycle in response to the force magnitude of the first input exceeding a threshold input force.

Generally, in this configuration, the set of deflection spacers 160: are interposed between the fourth inductor layer 140 of the substrate 102 and the base of the receptacle 194; and vertically support the substrate 102 within the receptacle 194.

In one implementation, each deflection spacer 160 includes a coupon: bonded to the bottom face of the substrate 102 and to the base of the receptacle 194; and formed in a low-durometer or elastic material that deflects laterally (or "shears") to enable the substrate 102 to translate laterally within the receptacle 194 responsive to alternating magnetic coupling between the multi-layer inductor 150 and the set of magnetic elements during a haptic feedback cycle. In another implementation, each deflection spacer 160 includes: a coupon bonded to the bottom face of the substrate 102; and a bottom face coated or including a low-friction material configured to slide across the base of the receptacle 194 to enable the substrate 102 to translate laterally in the receptacle 194 during a haptic feedback cycle while also vertically supporting the substrate 102 over the receptacle 194. In yet another implementation and as described below, each deflection spacer 160 is mounted to a spring or flexure element—which is mounted to the chassis 192—that enables the deflection spacer 160 to move laterally within the receptacle 194 while vertically supporting the substrate 102 within the receptacle 194.

In this configuration, the bottom conductive layer of the substrate 102 can include a pair of interdigitated drive and sense electrodes in each deflection spacer location about the perimeter of the substrate 102, as shown in FIG. 2. Furthermore, each deflection spacer 160 can include a layer of force-sensitive material—such as described above—facing the pair of interdigitated drive and sense electrodes at this deflection spacer location on the substrate 102. The controller 190 can thus: read an electrical resistance (or a voltage representing electrical resistance) across a pair of electrodes 146 at a deflection spacer location; and transform this resistance into a force magnitude carried from the touch sensor surface 172, into the substrate 102, and into the adjacent the deflection spacer 160. In particular, the system 100 can include multiple deflection spacers 160, and the controller 190 can: read electrical values from electrodes 146 at each deflection spacer location; convert these electrical values into force magnitudes carried by each deflection spacer 160; and aggregate these force magnitudes into a total force magnitude of an input on the touch sensor surface 172.

Therefore, in this configuration, the substrate 102 can define a unitary structure including a dense array of drive and sense electrode pairs 105 that form a touch sensor, a column of spiral traces that form a multi-layer inductor 150, and a sparse array of drive and sense electrode pairs 105 that form a set of force sensors that support the substrate 102 on the chassis 192.

6.1.1 Capacitive Deflection Spacer

Alternatively, the fourth inductor layer 140 of the substrate 102 can include a sparse array of electrodes 146 (e.g., interdigitated drive and sense electrode pairs 105) arranged in a capacitive sensing configuration at each deflection spacer location such that each of these electrodes 146 capacitively couples: to the chassis 192; to the adjacent deflection spacer 160; to a spring element 162 supporting the substrate 102 at this deflection spacer location; or to another fixed metallic element at this deflection spacer location. Accordingly, during a scan cycle, the controller 190 can: read capacitance values from the electrodes 146 at these deflection spacer locations; convert these capacitance values into force magnitudes carried by each deflection spacer 160 during the scan cycle; and aggregate these force magnitudes into a total force magnitude of an input on the touch sensor surface 172.

6.1.2 Capacitance Force Sensing

In one implementation, the second sensor layer includes a bottom side defining a set of support locations. The second sensor layer further includes the first set of electrodes 146 (e.g., a sparse perimeter array of sense electrodes) arranged across the bottom side and adjacent (e.g., encircling, abutting) the support locations. The first set of electrodes 146 can be printed directly across the bottom side of the second sensor layer and/or can be integrated into a rigid or flexible PCB layered over the bottom side of the second sensor layer.

In this implementation, the system 100 further includes a baseplate: arranged below the substrate; including a second set of electrodes 147 (e.g., a sparse perimeter array of drive electrodes arranged on a top side of the baseplate in alignment with the first set of electrodes 146—on the bottom side of the second sensor layer—to form an array of capacitive force sensors; and configured to effect capacitance values of the array of capacitance sensors responsive to displacement of the substrate toward the baseplate. Similarly, the second set of electrodes 147 can be printed directly across the top side of the baseplate and/or can be integrated into a rigid or flexible PCB layered over the top side of the baseplate. The controller can therefore, during a scan cycle, read capacitance values from the first set of electrodes 146; and interpret force magnitudes of inputs applied to the touch sensor surface based on capacitance values read from the first set of electrodes 146.

6.1.2.1 Sense Electrodes

In one implementation, the system 100 includes: each support location, in the set of support locations, arranged about a perimeter of the bottom side of the second sensor layer of the substrate; and the first set of electrodes 146 arranged across the bottom side of the second sensor layer adjacent the support locations.

For example, the set of support locations can include: a first subset of support locations arranged proximal corner edges of the bottom side of the second sensor layer; and a second subset of support locations arranged proximal lateral side edges of the bottom side of the second sensor layer between the corner edges. In this example, each sensor trace, in the first set of electrodes 146: can be arranged adjacent a first side of a support location, in the set of support locations; and define a shape encircling the support location—such as a semi-circular shape (e.g., horseshoe shape, crescent shape) encircling the support location, and/or a crenellation shape encircling the support location—on the first side of the support locations.

Additionally or alternatively in this example, the sensor electrodes in the first set of electrodes 146 can be arranged: proximal the lateral side edges of the bottom side of the second sensor layer proximal the set of support locations about the perimeter of the bottom side of the second sensor layer; and/or proximal a center of the bottom side of the second sensor layer proximal the support locations about the center of the bottom side of the second sensor layer. In particular, the sensor electrodes can extend about a first lateral side edge of the bottom side of the second sensor layer, and/or arranged proximal about a corner edge of the bottom side of the second sensor layer proximal the set of support locations about the perimeter of the bottom side of the second sensor layer.

The system 100 can therefore: accommodate sensor electrodes of varying shapes and sizes on the bottom side of the second sensor layer to maintain uniformity across the substrate; and reduce sensitivity to noise during scan cycles—by the controller—to read capacitance values from the first set of electrodes 146 on the bottom side of the second senor layer.

6.1.2.2 Mutual Capacitance Force Sensors

In one implementation shown in FIG. 1, the array of capacitance force sensors—formed by the second set of electrodes 147 on the baseplate and the first set of electrodes 146 on the substrate—are arranged in a mutual-capacitance configuration adjacent each support location.

For example, each capacitance force sensor can include: a sense electrode arranged on the bottom side of the second sensor layer adjacent a first side of a support location; and a drive electrode (e.g., conductive trace) fabricated on the top layer of the baseplate opposite the first side of the support location and in vertical alignment to the sense electrode. In this example, the first set of electrodes 146 and the second set of electrodes 147 within the array of capacitive force sensors capacitively couple each other, and an airgap between the substrate and the baseplate can form an air dielectric between the first set of electrodes 146 and the second set of electrodes 147.

In the foregoing example, in response to a force input on the touch sensor surface, the adjacent spring elements can then yield such that the first set of electrodes 146 of the second sensor layer move closer to the second set of electrodes 147 on the baseplate, thereby reducing the air gap between the first set of electrodes 146 and the second set of electrodes 147. The reduced distance between the set of sensor layers and the baseplate thus increases the effective dielectric between the first set of electrodes 146 and the second set of electrodes 147 thus increasing the capacitance of the first set of electrodes 146 and the second set of electrodes 147. The capacitance value of the capacitance force sensor may therefore deviate from a baseline capacitance value—such as in the form of an increase in the charge time of the capacitance force sensor and an increase in the discharge time of the capacitance force sensor, or a decrease in the resonant frequency of the capacitance force sensor—when the touch sensor surface is depressed over the capacitance force sensor.

Therefore, in this implementation, the controller can, during a scan cycle: (serially) drive each drive electrode in the second set of electrodes 147, such as by a target voltage, over a target time interval, or with an alternating voltage of a particular frequency; read a set of capacitance values—from each sensor trace in the first set of electrodes 146—that represent measures of mutual capacitances between the first set of electrodes 146 and the second set of electrodes 147 of the array of capacitive force sensors; and interpret a distribution of forces applied to the touch sensor surface based on this set of capacitance values.

6.1.2.3 Self-Capacitance Force Sensors

In one implementation, the array of capacitance force sensors—formed by the second set of electrodes 147 on the baseplate and the first set of electrodes 146 on the substrate—are arranged in a self-capacitance configuration adjacent each support location.

For example, each capacitance force sensor can include a single electrode arranged on a bottom side of the second sensor layer proximal (e.g., encircling) a support location, and the baseplate can be grounded to function as a common second electrode for each capacitance sensor. In this example, the single electrode within a capacitance sensor and the baseplate can capacitively couple, and an air gap between the substrate and the baseplate can form an air dielectric between the capacitance force sensor and the baseplate.

Therefore, in this implementation, the controller can, during a scan cycle, drive the baseplate to a reference (e.g., ground) potential; (serially) drive each capacitance sensor, such as by a target voltage, over a target time interval, or with an alternating voltage of a particular frequency; read a set of capacitance values—from each sensor trace in the first set of electrodes 146—that represent measures of self-capacitance between the capacitance force sensors and the baseplate; and interpret a distribution of forces applied to the touch sensor surface based on this set of capacitance values and known spring constants in the set of spring elements.

In another implementation, the system 100 can implement a combination of mutual capacitance force sensors and self-capacitance force sensors to interpret force applied to the touch sensor surface. In this implementation, the controller can sequentially execute scan cycles to read mutual capacitance values and self-capacitance values from the electrodes on the substrate and the baseplate.

6.2 Spring-Loaded Chassis Interface

Figure 22:
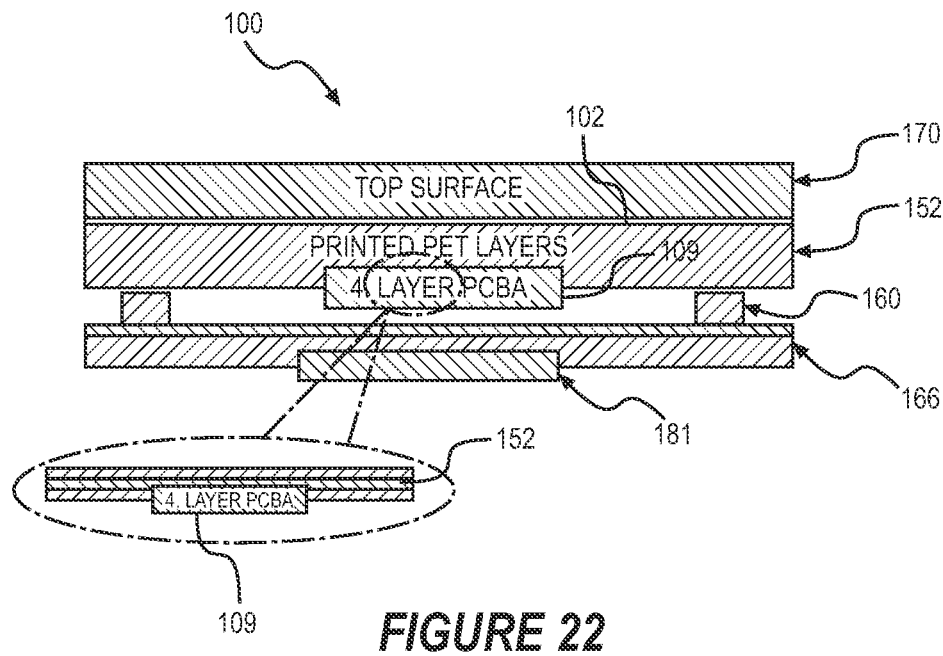
FIG. 22 is a schematic representation of one variation of the system.

Additionally or alternatively as shown in FIGS. 2, 3, and 22 and as described in U.S. patent application Ser. No. 17/191,631, the system 100 can include a chassis interface 166 (or "baseplate"): configured to mount to the chassis 192 of the device; and defining a set of spring elements 162 coupled to the substrate 102 (e.g., via a set of deflection spacers 160) and configured to deflect out of the plane of the chassis interface 166 responsive to an input on the touch sensor surface 172 and/or responsive to actuation of the multi-layer inductor 150 during a haptic feedback cycle.

In this implementation, the chassis 192 of the computing device can include a chassis receptacle 194 defining a depth approximating (or slightly more than) the thickness of a set of deflection spacers 160 (e.g., 1.2-millimeter chassis receptacle 194 depth for 1.0-millimeter-thick deflection spacers 160). The deflection spacers 160 are bonded to the chassis interface 166 at each spring element 162. The chassis interface 166 can then be rigidly mounted to the chassis 192 over the receptacle 194, such as via a set of threaded fasteners or an adhesive. The substrate 102 and the set of deflection spacers 160 may thus transfer a force—applied to the touch sensor surface 172—into these spring elements 162, which deflect inwardly below a plane of the chassis interface 166 and into the chassis receptacle 194.

(In the configuration described above in which the substrate 102 includes sensors traces at these deflection spacer locations, each spacer is also compressed between the substrate 102 and the adjacent spring element 162 when a force is applied to the touch sensor surface 172 and therefore exhibits a change in its local contact resistance across the adjacent sensor trace proportional to the force carried into the adjacent spring element 162. The controller 190 can therefore read electrical values (e.g., a resistances) across these electrodes 146 and convert these electrical values into portion of the input force carried by each sensor trace.)

In one implementation, the chassis interface 166 and spring elements 162 define a unitary structure. In one example, the chassis interface 166 includes a thin-walled structure (e.g., a stainless steel twenty-gage, or 0.8-millimeter-thick sheet) that is punched, etched, or laser-cut to form a flexure aligned to each deflection spacer location. Thus, in this example, each spring element 162 can define a flexure—such as a multi-arm spiral flexure—configured to laterally and longitudinally locate the system 100 over the chassis 192 and configured to deflect inwardly and outwardly from a nominal plane defined by the thin-walled structure. More specifically, in this example, the chassis interface 166 can include a unitary metallic sheet structure arranged between the substrate 102 and the chassis 192 and defining a nominal plane. Each spring element 162: can be formed (e.g., fabricated) in the unitary metallic structure; can define a stage coupled to a spacer opposite the fourth inductor layer 140 of the substrate 102; can include a flexure fabricated in the unitary metallic structure; and can be configured to return to approximately the nominal plane in response to absence of a touch input applied to the touch sensor surface 172.

Furthermore, in this implementation, the magnetic elements can be arranged in the receptacle 194, and the spring elements 162 can locate the fourth inductor layer 140 of the substrate 102 at a nominal gap (e.g., one millimeter) above the magnetic elements. However, application of an input on the touch sensor surface 172 can compress the spring elements 162, thereby closing this gap and bringing the multi-layer inductor 150 closer to the magnetic element, which may increase magnetic coupling between the multi-layer inductor 150 and the magnetic elements, increasing a peak-to-peak force between the multi-layer inductor 150 and the magnetic elements, and increasing the oscillation amplitude of the substrate 102 during a haptic feedback cycle, as shown in FIG. 22. Therefore, the spring elements 162 can compress during application of an input on the touch sensor surface 172, thereby a) closing a gap between the multi-layer inductor 150 and the magnetic elements and b) increasing the oscillation amplitude of the substrate 102 during a haptic feedback cycle—responsive to this input—proportional to the force magnitude of this input.

Accordingly, a low-force input on the touch sensor surface 172 may minimally compress the springs elements, minimally reduce the gap between the multi-layer inductor 150 and the magnetic elements, and thus yield low-amplitude oscillations during a haptic feedback cycle responsive to this low-force input. Conversely, a high-force input on the touch sensor surface 172 may compress the spring elements by a larger distance, significantly reduce the gap between the multi-layer inductor 150 and the magnetic elements, and thus yield higher-amplitude oscillations during a haptic feedback cycle responsive to this high-force input.

Therefore, in this configuration, the system 100 can include a set of spring elements 162: supporting the substrate 102 within the receptacle 194 with the multi-layer inductor 150 located over the first magnetic element 181 and the second magnetic element 182; and biasing the substrate 102 within the receptacle 194 to locate the multi-layer inductor 150 at a nominal offset distance above the first magnetic element 181 and the second magnetic element 182. In particular, the spring elements 162 can compress responsive to application of an input on the touch sensor surface 172 to: locate the multi-layer inductor 150 at a second offset distance, less than the nominal offset distance, above the first magnetic element 181 and the second magnetic element 182; and increase magnetic coupling between the multi-layer inductor 150, the first magnetic element 181, and the second magnetic element 182 during the haptic feedback cycle.

For example, the set of spring elements 162 can bias the substrate 102 within the receptacle 194 to locate the multi-layer inductor 150 (or the bottom spiral trace of the multi-layer inductor 150 in the fourth inductor layer 140 of the substrate 102) at a nominal offset distance—between 400 and boo microns—above the magnetic elements. The spring elements 162 can also cooperate to yield a spring constant between 800 and 1200 grams per millimeter across the touch sensor surface 172. Therefore, application of force greater than approximately 500 grams to the touch sensor surface 172 can fully compress the set of spring elements 162. However, the system 100 can also exhibit increasing oscillation amplitudes of the substrate 102 during haptic feedback cycles as a function of magnitude of applied force on the touch sensor surface 172, such as from a minimum threshold force of five grams up to the maximum force of 500 grams.

(In similar implementations shown in FIGS. 11A, 11B, 11C, and 11D, the substrate 102 can be mounted to the chassis 192 via a set of flexible grommets that are compliant in vertical and/or horizontal directions to enable the substrate 102 to oscillation within the receptacle 194 during a haptic feedback cycle.)

6.3 Spring Elements and Chassis Interface

Figure 20:
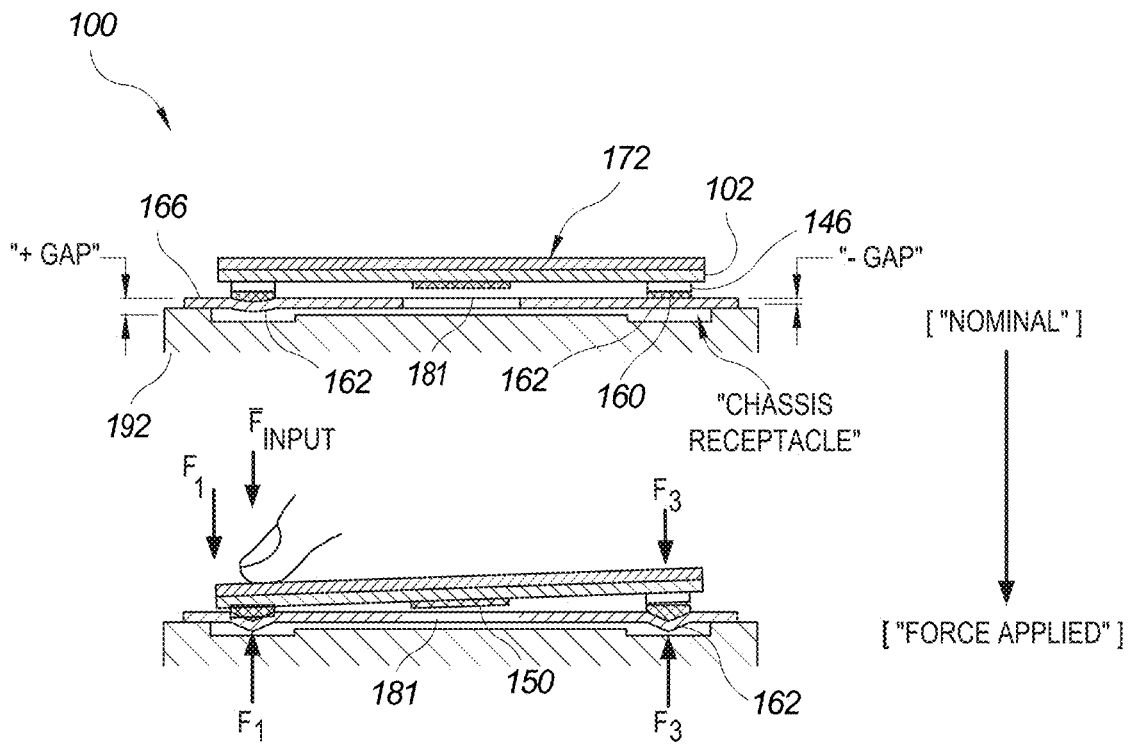
FIG. 20 is a flowchart representation of one variation of the system.
Figure 21:
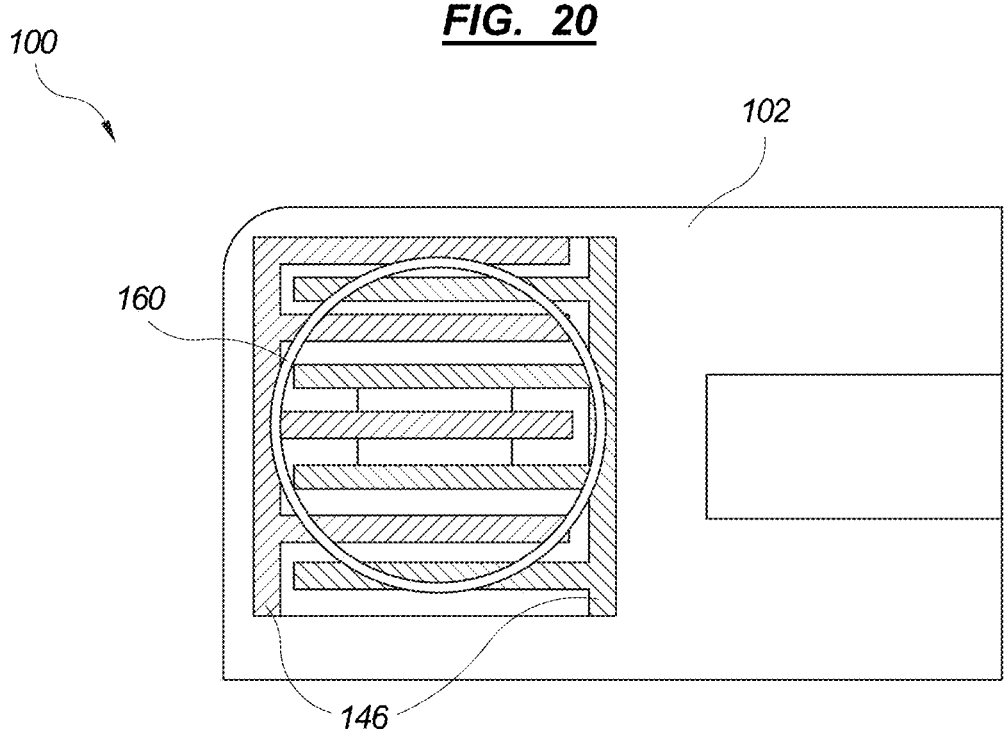
FIG. 21 is a schematic representation of one variation of the system.

In a similar variations shown in FIGS. 20 and 21, the system 100 includes a set of deflection spacers 160, wherein each deflection spacer in the set is arranged over a discrete deflection spacer location—in a set of discrete deflection spacer locations—on a bottom surface (e.g., the bottom layer) of the substrate below. The system 100 can further include an array of spring elements 162: that couple the set of deflection spacers 160 to the chassis of the computing device; supporting the substrate on the chassis; and configured to yield to oscillation of the substrate (e.g., vertically or horizontally) responsive to an oscillating voltage driven across the multi-layer inductor by the controller 190 during a haptic feedback cycle.

In one implementation shown in FIG. 20, the system 100 includes chassis interface 166 defining a unitary metallic structure: arranged between the substrate and the chassis; that defines an aperture below the multi-layer inductor; and that includes a set of flexures arrange about the aperture and defining the array of spring elements 162 (e.g., flexures). In this implementation, the system 100 can also include a magnetic yoke 184 arranged in the aperture of the unitary metallic structure; and the first magnetic element and the second magnetic element can be arranged on the magnetic yoke below the multi-layer inductor. Accordingly, the magnetic yoke 184 can limit a permeability path for magnetic field lines between the rear faces of the first and second magnetic elements opposite the substrate.

7. Ground Plane Geometry and Shielding

The substrate 102 can further include a shielding trace fabricated in a conductive layer and configured to shield the touch sensor from electrical noise generated by the multi-layer inductor 150, such as during and after a haptic feedback cycle.

In one implementation, the substrate 102 further includes an intermediate layer 106 interposed between: the top layer 104, which contains the drive and sense electrode pairs 105; and the first inductor layer 110 of the substrate 102 that contains the topmost spiral trace of the multi-layer inductor 150. In this implementation, the intermediate layer 106 can include a contiguous trace area that defines an electrical shield 107 configured to shield the set of drive and sense electrode pairs 105 of the touch sensor from electrical noise generated by the multi-layer inductor 150 when driven with an oscillating voltage by the controller 190 during a haptic feedback cycle. In particular, the controller 190 can drive the electrical shield 107 in the intermediate layer 106 to a reference voltage potential (e.g., to ground, to an intermediate voltage), such as: continuously throughout operation; or intermittently, such as during and/or slightly after a haptic feedback cycle. Thus, when driven to the reference potential, the electrical shield 107 can shield the drive and sense electrode pairs 105 of the touch sensor in the top layer 104 from electrical noise.

Furthermore, as shown in FIG. 1, the electrical shield 107 can include a cleft—such as in the form of a serpentine break across the width of the electrical shield 107—in order to prevent circulation of Eddy currents within the electrical shield 107, which may otherwise: create noise at the drive and sense electrode pairs 105 in the touch sensor above; and/or induce a second magnetic field opposing the magnetic field generated by the multi-layer inductor 150, which may brake oscillation of the substrate 102 during a haptic feedback cycle.

Additionally or alternatively, in the configuration described above in which the system 100 includes electrodes 146 at deflection space locations on the fourth inductor layer 140 of the substrate 102, the first inductor layer no of the substrate 102—arranged below the top layer 104 and/or the intermediate layer 106 and containing the first spiral trace in of the multi-layer inductor 150—can include an electrical shield 107 separate from and encircling the first spiral trace 111. In this implementation, the controller 190 can drive both this electrical shield 107 in the first inductor layer 110 and the multi-layer inductor 150 to a reference voltage potential (e.g., to ground, to an intermediate voltage)—outside of haptic feedback cycles—in order to: shield these electrodes 146 from electrical noise from outside of the system 100; and/or shield the drive and sense electrode pairs 105 in the touch sensor from electrical noise generated by these electrodes 146. Therefore in this implementation, the first inductor layer 110 of the substrate 102—containing the first spiral trace in of the multi-layer inductor 150—can further include a shield electrode trace 112 adjacent and offset from the first spiral trace 111; and the controller 190 can drive the shield electrode trace 112 and the first spiral trace 111 to a reference potential in order to shield the first set of electrodes 146—at the deflection spacer locations—from electrical noise when reading electrical values from these electrodes 146.

For example, in this implementation, the controller 190 can hold the multi-layer inductor 150 (or a topmost spiral trace in the multi-layer inductor 150 at a virtual ground potential while scanning and processing resistance (or capacitance) data from drive and sense electrode pairs 105 in the touch sensor in the top conductive layer(s) of the substrate 102 during a scan cycle. The controller 190 can subsequently: detect an input on the touch sensor surface 172 based on a change in resistance (or capacitance) values read from drive and sense electrode pairs 105 in the touch sensor; release the multi-layer inductor 150 from the virtual reference potential; and polarize the multi-layer inductor 150 via a time-varying current signal during a haptic feedback cycle responsive to detecting this input on the touch sensor surface 172. More specifically, the controller 190 can: ground the electrical shield 107 and the multi-layer inductor 150 during a scan cycle in order to shield the touch sensor from electronic noise; and pause scanning of the touch sensor during haptic feedback cycles (e.g., while the multi-layer inductor 150 is polarized) in order to avoid generating and responding to noisy touch images during haptic feedback cycles.

Thus, in this variation, power electronics (e.g., the multi-layer inductor 150) and sensor electronics in both high- and low-resolution sensors (e.g., drive and sense electrode pairs 105 in the touch sensor and electrodes 146 at the deflection spacer locations, respectively) can be fabricated on a single, unitary substrate 102, thereby eliminating manufacture and assembly of multiple discrete substrates for different haptic feedback and touch-sensing functions and enable the system 100 to perform touch sensing, force-sensing, and haptic feedback functions in a thinner package.

8. Controller

During operation, the controller 190 can: detect application of an input on the touch sensor surface 172 based on changes in electrical (e.g., capacitance or resistance, etc.) values between drive and sense electrode pairs 105 in the touch sensor integrated into the top layer(s) 104 of the substrate 102; characterize a force magnitude of the input based on these electrical values read from the touch sensor and/or based on electrical values read from electrodes 146 in the deflection spacers 160 integrated into the bottom layer(s) 140 of the substrate 102; and/or interpret the input as a "click" input if the force magnitude of the input exceeds a threshold force magnitude (e.g., 160 grams). Then, in response to detecting the input and/or interpreting the input as a "click" input, the controller 190 can execute a haptic feedback cycle, such as by transiently polarizing the multi-layer inductor 150 in order to induce alternating magnetic coupling between the multi-layer inductor 150 and the set of magnetic elements and thus vibrating the substrate 102 within the chassis 192, serving haptic feedback to a user, and providing the user with tactile perception of downward travel of the touch sensor surface 172 analogous to depression of a mechanical momentary switch, button, or key.

9. Haptic Feedback Cycle

In this variation, the multi-layer inductor 150—integrated into the substrate 102—and the set of magnetic elements—housed within the chassis 192 below the multi-layer inductor 150—cooperate to define a compact, integrated multi-layer inductor 150 configured to oscillate the substrate 102 and the touch sensor surface 172 responsive to polarization of the multi-layer inductor 150 by the controller 190 (e.g., in response detecting touch inputs on the touch sensor surface 172). More specifically, the controller 190, in conjunction with a drive circuit, can supply an alternating (i.e., time-varying) drive current to the multi-layer inductor 150 during a haptic feedback cycle, thereby generating a time-varying magnetic field through the multi-layer inductor 150 that periodically reverses direction. Thus, the controller 190 and/or the drive circuit can transiently polarize the multi-layer inductor 150 to generate magnetic forces between the multi-layer inductor 150 and the set of magnetic elements, thereby causing the multi-layer inductor 150 (and thus the substrate 102 and touch sensor surface 172) to be alternately attracted and repelled by poles of the set of magnetic elements and oscillating the touch sensor surface 172 relative to the chassis 192, as shown in FIGS. 16 and 17.

Figure 16:
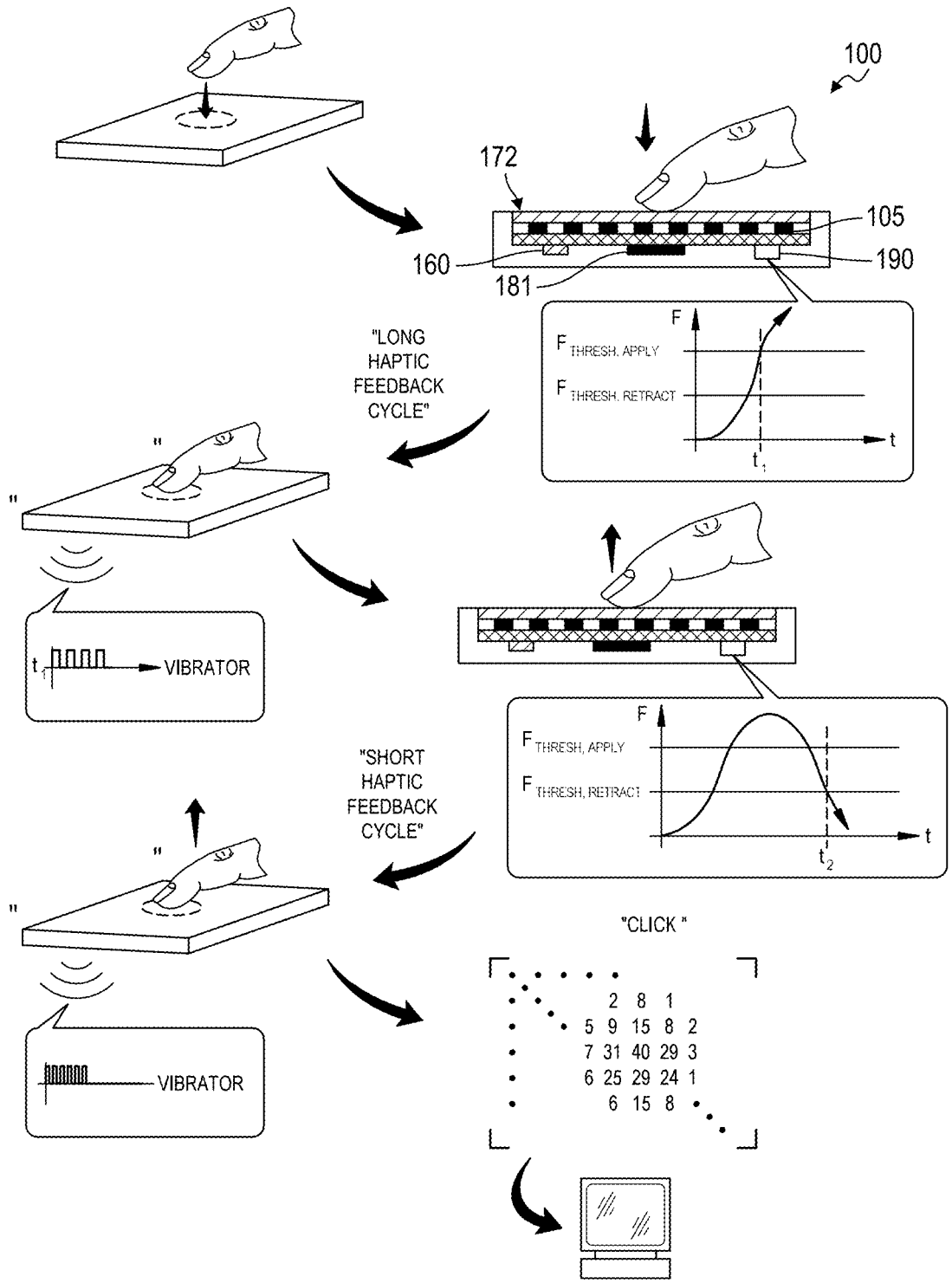
FIG. 16 is a flowchart representation of one variation of the system.
Figure 17:
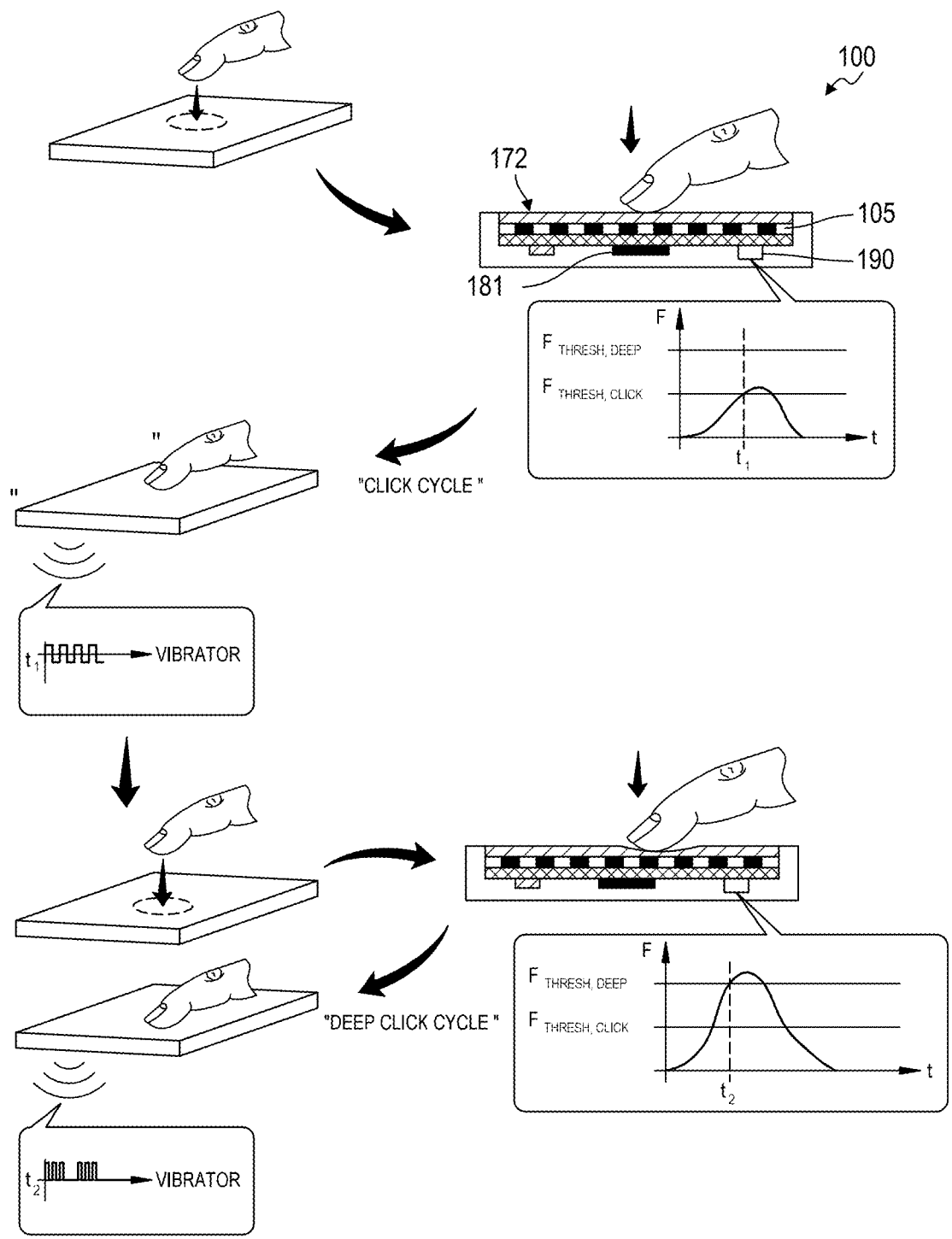
FIG. 17 is a flowchart representation of one variation of the system.
Figure 18:
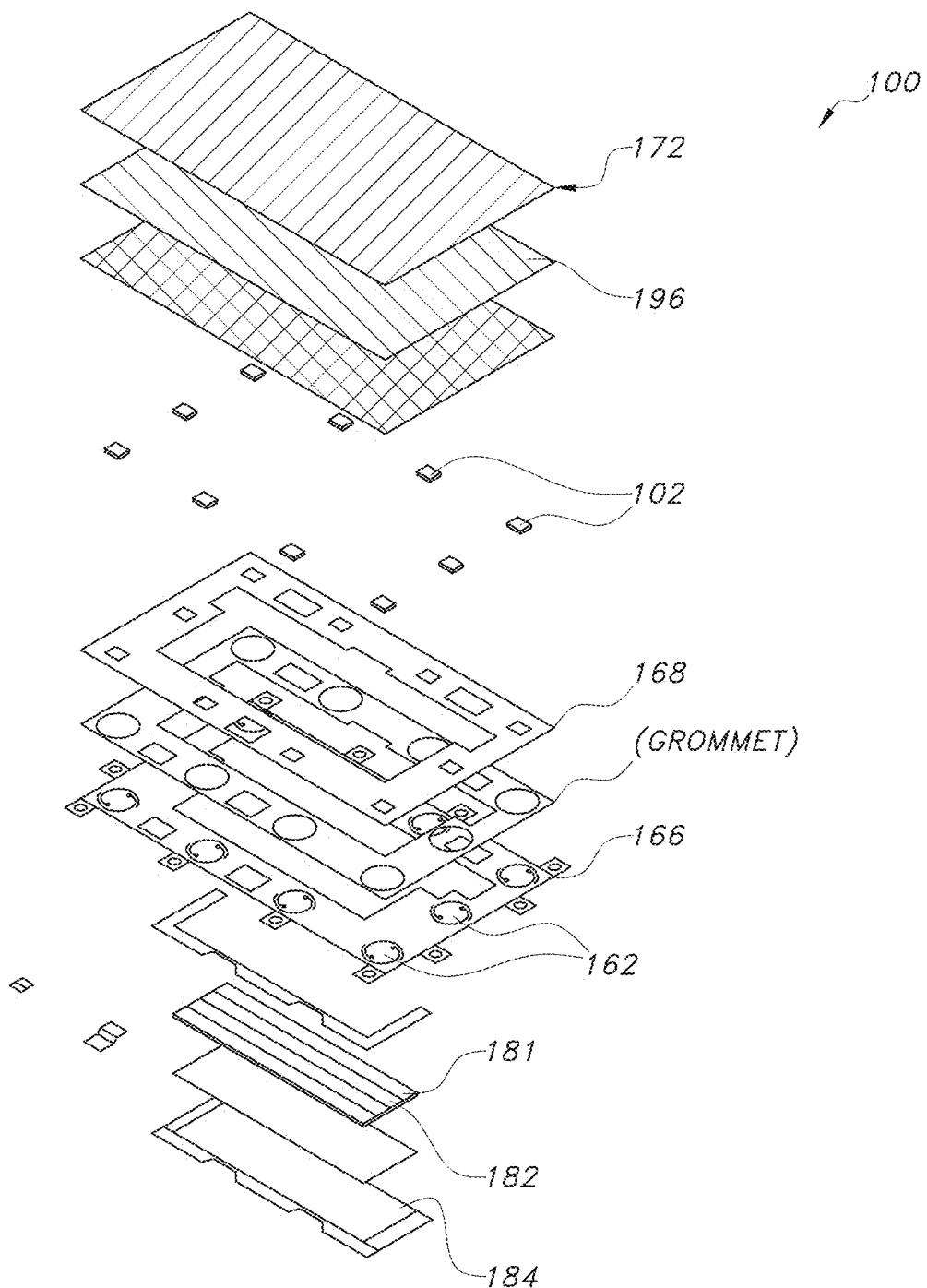
FIG. 18 is a schematic representation of one variation of the system.
Figure 19:
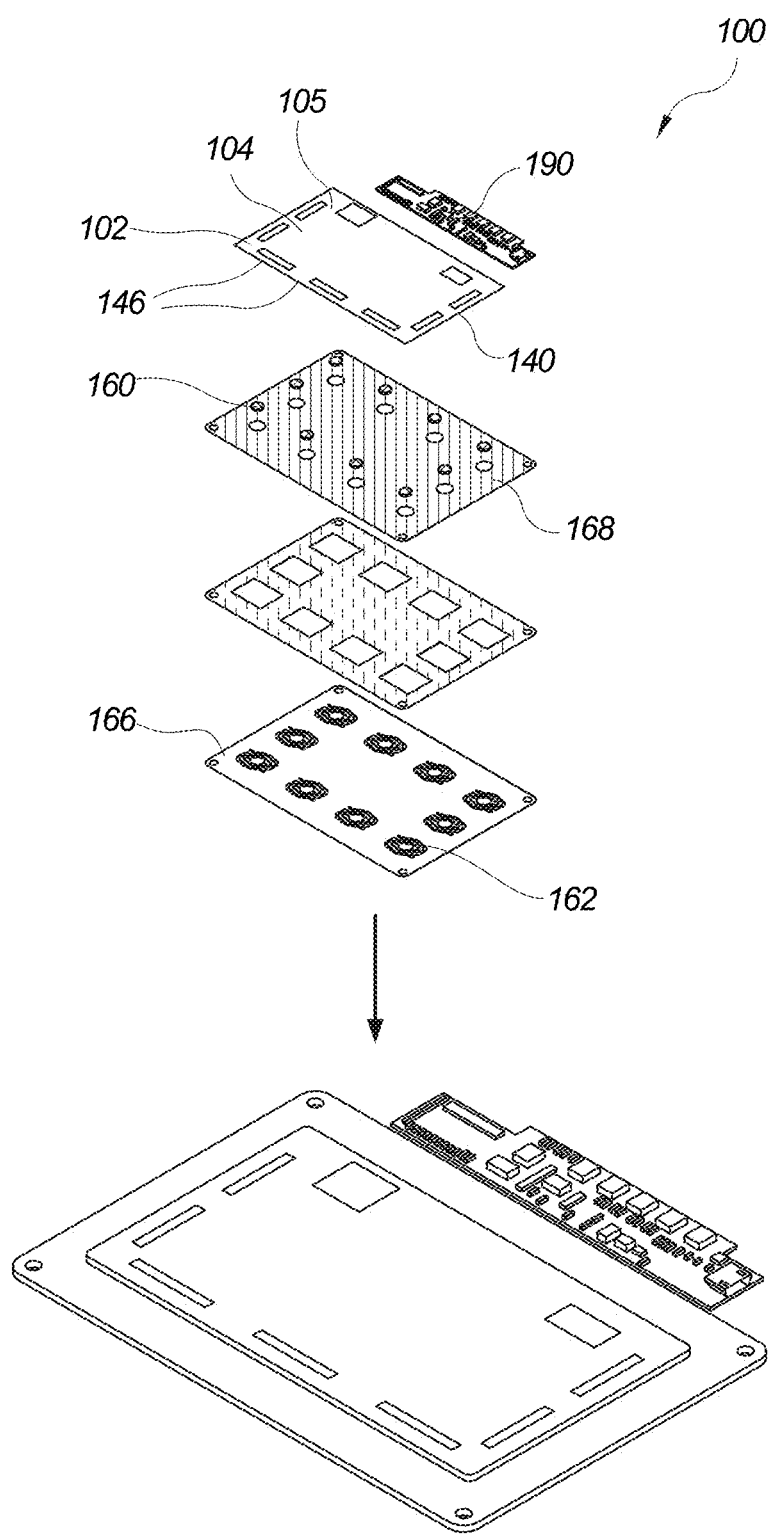
FIG. 19 is a schematic representation of one variation of the system.

In particular, in response to detecting a touch input—on the touch sensor surface 172—that exceeds a threshold force (or pressure) magnitude, the controller 190 drives the multi-layer inductor 150 during a "haptic feedback cycle" in order to tactilely mimic actuation of a mechanical snap button, as shown in FIGS. 16 and 17. For example, in response to such a touch input, the controller 190 can trigger a motor driver to drive the multi-layer inductor 150 with a square-wave alternating voltage for a target click duration (e.g., 250 milliseconds), thereby inducing an alternating magnetic field through the multi-layer inductor 150, which magnetically couples to the set of magnetic elements, induces an oscillating force between the magnetic element and the multi-layer inductor 150, and oscillates the substrate 102 relative to the chassis 192 of the device.

9.1 Standard Click and Deep Click

In one variation, the controller 190: executes a "standard-click haptic feedback cycle" in Blocks S110 and S120 in response to application of a force that exceeds a first force magnitude and that remains less than a second force threshold (hereinafter a "standard click input"); and executes a "deep haptic feedback cycle" in Blocks S114 and S124 in response to application of a force that exceeds the second force threshold (hereinafter a "deep click input"). In this variation, during a deep haptic feedback cycle, the controller 190 can drive the multi-layer inductor 150 for an extended duration of time (e.g., 750 milliseconds), at a higher amplitude (e.g., by driving the haptic feedback cycle at a higher peak-to-peak voltage), and/or at a different (e.g., lower) frequency in order to tactilely indicate to a user that a deep click input was detected at the touch sensor surface 172.

In one example, the controller 190 can: output a left-click control command and execute a standard-click haptic feedback cycle in response to detecting an input of force magnitude between a low "standard" force threshold and a high "deep" force threshold; and output a right-click control command function and execute a deep-haptic feedback cycle in response to detecting an input of force magnitude greater than the high "deep" force threshold. The system 100 can therefore: detect inputs of different force magnitudes on the touch sensor surface 172; assign an input type to an input based on its magnitude; serve different haptic feedback to the user by driving the multi-layer inductor 150 according to different schema based on the type of a detected input; and output different control functions based on the type of the detected input.

9.2 Hysteresis

In one variation, the controller 190 implements hysteresis techniques to trigger haptic feedback cycles during application and retraction of a single input on the touch sensor surface 172. In particular, in this variation, the controller 190 can selectively: drive the multi-layer inductor 150 according to a "down-click" oscillation profile during a haptic feedback cycle in response to detecting a new input—of force greater than a high force threshold (e.g., 165 grams)—applied to the touch sensor surface 172; track this input in contact with the touch sensor surface 172 over multiple scan cycles; and then drive the multi-layer inductor 150 according to an "up-click" oscillation profile during a later haptic feedback cycle in response to detecting a drop in force magnitude of this input to less than a low force threshold (e.g., 60 grams). Accordingly, the system 100 can: replicate the tactile "feel" of a mechanical snap button being depressed and later released; and prevent "bouncing" haptic feedback when the force magnitude of an input on the touch sensor surface 172 varies around the force threshold.

More specifically, when the force magnitude of an input on the touch sensor surface 172 reaches a high force threshold, the controller 190 can execute a single "down-click" haptic feedback cycle—suggestive of depression of a mechanical button—until the input is released from the touch sensor surface 172. However, the controller 190 can also execute an "up-click" haptic feedback cycle—suggestive of release of a depressed mechanical button—as the force magnitude of this input drops below a second, lower threshold magnitude. Therefore, the controller 190 can implement hysteresis techniques to prevent "bouncing" in haptic responses to the inputs on the touch sensor surface 172, to indicate to a user that a force applied to the touch sensor surface 172 has been registered (i.e., has reached a first threshold magnitude) through haptic feedback, and to indicate to the user that the user's selection has been cleared and force applied to the touch sensor surface 172 has been registered (i.e., the applied force has dropped below a second threshold magnitude) through additional haptic feedback.

10. Multiple Multi-Layer Inductors

In one variation, the system 100 can also include multiple multi-layer inductor 150 and magnetic element pairs. In one example, the system 100 includes: a first multi-layer inductor 150 arranged proximal a first edge of the substrate 102; and a first magnetic element 181 arranged in the chassis 192 under the first multi-layer inductor 150 and thus near the first edge of the substrate 102. In this example, the system 100 can also include: a second magnetic element 182 rigidly coupled to the chassis 192 and offset from the first magnetic element 181; and a second inductor coupled to the substrate 102 below the touch sensor surface 172, arranged proximal a second edge of the substrate 102 opposite the first edge, and configured to magnetically couple to the second magnetic element 182. Furthermore, in this example, the controller 190 can: selectively polarize the first multi-layer inductor 150 responsive to detection of the touch input on the touch sensor surface 172 proximal the first edge of the substrate 102 to oscillate the substrate 102 in the vibration plane relative to the chassis 192 with peak energy perceived proximal this first edge of the substrate 102; and selectively polarize the second inductor responsive to detection of a second touch input on the touch sensor surface 172 proximal the second edge of the substrate 102 to oscillate the substrate 102 in the vibration plane relative to the chassis 192 with peak energy perceived proximal this second edge of the substrate 102.

In a similar implementation, the system 100 can include a first multi-layer inductor 150—as described above—and a second inductor/magnetic element pair that cooperates with the first inductor-magnetic element pair to oscillate the substrate 102. In this variation, the first inductor-magnetic element pair can include a coil mounted to the substrate 102 offset to the right of the center of mass of the substrate 102 by a first distance. The first inductor-magnetic element pair can also include an array of magnets aligned in a row under the multi-layer inductor 150. The array of magnets can cooperate with the multi-layer inductor 150 of the first inductor-magnetic element pair to define an axis of vibration of the first inductor-magnetic element pair. The second inductor-second magnetic element 182 pair can include a coil mounted to the substrate 102 offset to the left of the center of mass of the substrate 102 by a second distance. The second inductor-second magnetic element 182 pair can also include an array of magnets aligned in a row. The array of magnets can cooperate with the multi-layer inductor 150 of the second inductor-second magnetic element 182 pair to define an axis of vibration of the second inductor-second magnetic element 182 pair.

In one implementation, the array of magnets of the first inductor-magnetic element pair can be arranged in a row parallel the array of magnets of the second inductor-second magnetic element 182 pair such that the axis of vibration of the first inductor-magnetic element pair is parallel to the axis of vibration of the second inductor-second magnetic element 182 pair. In this implementation, the multi-layer inductor 150 of the first inductor-magnetic element pair can be mounted to the substrate 102 offset from the center of mass of the substrate 102 by the first distance equal to the second distance between the multi-layer inductor 150 of the second inductor-second magnetic element 182 pair and the center of mass. Therefore, a midpoint between the multi-layer inductor 150 of the first inductor-magnetic element pair and the multi-layer inductor 150 of the second inductor-second magnetic element 182 pair can be coaxial with the center of mass. Therefore, the first inductor-magnetic element pair and second inductor-second magnetic element 182 pair can cooperate to vibrate the substrate 102 along an overall axis of vibration that extends parallel the axis of vibration of the first magnet and the axis of vibration of the second magnet and through the center of mass of the substrate 102.

The controller 190 can drive the first inductor-magnetic element pair to oscillate the substrate 102 at a first frequency and the second inductor-second magnetic element 182 pair to oscillate at a similar frequency in phase with vibration of the first multi-layer inductor 150. Therefore, the first and second multi-layer inductors 150 can cooperate to oscillate the substrate 102 linearly along the overall axis of vibration. However, the controller 190 can additionally or alternatively drive the first multi-layer inductor 150 to oscillate the substrate 102 at the first frequency and the second multi-layer inductor 150 to oscillate at a second frequency distinct from the first frequency and/or out of phase with vibration of the first multi-layer inductor 150. Therefore, the first and second multi-layer inductors 150 can cooperate to rotate the substrate 102—within a plane parallel the touch sensor surface 172—about the center of mass.

Additionally or alternatively, the controller 190 can selectively drive either the first multi-layer inductor 150 or the second multi-layer inductor 150 to oscillate at a particular time. The controller 190 can selectively (and exclusively) drive the first multi-layer inductor 150 to mimic a sensation of a click over a section of the substrate 102 adjacent the first multi-layer inductor 150. The controller 190 can alternatively drive the second multi-layer inductor 150 to mimic a sensation of a click over a section of the substrate 102 adjacent the second multi-layer inductor 150 while minimizing vibration over a section of the substrate 102 adjacent the first multi-layer inductor 150. For example, the controller 190 can selectively drive the first multi-layer inductor 150 to execute the haptic feedback cycle in order to mimic the sensation of a click on the right side of the substrate 102 (or a "right" click) while the second multi-layer inductor 150 remains inactive.

However, the controller 190 can also drive the first multi-layer inductor 150 to oscillate according to a particular vibration waveform. Simultaneously, the controller 190 can drive the second multi-layer inductor 150 to oscillate according to a vibration waveform out of phase (e.g., 180° out of phase) with the particular vibration waveform of the first multi-layer inductor 150. For example, the second multi-layer inductor 150 can output the vibration waveform of an amplitude smaller than the amplitude of the particular vibration waveform. In this example, the vibration waveform of the second multi-layer inductor 150 can also be 180° out of phase with the particular vibration waveform of the first multi-layer inductor 150. Therefore, the second multi-layer inductor 150 can be configured to counteract (or decrease the amplitude of) the particular vibration waveform output by the first multi-layer inductor 150.

11. Separate Inductor

In one variation, a region of the substrate 102 is routed or otherwise removed to form a shallow recess through a subset of layers of the substrate 102. For example, a three-layer-thick region of the substrate 102 near the lateral and longitudinal centers of the substrate 102 can be removed from the bottom face of the substrate 102. A discrete, thin, wire coil can be soldered to a set of vias exposed at a base of the recess and then installed (e.g., bonded, potted) within the recess such that the exposed face of the coil is approximately flush (e.g., within 100 microns) with the bottom face of the substrate 102.

Additionally or alternatively, the system 100 can include: a first integrated inductor fabricated across multiple layers of the substrate 102, as described; and a second coil arranged over and electrically coupled to the first integrated inductor and configured to cooperate with the first integrated inductor to form a larger inductor exhibiting greater magnetic coupling to the adjacent magnetic element. For example, the second coil can include: a multi-loop wire coil; or a second integrated inductor fabricated across multiple layers of a second substrate 102 that is then bonded and/or soldered to the (first) substrate 102 adjacent the first integrated inductor.

12. Waterproofing

Figure 9A:
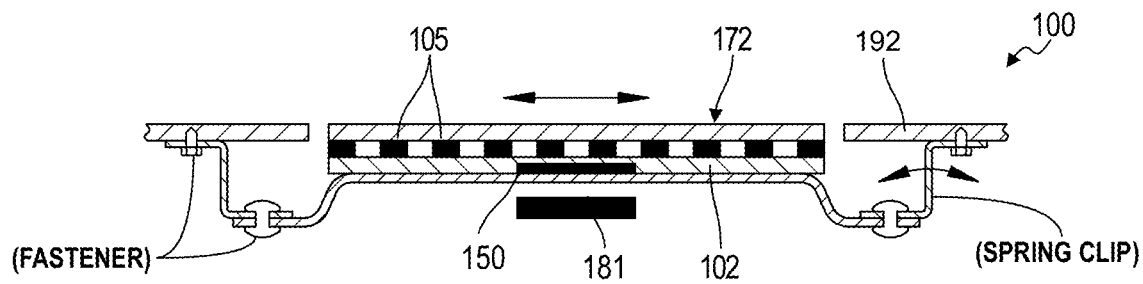
FIGS. 9A-9D are schematic representations of one variation of the system.
Figure 9B:
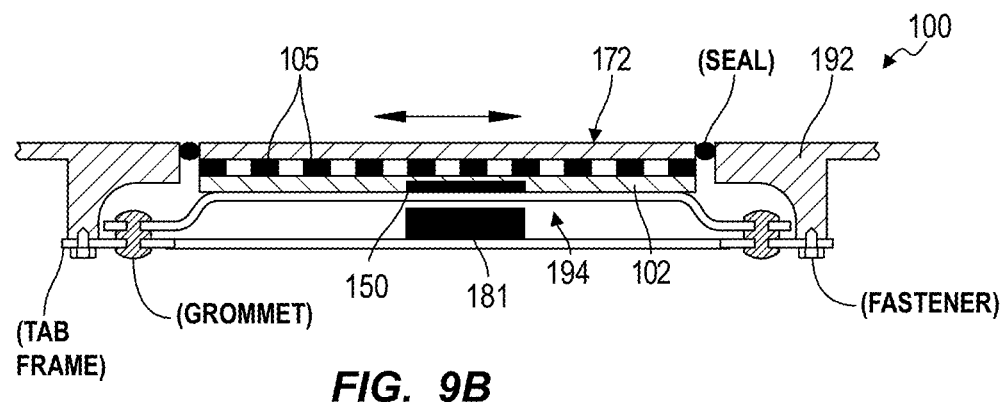
Figure 9C:
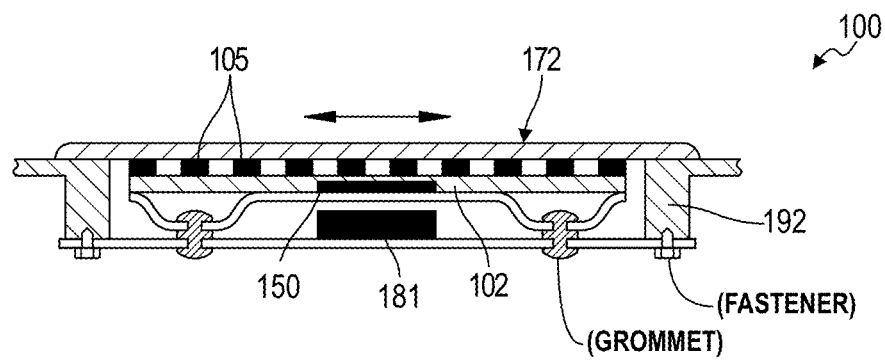
Figure 9D:
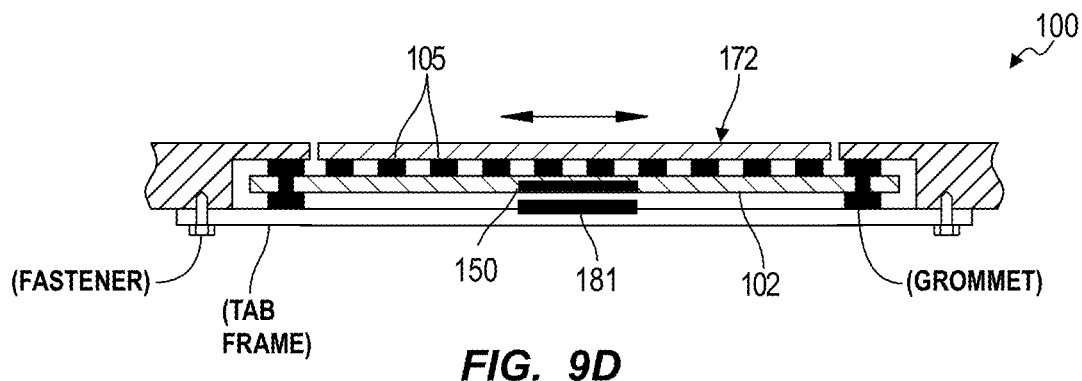

In one variation shown in FIGS. 9A and 9B, a waterproofing membrane 164: is applied over the touch sensor; extends outwardly from the perimeter of the substrate 102; is bonded, clamped, or otherwise retained near a perimeter of the receptacle 194; and thus cooperates with the chassis 192 to seal the touch sensor, the substrate 102, and the deflection spacers 160, etc. within the receptacle 194, thereby preventing moisture and particulate ingress into the receptacle 194 and onto the substrate 102.

For example, the waterproofing membrane 164 can include a silicone or PTFE (e.g., expanded PTFE) film bonded over the touch sensor with an adhesive. The system 100 can also include a glass or other cover layer 170 bonded over the waterproofing membrane 164 and extending up to a perimeter of the substrate 102.

Furthermore, the chassis 192 can define a flange (or "shelf," undercut) extending inwardly toward the lateral and longitudinal center of the receptacle 194. The outer section of the waterproofing member that extends beyond the substrate 102 can be inserted into the receptacle 194 and brought into contact with the underside of the flange. A circumferential retaining bracket or a secondary chassis 192 member can then be fastened to the chassis 192 under the flange and (fully) above the perimeter of the receptacle 194 in order to clamp the waterproofing membrane 164 between the chassis 192 and the circumferential retaining bracket or secondary chassis 192 member, thereby sealing the waterproofing membrane 164 about the receptacle 194.

In one implementation, the waterproofing membrane 164 includes a convolution between the perimeters of the substrate 102 and the receptacle 194. In this implementation, the convolution can be configured to deflect or deform in order to accommodate oscillation of the substrate 102 during a haptic feedback cycle. For example, the waterproofing membrane 164 can include a polyimide film with a semi-circular ridge extending along a gap between the outer perimeter of the substrate 102 and the inner perimeter of the receptacle 194.

In a similar implementation, the substrate 102 and the touch sensor are arranged over the waterproofing membrane 164, which is sealed against the chassis 192 along an underside of the receptacle 194 by a retaining bracket, as described above such that the touch sensor assembly is located fully above a waterproof barrier across the receptacle 194 and such that waterproof membrane oscillates to vibrate the touch sensor assembly when the multi-layer inductor 150 is actuated.

13. Printed Capacitance, Force, and Haptics Assembly

Generally, in one variation of the system 100, the substrate 102 includes the set of touch layers 152 formed of printed PET layers (e.g., a double-sided print on a single PET layer); and the set of inductor layers 109 formed of PCB layers (e.g., a four-layer PCBA) recessed within a cavity defined by a bottom layer in the set of touch layers 152. In this implementation, each of the touch sensor and the force sensor of the system 100 is integrated into flexible printed layers supported by a rigid cover layer 170 arranged over the flexible printed layer in order to reduce weight and size of the substrate 102 when implemented into the chassis 192 of a human-computer interface device.

13.1 Unitary Printed Touch Sensor and Force Sensor

Figure 23:
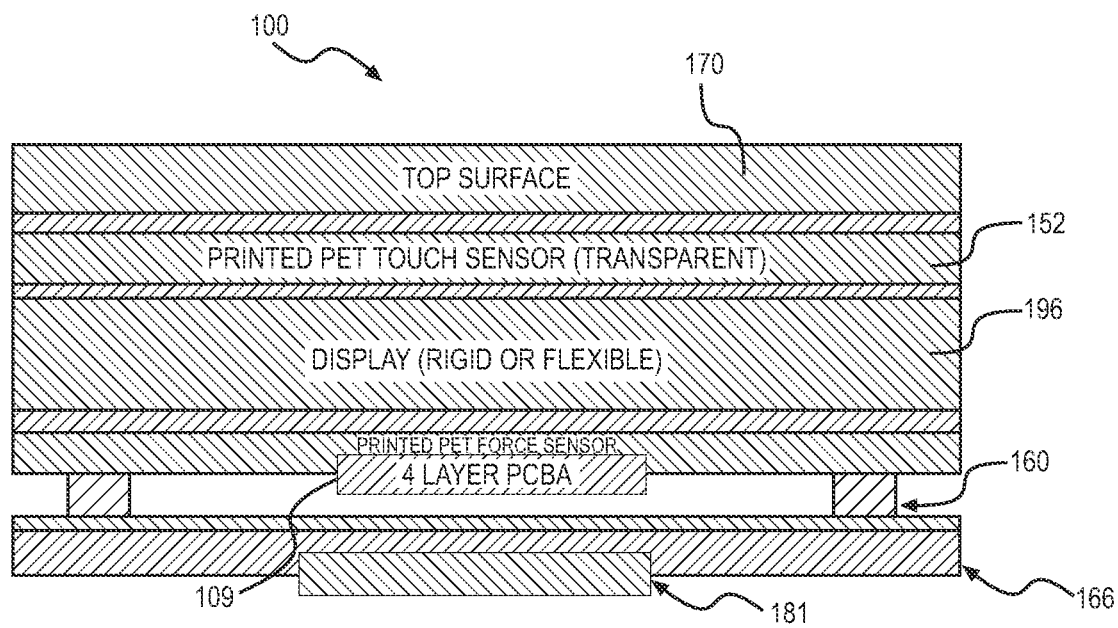
FIG. 23 is a schematic representation of one variation of the system.
Figure 24A:
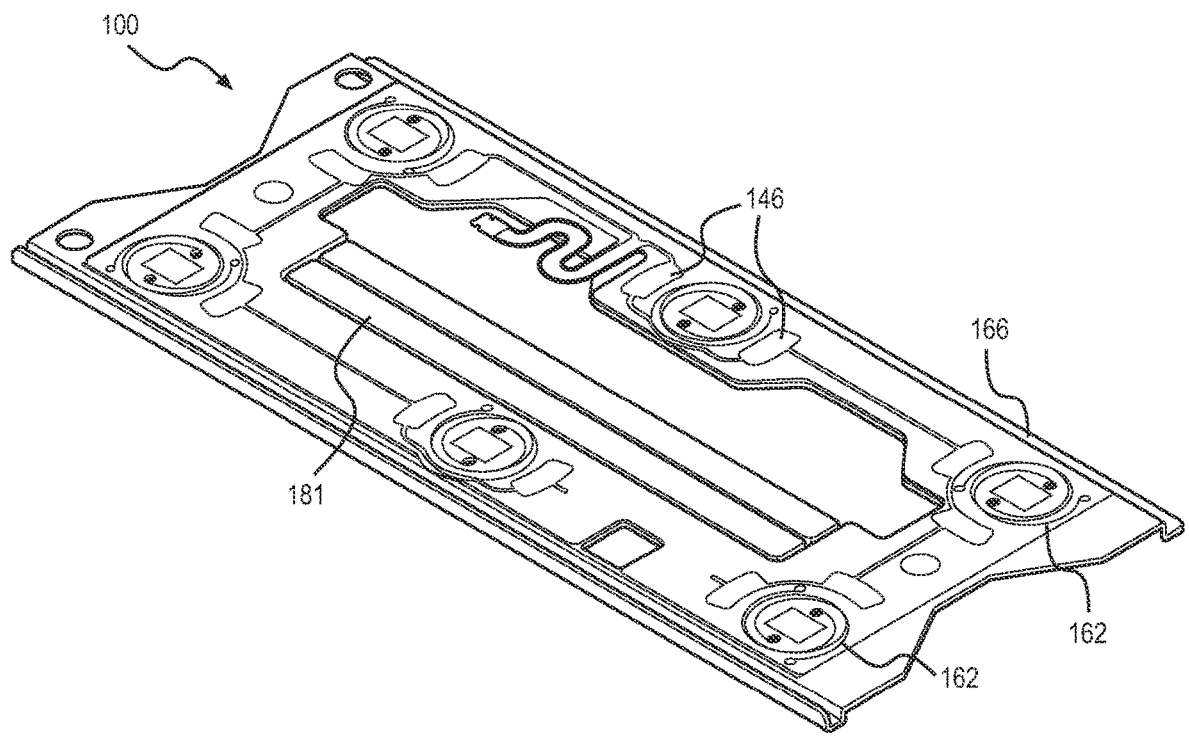
FIGS. 24A and 24B are schematic representations of one variation of the system.
Figure 24B:
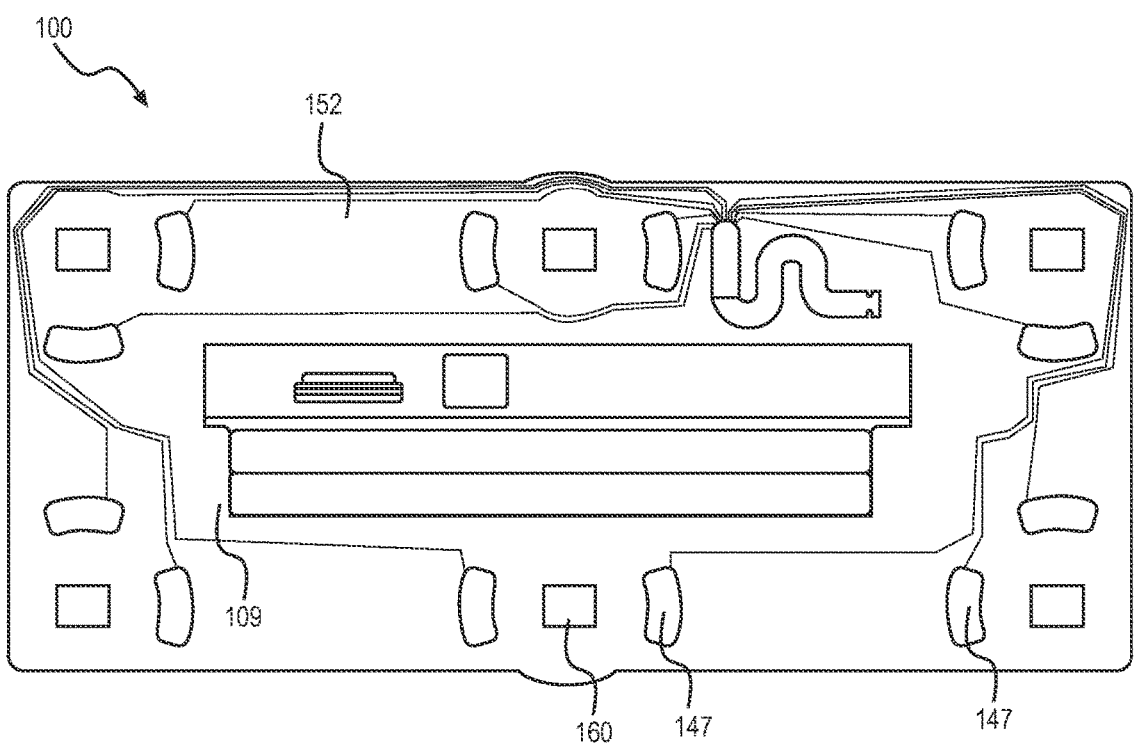

In one implementation as shown in FIGS. 22 and 23 the system 100 can include a set of touch layers 152 including: a first printed layer (e.g., a first double sided print arranged on a first PET layer) including the array of drive and sense electrode pairs 105 forming the touch sensor; a second printed layer (e.g., a second double sided print arranged on a second PET layer) including the first set of sensor traces—in alignment with a second set of sensor traces arranged on the baseplate—forming the force sensor; and an adhesive layer arranged between the first printed layer and the second printed layer in order to form a unitary set of layers defining the touch sensor and the force sensor of the system 100. In this implementation, the system 100 can further include a set of deflection spacers: arranged below the set of touch layers 152; and coupled to a set of support locations defined along a bottom side of the second printed layer.

For example, the array of drive and sense electrode pairs 105 can include: a first set of vertical drive lines printed (e.g., screen printed, aerosol jet printed, evaporation printed) on a first side of the first printed layer; and a second set of horizontal sense lines printed (e.g., screen printed, aerosol jet printed, evaporation printed) on a second side, opposite the first side, of the first printed layer, thereby defining the touch sensor of the system 100. Furthermore, in this example, the first set of sensor traces (e.g., a sparse array of sensor electrodes) can be printed (e.g., screen printed, aerosol jet printed, evaporation printed) encircling the set of support locations on a bottom side of the second printed layer. The adhesive layer is arranged between the first printed layer and the second printed layer, thereby forming a unitary set of flexible touch layers that can be integrated along non-planar geometries (e.g., concave, convex) of a chassis 192.

In the foregoing example, the second printed layer can also include a grounding print arranged on a top side, opposite the bottom side, and facing the first flexible PET layer configured to shield electrical noise from the first flexible PET layer. Additionally, the second printed layer can define a cavity inset from the bottom side of the second printed layer and configured to cooperate with the set of inductor layers 109 in order to receive the set of inductor layers 109 within the cavity of the second printed layer. The system 100 includes the set of inductor layers 109 nested within the cavity of the second printed layer in order to: reduce the air gap between the first set of sensor traces arranged on the bottom side of the second printed layer and the second set of sensor traces arranged across a top side of the baseplate; and thereby enabling capacitive coupling between the first set of sensor traces and the second set of sensor traces to form the array of force sensors.

Additionally, in this implementation, the set of inductor layers 109 can include an even quantity of spiral traces fabricated within an even quantity of layers (e.g., four layers, two layers) within the set of inductor layers 109 to form a single-coil inductor nested within the cavity defined by the second printed layer.

For example, the cavity defined on the bottom side of the second printed layer can define a cavity of a first rectangular geometry inset from the bottom side of the second printed layer. The set of inductor layers 109 can then define a second rectangular geometry cooperating with the first rectangular geometry of the cavity to receive the set of inductor layers 109. Additionally, a bottom layer in the set of inductor layers 109 can include surface mounted components (e.g., connectors) to couple the set of inductor layers 109 to the controller 190. Therefore, in this example, the set of inductor layers 109 span an area underneath the set of touch layers 152 that is less than an area of the set of touch layers 152 while achieving a target height (2.5 mm-3.2 mm) for the substrate 102.

In this implementation, the cover layer 170 is arranged over the first side of the first printed layer to define the touch sensor surface 172 and configured to rigidly support the set of touch layers 152 within a chassis 192. For example, the cover layer 170 can include a glass layer bonded (e.g., adhesively bonded) to the first side of the first printed layer and spanning an area substantially equal to the area of the set of touch layers 152, thereby rigidly supporting the printed layers in the set of touch layers 152. As a result, the set of inductor layers 109 arranged below the set of touch layers 152 can be formed of rigid PCBA layers and/or flexible PCBA layers due to the rigidity of the cover layer 170. In one example of this implementation, the set of touch layers 152: are formed of a flexible material; and includes the set of electrodes 146 printed across the first set of touch layers 152 to define an array of drive and sense electrode pairs 105 for the touch sensor. In this example, a cover layer 170 is: bonded to a top layer 104 in the set of touch layers 152; arranged over the array of drive and sense electrode pairs 105 to define a touch sensor surface 172; and arranged opposite the set of inductor layers 109 to locate the set of touch layers 152 interposed between the cover layer 170 and the set of inductor layers 109. Thus, the cover layer 170 can rigidly support the set of touch layers 152 across the touch sensor surface 172 with minimal bend and/or deflection of the set of touch layers 152 responsive to touch inputs applied on the touch sensor surface 172.

Therefore, the system 100 can implement the touch sensor and the force sensor of the system 100 into a double-layered flexible structure, thereby reducing height and weight of the system 100 while maintaining the necessary rigidity to flexibly support the set of touch layers 152 for a range of geometries (e.g., planar geometries, non-planar geometries) of the chassis 192 of the system 100.

13.2 Display Integration

In one implementation as shown in FIG. 23, the system 100 can include a display element 196 (e.g., a flexible OLED display) arranged between the first printed layer and the second printed layer in order to integrate the substrate 102 and the display element 196 in a non-planar configuration (e.g., convex display edges on a mobile device).

For example, the system 100 can include a set of touch layers 152 including: a first printed layer (e.g., a double-sided print on a PET layer) formed of a transparent material defining a top side and a bottom side including an array of drive and sense electrode pairs 105; and a second printed layer defining a top side and a bottom side, the bottom side of the second printed layer including a first set of sensor traces. In this example, the display element 196 (e.g., flexible OLED display): is arranged between the first printed layer and the second printed layer; defines a top side and a bottom side; and spans an area substantially equal an area of the first printed layer and the second printed layer, thereby sandwiching the display element 196 between the first printed layer and the second printed layer. Furthermore, the top side of the display element 196 is bonded (e.g., adhesively bonded) to the bottom side of the first printed layer and the bottom side of the display element 196 is bonded (e.g., adhesively bonded) to the top side of the second printed layer.

In the foregoing example, the system 100 can include a cover layer 170 (e.g., glass layer, plastic layer) arranged (e.g., adhesively bonded) over the first printed layer in the set of touch layers 152. The cover layer 170 defines a touch sensor surface 172 rigidly supporting the printed layers and the display element 196 to integrate the printed layers and the display element 196 within a chassis 192.

Therefore, the system 100 can detect touch inputs and force magnitudes along non-planer (e.g., concave, convex) touch sensor surface 172s with an integrated display element 196 and trigger haptic feedback cycles in response to detecting touch inputs along these non-planar touch sensor surface 172s.

In another example of this implementation, the system 100 includes the set of touch layers 152 arranged about opposing surfaces of the display element 196. In this example, the system 100 includes the display element 196: spanning an area substantially congruent to a target area of the set of touch layers 152; and defines a top surface and a bottom surface opposite the bottom surface. Furthermore, the set of touch layers 152 are formed of a flexible material and includes a first subset of touch layers 152: bonded to the top surface of the display element 196; and including an array of drive and sense electrode pairs 105 printed across the first subset of touch layers 152. Thus, the system 100 can: serially scan the array of drive and sense electrode pairs 105 to generate a touch image; and detect touch inputs at particular locations over the top surface of the display element 196 based on the touch image, as described above.

In the aforementioned example, the second subset of touch layers 152: are bonded to the bottom surface, opposite the top surface, of the display element 196; and includes the set of electrodes 146 printed across the second subset of touch layers 152. Thus, the system 100 can then: serially scan the set of electrodes 146 to generate a force image representing variations in force magnitudes applied over the display element 196; and interpret a particular force magnitude for an input applied over the display element 196 based on the force image. Additionally, the system 100 can include a cover layer 170 (e.g., transparent cover layer 170 arranged over the array of drive and sense electrode pairs 105 across the first subset of touch layers 152 to define a touch sensor surface 172.

14. Multi-PCB Assembly

Generally, the substrate 102 can define a multi-layered PCBA (e.g., flexible or rigid 6-layer PCBA) including a set of touch layers 152 spanning a target area and a set of inductor layers 109 arranged below (e.g., bonded to or embedded within) the set of touch layers 152 and spanning an area less than the target area in order to reduce weight of the substrate 102 when integrated into the chassis 192 of a computing device. In particular, the set of touch layers 152 can include an even quantity of layers (e.g., 2, 4) forming a touch sensor and a force sensor. Additionally, the set of inductor layers 109 can also include an even quantity of layers (e.g., 2, 4, 6) forming a multi-layer inductor arranged below the set of touch layers 152.

14.1 4 Touch Layers+Two Inductor Layers

In one implementation as shown in FIGS. 25A, 25B, 25C, and 25D the system 100 includes: a set of touch layers 152 of a first quantity of layers (e.g., four layers); and a set of inductor layers 109 of a second set of quantity of layers (e.g., two layers, four layers) less than the first quantity of layers or equal to the second set of quantity of layers.

For example, the system 100 can include the set of touch layers 152 including: a first subset of touch layers 152 (e.g., flexible or rigid two-layer PCBA) including an array of drive and sense electrode pairs 105 forming a touch sensor; and a second subset of touch layers 152 (e.g., flexible or rigid two-layer PCBA) arranged below the first subset of touch layers 152. In this example, the second subset of touch layers 152 can include: a first touch layer 154 including a first spiral trace 111 coiled in a first direction; and a second touch layer 156 arranged below the first touch layer 154 including a second spiral trace 122 coiled in a second direction opposite the first direction, and coupled to the first spiral trace 111 by a via between the first touch layer 154 and the second touch layer 156. Furthermore, the first touch layer 154 and the second touch layer 156 of the second subset of touch layers 152 can include a set of sensor traces (e.g., sense electrodes, drive electrodes, interdigitated drive and sense electrodes) encircling a set of support locations defined on a bottom side of the second touch layer 156 in the second subset of touch layers 152.

In the foregoing example, the set of inductor layers 109: is arranged below the second subset of touch layers 152; spans an area less than an area of the second subset of touch layers 152; and is located in alignment with the first spiral trace in and the second spiral trace 122 within the second subset of touch layers 152. The set of inductor layers 109 includes: a first inductor layer 110 including a third spiral trace 133—in alignment with the second spiral trace 122 of the second touch layer 156—coiled in the first direction, and coupled to the second spiral trace 122 by a via between the first inductor layer 110 and the second touch layer 156; and a second inductor layer 120 arranged below the first inductor layer 110 and including a fourth spiral trace coiled in the opposite direction, and coupled to the third spiral trace 133 by a via between the first inductor layer no and the second inductor layer 120 to form a multi-layer inductor 150.

The set of touch layers 152 can then be bonded (e.g., adhesively bonded) to form a unitary substrate 102 including a touch sensor, a force sensor, and a multi-layer inductor 150. Furthermore, a bottom side of the second inductor layer 120 can include surface mount components (e.g., connectors) to electrically couple the set of touch layers 152 to the set of inductor layers 109. In one variation, the substrate 102 can include a separate electrical connection (e.g., a ribbon cable) to connect the set of touch layers 152 and the set of inductor layers 109.

Therefore, the system 100 can integrate the substrate 102 of non-uniform layers into the chassis 192 of a computing device while reducing weight and volume of the substrate 102 within the chassis 192.

In one example of this implementation, the system 100 includes a set of touch layers including: a first subset of touch layers 152 (e.g., two touch layers) defining a touch sensor; a cover layer 170 arranged over the first subset of touch layers 152 defining a touch sensor surface 172; and a second subset of touch layers 152 (e.g., two touch layers) arranged below the first subset of touch layers 152 defining a force sensor. In this example, the first subset of touch layers 152 includes an array of drive and sense electrode pairs 105 arranged (e.g., printed) across the first subset of touch layers 152 (e.g., flexible layers).

Furthermore, the second subset of touch layers 152 is arranged below the first subset of touch layers 152 and includes the first set of electrodes 146 (e.g., sense electrodes): arranged proximal a set of support locations at a bottom layer in the subset of layers; and configured to electrically couple a set of coupling regions (e.g., drive electrodes, coupling plate) arranged opposite the first set of electrodes 146. Thus, the system 100 can then: read a first set of electrical values from the array of drive and sense electrode pairs 105; and detect a first touch input at a first location on the touch sensor surface 172 based on the first set of electrical values. Additionally, the system 100 can: read a second set of electrical values from the set of electrodes 146 on the bottom layer; and interpret a first force magnitude of the first touch input based on deviations of the second set of electrical values from a baseline set of electrical values representing a nominal force magnitude.

In the aforementioned example, the second subset of touch layers 152 cooperates with the set of inductor layers 109 (e.g., two inductor layers) to form the multi-layer inductor 150. In particular, the second subset of touch layers 152 can include: an intermediate touch layer including an intermediate spiral trace coiled in a first direction across the intermediate touch layer; and a bottom layer including a bottom spiral trace. The bottom spiral trace: is coiled in a second direction, opposite the first direction; is coupled to the third spiral trace 133; and cooperates with the intermediate spiral trace and the set of spiral traces across the set of inductor layers 109 to form the multi-layer inductor 150. Thus, the system 100 can then, in response to the first force magnitude exceeding a target force magnitude, drive an oscillating voltage across a first set of spiral traces across the second subset of touch layers 152 and a second set of spiral traces across the set of inductor layers 109 to induce alternating magnetic coupling between the multi-layer inductor 150 and the first magnetic element 181 resulting in oscillation of the touch sensor surface 172.

14.2 Two Touch Layers+Four Inductor Layers

Figure 26C:
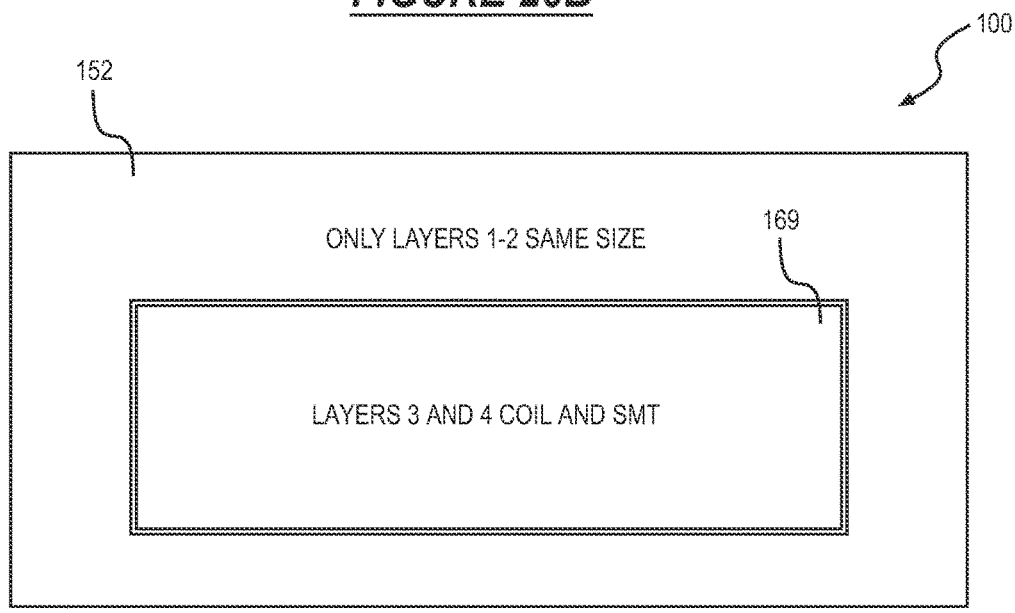

In one implementation as shown in FIGS. 26A, 26B, and 26C the system 100 includes: a set of touch layers 152 of a first quantity of layers (e.g., two layers); and a set of inductor layers 109 of a second set of quantity of layers (e.g., four layers) greater than the first quantity of layers.

For example, the system 100 can include a set of touch layers 152 including a first subset of touch layers 152 (e.g., flexible or rigid 2-layer PCBA) including an array of drive and sense electrodes pairs forming a touch sensor. Additionally, the set of touch layers 152 can include a printed touch layer arranged below the first subset of touch layers 152 and including a set of sensor traces (e.g., sense electrodes, drive electrodes, interdigitated drive and sense electrodes) encircling a set of support locations defined on a bottom layer in the set of touch layers 152. In this example, the set of sensor traces on the printed touch layer can be printed directly on a bottom side of the first subset of touch layers 152 and/or printed on a PET layer and bonded to the bottom side of the first subset of touch layers 152.

In the foregoing implementation, the set of inductor layers 109 (e.g., flexible or rigid 4-layer PCBA): is arranged below the printed touch layer in the set of touch layers 152; spans an area less than an area of the set of touch layers 152; and includes a set of spiral traces forming a discrete multi-layer inductor 150 coupled (e.g., bonded via SMT solder electrical connections, adhesively bonded and connected via a ribbon cable) to the set of touch layers 152.

For example, the set of inductor layers 109 can include: a first inductor layer 110 including a first spiral trace 111 coiled in a first direction; and a second inductor layer 120 arranged below the first inductor layer 110 including a second spiral trace 122 coiled in a second direction opposite the first direction, and coupled to the first spiral trace 111 by a via between the first inductor layer 110 and the second inductor layer 120. Furthermore, the set of inductor layers 109 can includes: a third inductor layer 130 including a third spiral trace 133 coiled in the first direction, and coupled to the second spiral trace 122 by a via between the second inductor layer 120 and the third touch layer; and a fourth spiral trace 144 arranged below the third inductor layer 130 and including a fourth spiral trace coiled in the opposite direction, and coupled to the third spiral trace 133 by a via between the third inductor layer 130 and the fourth spiral trace 144 to form the discrete multi-layer inductor 150.

Therefore, the system 100 can integrate a unitary substrate 102 forming a touch sensor, a force sensor, and a multi-layer inductor 150 within layers of varying dimensions and weight to accommodate a chassis 192 of a computing device.

In another implementation, the system 100 includes: a set of touch layers 152 of a first quantity of layers (e.g., two layers); a first set of inductor layers 109; and a second set of inductor layers 109. In this implementation, the first set of inductor layers 109: is arranged below the set of touch layers 152; spans a first portion of a bottom side of the set of inductor layers 109; and forms a first multi-layer inductor 150. Additionally, the second set of inductor layers 109: is arranged below the set of touch layers 152 adjacent the first set of inductor layers 109; spans a second portion of a bottom side of the set of inductor layers 109; and forms a second multi-layer inductor 150.

Therefore, the system 100 can integrate a target set of discrete multi-layer inductors 150 (e.g., two multi-layer inductors 150 in the substrate 102 in order to trigger the controller 190 to selectively couple a set of magnetic element 181s arranged within the baseplate of a chassis 192 of a computing device thereby oscillating the touch sensor surface 172.

In another example of this implementation, the system 100 includes the set of touch layers 152 (e.g., two touch layers) that form a touch sensor and a force sensor over the set of inductor layers 109. In particular, the set of touch layers 152 can include: a first touch layer 154 including an array of drive and sense electrode pairs 105; and a second touch layer 156 (e.g., bottom layer) opposite the first touch layer 154. The second touch layer 156: is arranged below the first touch layer 154; defines a set of support locations about a periphery of the second touch layer 156; and includes the set of electrodes 146 arranged proximal the set of support locations on the second touch layer 156. Thus, the system 100 can then: detect the first touch input based on a first set of electrical values output from the array of drive and sense electrode pairs 105 on the first touch layer 154; and interpret the first force magnitude based on the second set of electrical values output from the first set of electrodes 146 on the second touch layer 156.

In this example, the system 100 includes the multi-layer inductor 150 contained within the set of inductor layers 109 independent from the set of touch layers 152. In particular, the set of inductor layers 109 can include a first inductor layer 110 including a first spiral trace 111 coiled in a first direction across the first inductor layer 110. Additionally, the set of inductor layers 109 can include a second inductor layer 120 arranged below the first inductor layer 110 and including a second spiral trace 122: coiled in a second direction opposite the first direction across the second inductor layer 120; and coupled to the first spiral trace 111. Furthermore, the set of inductor layers 109 also includes a third inductor layer 130 arranged below the second inductor layer 120 and including a third spiral trace 133: coiled in the first direction across the third inductor layer 130; and coupled to the second spiral trace 122. The set of inductor layers 109 also includes a fourth spiral trace 144 arranged below the third inductor layer 130 including a fourth spiral trace: coiled in the second direction opposite the first direction across the fourth spiral trace 144; coupled to the third spiral trace 133; and cooperating with the third spiral trace 133, second spiral trace 122, and first spiral trace 111 to form the multi-layer inductor 150 facing the magnetic element 181.

Therefore, the system 100 can include a multi-layer inductor 150 formed in a set of inductor layers 109 independent from a touch sensor and a force sensor in a set of touch layers 152. Thus, the system 100 can include intermediate layers (e.g., display elements 196, stiffener layers 158) interposed between the set of touch layers 152 and the set of inductor layers 109 to rigidly support the touch sensor surface 172 of the touch sensor.

14.3 Two Touch Layers+Two Inductor Layers

In one implementation as shown in FIGS. 27A and 27B, the system 100 includes: a set of touch layers 152 of a first quantity of layers (e.g., two layers); and a set of inductor layers 109 of a second set of quantity of layers (e.g., two layers) equal to the first quantity of layers.

For example, the system 100 can include a set of touch layers 152 including: a first touch layer 154 (e.g., flexible or rigid PCBA layer); and a second touch layer 156 (e.g., flexible or rigid PCBA layer) arranged below the first touch layer 154. The first touch layer 154 can include: a set of drive electrodes (e.g., drive lines) etched to a top side of the first touch layer 154; and a set of sense electrodes (e.g., sense lines) printed over the top side of the first touch layer 154 to define an array of drive and sense electrode pairs 105 forming a touch sensor. In this example, the set of sense electrodes can be printed directly over the top side of the first touch layer 154 or can alternatively be arranged on a PET layer adhesively bonded over the top side of the first touch layer 154 to define the array of drive and sense electrode pairs 105. Furthermore, the second touch layer 156 arranged below the first touch layer 154 can: include a first spiral trace 111 coiled in a first direction; include a set of sensor traces arranged (e.g., etched) about a bottom side of the second touch layer 156; and define a cavity configured to receive the set of inductor layers 109.

In the foregoing example, the set of inductor layers 109 is nested within the cavity of the second touch layer 156 and includes a first inductor layer 110 and a second inductor layer 120. The first inductor layer no includes a second spiral trace 122—in alignment with the first spiral trace 111 in the second touch layer 156—coiled in a second direction opposite the first direction, and coupled to the first spiral trace 111 by a via between the second touch layer 156 and the first inductor layer no. Additionally, the second inductor layer 120 includes a third spiral trace 133 coiled in the first direction, and coupled to the second spiral trace 122 by a via between the first inductor layer 110 and the second touch layer 156 to form a single core and odd quantity multi-layer inductor 150 coil.

Therefore, the system 100 can include a set of touch layers 152 arranged over a set of inductor layers 109 that cooperate to form a single substrate 102 assembly characterized by a reduced height and a reduced weight (per unit sensible area) in order to fit within a height constrained chassis 192 of a computing device.

In another example of this implementation, the system 100 can include a set of touch layers 152 (e.g., two touch layers) defining a touch sensor and a force sensor; and a set of inductor layers 109 (e.g., two inductor layers) defining a multi-layer inductor 150 independent from the set of touch layers 152. In this example, the set of touch layers 152 can include: a first touch layer 154 (e.g., rigid or flexible layer) including a set of sense electrodes arranged across the first touch layer 154. Additionally, the set of touch layers 152 can include a second touch layer 156: arranged below the first touch layer 154; and including a set of drive electrodes arranged across the second touch layer 156 and cooperating with the set of sense electrodes to form an array of drive and sense electrode pairs 105. In this example, the first touch layer 154 and the second touch layer 156 can be formed of a flexible material and rigidly supported by a cover layer 170 arranged over the first touch layer 154 defining a touch sensor surface 172. Thus, the system 100 can then: read a set of electrical values from the array of drive and sense electrode pairs 105; and detect the first touch input at the first location on the touch sensor surface 172 based on the set of electrical values.

Furthermore, the set of touch layers 152 can include a set of electrodes 146 (e.g., sense electrodes): arranged proximal a set of support locations across a bottom surface of a bottom layer (e.g., the second layer) in the set of touch layers 152; and configured to electrically couple a second set of drive electrodes (e.g., drive electrodes) arranged opposite the first set of electrodes 146 to form an array of capacitive force sensors. Thus, the system 100 can then: read a second set of electrical values from the first set of electrodes 146 across the bottom layer representing variations in force magnitudes responsive to application of a touch input over the set of touch layers 152; and interpret the first force magnitude of the first touch input based on deviations of the first set of electrical values from a baseline set of electrical values.

In the aforementioned example, the set of inductor layers 109 includes a first inductor layer 110: arranged below a bottom layer in the set of touch layers 152; and including a first spiral trace 111 coiled in a first direction across the first layer. The set of inductor layers 109 also includes a second inductor layer 120: arranged below the first inductor layer 110; including a second spiral trace 122 coiled in a second direction, opposite the first direction, across the second layer; and cooperating with the first inductor layer 110 to define the first multi-layer inductor 150. Thus, the system 100 can then, in response to the first force magnitude exceeding a target force magnitude, drive an oscillating voltage across the first spiral trace in and the second spiral trace 122 to induce alternating magnetic coupling between the first multi-layer inductor 150 and the first magnetic element 181.

Therefore, the system 100 can achieve target oscillations of the touch sensor surface 172 over the set of touch layers 152 with a target minimum quantity of touch layers and inductor layers (e.g., two touch layers, two inductor layers).

14.4 Four Touch Layers+Four Inductor Layers

In one implementation, as shown in FIGS. 28A, 28B, 28C, and 28D, the computer system 100 includes: a set of touch layers 152 of a first quantity of layers (e.g., two layers); and a set of inductor layers 109 of a second quantity of layers (e.g., four layers) arranged below the first quantity of layers.

As described above, the set of touch layers 152 form a touch sensor and a force sensor. For example, the set of touch layers includes: a first set of layers (e.g., 2 layers) including an array of drive and sense electrode pairs that define the touch sensor below the touch sensor surface; and a second set of layers (e.g., two layers) including a first set of electrodes (e.g., sense electrodes) that form the force sensor—in cooperation with the second set of electrodes (e.g., drive electrodes) below the touch sensor surface.

Furthermore, the set of inductor layers 109 are arranged below (e.g., bonded to and/or embedded within) the set of touch layers 152 to form the multi-layer inductor. In this example, the set of inductor layers can include an even quantity (e.g., 2, 4, 6) of layers containing a set of spiral traces that form the multi-layer inductor below the set of touch layers 152.

Therefore, the system can include a set of touch layers (e.g., 4 layers) and a set of inductor layers (e.g., 4 layers) coupled (e.g., bonded) together to form a unitary substrate that defines: a touch sensor; a force sensor; and a multi-layer inductor configured to magnetically couple an adjacent magnetic element.

14.5 Shield Layer+Odd Inductor Layers

In one implementation, the system includes an intermediate layer: interposed between the set of touch layers 152 and the set of inductor layers 109 (e.g., odd quantity of inductor layers); and configured to shield the array of drive and sense electrode pairs from electrical noise generated by the multi-layer inductor 150.

In one example, the set of touch layers 152 includes: an intermediate layer 106 containing the array of drive and sense electrode pairs 105; and a bottom layer including a first spiral trace arranged below the intermediate layer. In this example, the set of inductor layers 109 (e.g., three inductor layers) include: a first inductor layer no including a second spiral trace; a second inductor layer 120 including a third spiral trace; a third inductor layer 130 including a fourth spiral trace; and a fourth (e.g., a bottom) layer including a fifth spiral trace. In this example, the first inductor layer no includes a ground electrode (e.g., a continuous trace): spanning the footprint of the array of drive and sense electrode pairs 105 in the top and intermediate layers 104, 106; driven to a reference potential by the controller 190; and configured to shield the drive and sense electrode pairs 105 from electrical noise generated by the multi-layer inductor 150.

Therefore, the system 100 can include a shield between the set of touch layers 152 and the set of inductor layers 109 to: form a multi-layer inductor defining an odd number of spiral traces; and shield the touch sensor from electrical noise generated by the multi-layer inductor.

15. Inductive Sensing

In one variation, the system 100 includes: a substrate 102, a first magnetic element 181, and a controller 190. The substrate 102 includes a set of touch layers 152 and a set of inductor layers 109 arranged below the set of touch layers

152. The set of touch layers 152 spans a first area and includes: a first touch layer 154 including an array of drive and sense electrode pairs 105; a second touch layer 156 arranged below the first touch layer 154 and including a first set of sensor traces; and a cover layer 170 arranged over the first touch layer 154 defining a touch sensor surface 172. The set of inductor layers 109 spans a second area less than the first area and includes: a first inductor layer 110 including a first spiral trace 111 coiled in a first direction; and a second inductor layer 120 arranged below the first inductor layer 110 and including a second spiral trace 122 coiled in a second direction opposite the first direction, coupled to the first spiral trace 111 by a via between the first inductor layer 110 and the second inductor layer 120, and cooperating with the first spiral trace 111 to form a multi-layer inductor 150. The first magnetic element 181: is arranged below the substrate 102; defines a first polarity facing the multi-layer inductor 150; and is configured to inductively couple the multi-layer inductor 150.

In this variation, the controller 190 is configured to drive an oscillating voltage across the multi-layer inductor 150 during a first haptic feedback cycle to induce alternating magnetic coupling between the multi-layer inductor 150 and the first magnetic element 181 in order to oscillate the touch sensor surface 172 in response to detecting a first change in electrical value at the multi-layer inductor 150. Therefore, the system 100 can: serially scan the multi-layer inductor 150 for electrical values; interpret a magnitude of force for a touch input applied over the touch sensor surface 172; and oscillate the touch sensor surface 172 responsive to the magnitude of the touch input exceeding a threshold force magnitude.

16. Printed Touch+Flexible Touch Surface

Generally, as shown in FIGS. 29, 30, 31, 32, and 33 the system 100 can include: a touch layer; a cover layer 170 arranged above the touch layer; a stiffener layer 158 arranged below the touch layer; and a substrate 102 coupled (e.g., bonded, embedded within) to the stiffener layer 158. In particular, the system 100 can include: the touch layer including a set of printed drive and sense electrode pairs 105; the cover layer 170 formed of a flexible material (e.g., mylar, plastic) and bonded (e.g., PSA) to the touch layer; the stiffener layer 158 formed of a rigid material (e.g., polycarbonate, metal, FR4) and spanning an area of the touch layer; and the substrate 102 including a set of inductor layers 109 configured to form a multi-layer inductor 150. Thus, the system 100 includes the stiffener layer 158 configured to: rigidly support the cover layer 170 and the touch layer arranged over the stiffener layer 158; conform the cover layer 170 and the touch layer to a target shape (e.g., complex geometries); and increase touch sensitivity for touch inputs applied over the cover layer 170.

16.1 Stiffener Layer+Bonded PCBA

Figure 30:
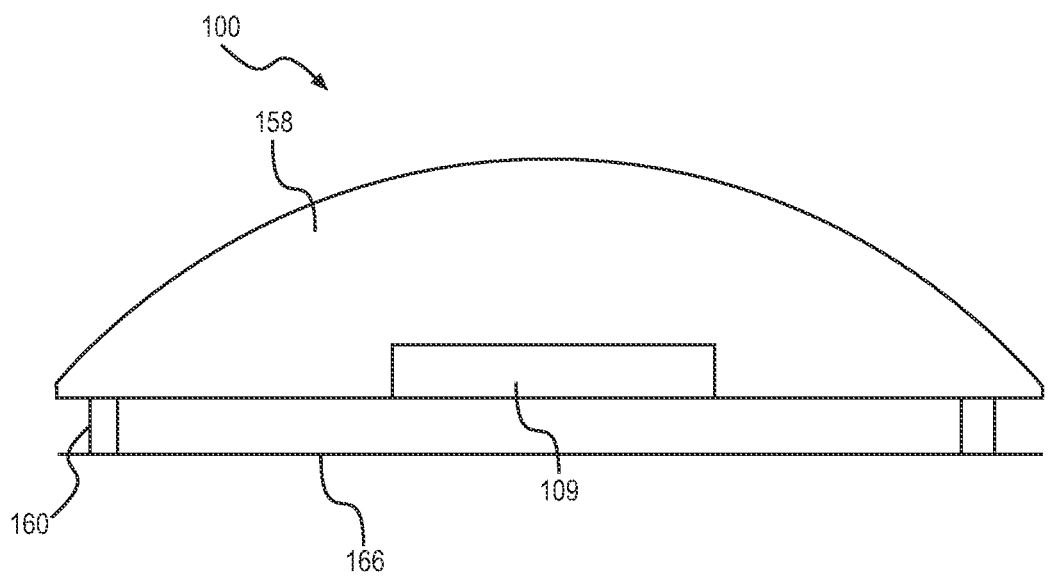
FIG. 30 is a schematic representation of one variation of the system.
Figure 33:
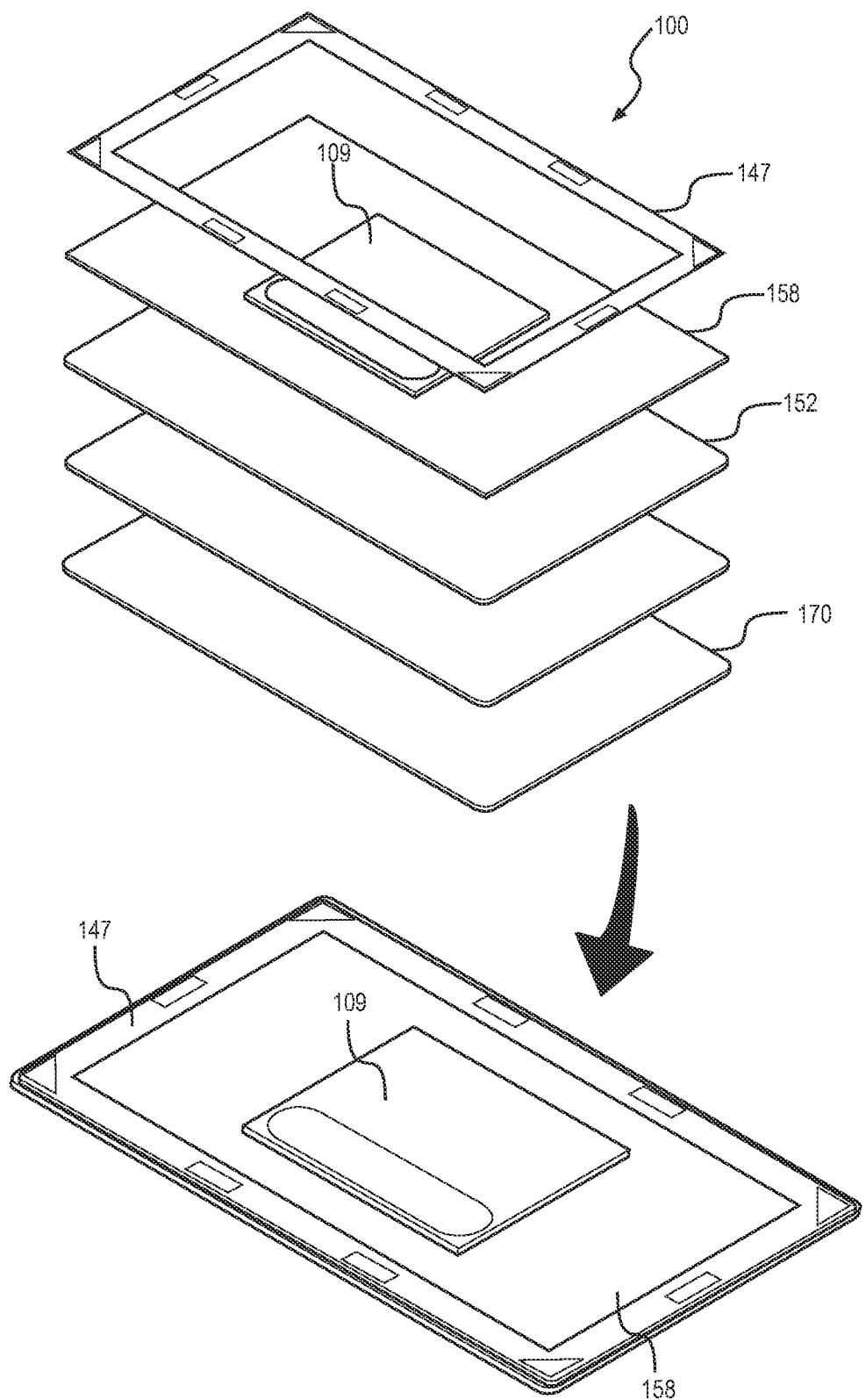
FIG. 33 is a schematic representation of one variation of the system.

In one implementation shown in FIGS. 30 and 33, the system 100 includes: the stiffener layer 158 formed of a rigid material (e.g., mylar) and interposed between the touch layer and the baseplate; and the substrate 102 including the multi-layer inductor 150 and bonded to a bottom surface of the stiffener layer 158. In this implementation, the stiffener layer 158: spans a target area matching an area of the cover layer 170; and is configured to rigidly support the touch layer and the cover layer 170 arranged over the stiffener layer 158. In particular, the stiffener layer 158 is configured to structurally support the cover layer 170 (i.e., add stiffness to the system 100) to receive touch inputs and thus: supports the implementation of flexible top surfaces (e.g., PET with hard coat); and/or supports implementation of non-planer touch sensors for the system 100, such as about a steering wheel of a vehicle and/or convex edges of a mobile device.

Additionally, the substrate 102: spans an area less than the target area of the stiffener layer 158; and is coupled (e.g., bonded) to a bottom surface of the stiffener layer 158. The system 100 includes: a baseplate defining a first nominal plane; the stiffener layer 158 arranged over the baseplate; and a set of spacers 160 coupling the baseplate to the bottom surface of the stiffener layer 158 and configured to locate the substrate 102—arranged on the bottom surface of the stiffener layer 158—in alignment with the nominal plane defined by the baseplate.

For example, the system 100 can include a cover layer 170, a touch layer, a substrate 102, and a baseplate that are coupled to define a target height (e.g., 1.9 millimeter-2.2 millimeter). The system 100 can include: the cover layer 170 formed of a mylar material and defining a target area; the touch layer arranged (e.g., bonded via PSA) below the cover layer 170 and spanning the target area; and the stiffener layer 158—formed of a metal material—arranged below the touch layer and spanning the target area. In this example, the system 100 can also include: the cover layer 170 defining a first target thickness (e.g., 0.2 mm-0.4 mm); the touch layer defining a second target thickness (0.1 mm-0.15 mm); and the stiffener layer 158 defining a third target thickness (0.6 mm-0.8 mm). The system 100 can then include: the substrate 102 defining a fourth target thickness (e.g., 0.40 mm-0.50 mm) bonded to a bottom surface of the stiffener layer 158; and the baseplate defining a fifth target thickness (e.g., 0.9 mm-1.1 mm). Thus, when assembled, the system 100 can define a touch sensor constrained to the target height (e.g., 1.9 mm-2.1 mm) while maintaining mechanical integrity of the system 100.

Therefore, the system 100 can include the stiffener layer 158 to support implementations of a cover layer 170 of a reduced thickness (e.g., 0.5 mm-0.7 mm) and formed of a flexible material (e.g., glass layer, plastic layer) while retaining mechanical integrity of the system 100.

In another example, the set of touch layers 152 are formed of a flexible material and includes: a top touch layer defining a top surface; a bottom touch layer opposite the top touch layer defining a bottom surface; and the set of electrodes 146 printed across the top touch layer and the bottom touch layer. In this example, the system 100 includes the cover layer 170 bonded across the top surface of the top touch layer to define a touch sensor surface 172. Additionally, the system 100 also includes the stiffener layer 158: formed of a rigid material; spanning the first area below the bottom touch layer; and interposed between the bottom touch layer and the set of inductor layers 109 to rigidly support the set of touch layers 152 below the touch sensor surface 172.

16.2 Stiffener Layer+Embedded PCBA

Figure 31:
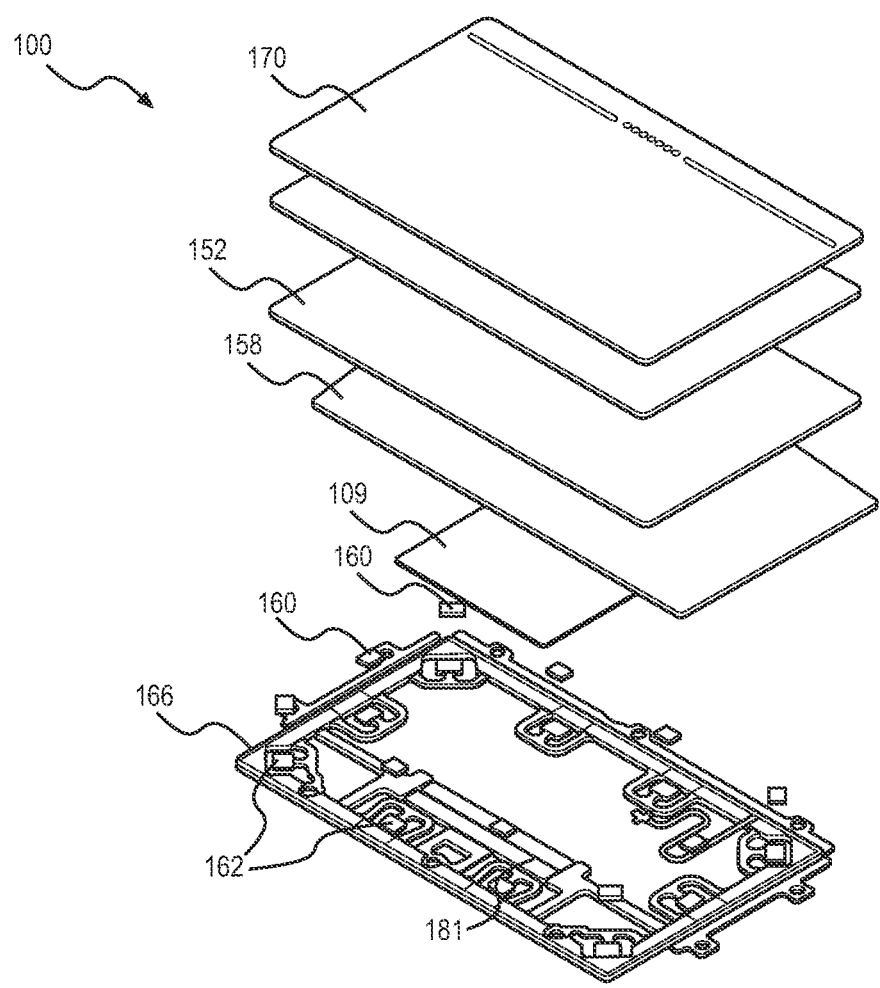
FIG. 31 is a schematic representation of one variation of the system.

In one implementation shown in FIGS. 31 and 33, the system 100 includes: the stiffener layer 158 arranged above the baseplate; a magnetic element 181 arranged within the baseplate; and the substrate 102 arranged within the stiffener layer 158 and defining the multi-layer inductor 150 facing the magnetic element 181 arranged within the baseplate. In this implementation, the system 100 can include: the stiffener layer 158 defining a second nominal plane arranged above the first nominal plane defined by the baseplate; and the substrate 102 centrally arranged within the stiffener layer 158 and in alignment with the second nominal plane defined by the stiffener layer 158.

For example, the system 100 can include: the stiffener layer 158 including a cutout (e.g., stamped cutout, laser cutout) centrally formed within the target area of the stiffener layer 158; and the substrate 102 arranged within the cutout and in alignment with the second nominal plane defined by the stiffener layer 158. In another example, the system 100 can include: the stiffener layer 158 defining a cavity centrally formed at a bottom surface of the stiffener layer 158; and the substrate 102 nested within the cavity formed within the stiffener layer 158 and in alignment with the second nominal plane defined by the stiffener layer 158.

Therefore, the system 100 can include the substrate 102 nested within the stiffener layer 158 in order to reduce overall vertical height for the system 100 while maintaining mechanical integrity during operation of the system 100.

In another example, the stiffener layer 158: defines a top surface of a non-planar geometry; defines a flat bottom surface opposite the top surface; and includes a cavity inset from the flat bottom surface. Thus, the system 100 can include the set of inductor layers 109 nested within the cavity of the stiffener layer 158. Additionally, the baseplate is arranged below the stiffener layer 158 and supports the first magnetic element 181 facing the first multi-layer inductor 150.

16.3 Complex Stiffener Layer

In one implementation shown in FIGS. 30 and 31, the system 100 can include: a stiffener layer 158 formed in a target shape (e.g., semi-circular, convex, concave) and defining a top surface and a bottom surface; a touch layer arranged across the top surface of the stiffener and conforming to the target shape of the stiffener layer 158; and a force touch layer arranged across the bottom surface of the stiffener and conforming to the target shape of the stiffener layer 158. In this implementation, the system 100 includes: the baseplate arranged below the stiffener layer 158 and including a set of spacers 160 coupling the baseplate to the bottom surface of the stiffener layer 158; and the substrate 102 coupled to the stiffener layer 158 and defining a multi-layer inductor 150 facing a magnetic element 181 located within the baseplate. Thus, the system 100 can: define a touch sensor including a non-planar touch sensor surface 172; and maintain mechanical integrity of the touch sensor when receiving touch inputs at the non-planar touch sensor surface 172.

In one example, the stiffener layer 158 defines a non-planar geometry (e.g., concave, convex geometry) and is configured to: rigidly support the set of touch layers 152 in a target shape (e.g., C-shape) and locate the set of inductor layers 109 over the magnetic element 181. In particular, the system 100 can include a baseplate: arranged below the stiffener layer 158; and defining a second non-planar geometry cooperating with the first non-planar geometry to define a cavity between the stiffener layer 158 and the baseplate. Thus, the system 100 can include the set of inductor layers 109 arranged within the cavity facing the magnetic element 181. Furthermore, the system 100 can include a set of spacers 160: coupling the baseplate to the stiffener layer 158; and locating the first magnetic element 181 facing the first multi-layer inductor 150.

16.3.1 Complex Stiffener Layer+Complex Baseplate

In one implementation shown in FIG. 30, the system 100 includes: the stiffener layer 158 formed in a non-planar geometry including a convex top surface and a concave bottom surface; and a baseplate arranged below the stiffener layer 158. In this implementation, the baseplate: is formed in the non-planar geometry; is arranged parallel to the stiffener layer 158; and includes a set of spacers 160 coupling the baseplate to the concave bottom surface of the stiffener layer 158.

Additionally, the system 100 includes the substrate 102: interposed between the stiffener layer 158 and the baseplate; and defining a multi-layer inductor 150 facing a magnetic element 181 located within the baseplate. In this implementation, the system 100 includes the touch layer: formed of a flexible material (e.g., PET layer); including an array of drive and sense electrode pairs 105 arranged (e.g., printed) across the touch layer defining a touch sensor; and arranged across the convex top surface of the stiffener layer 158. The system 100 also includes the force touch layer: formed of the flexible material (e.g., PET); including a set of sense electrodes arranged (e.g., printed) across the force touch layer; and arranged across the concave bottom surface of the stiffener layer 158 in alignment to a set of drive electrodes arranged across a top surface of the baseplate to define a set of force sensors.

Therefore, the system 100 can: define a non-planar touch sensor surface 172; interpret a force magnitude for a touch input applied to the non-planar touch sensor surface 172; and execute haptic feedback cycles to oscillate the non-planar touch sensor surface 172 in response to interpreting a force magnitude exceeding a threshold force magnitude.

16.3.2 Complex Stiffener Layer+Uniform Baseplate

In another implementation shown in FIG. 31, the system 100 includes the stiffener layer 158: formed in a non-planar geometry; defining convex top surface; defining a flat bottom surface defining a second nominal plane; and including a cavity formed into the stiffener layer 158 at the flat bottom surface. In this implementation, the baseplate: is arranged below the stiffener layer 158; defines the first nominal plane located in parallel to the second nominal plane of the stiffener layer 158; and includes a set of spacers 160 coupling the baseplate to the flat bottom surface of the stiffener layer 158.

Additionally, the system 100 includes the substrate 102: nested within the cavity of the stiffener layer 158; arranged flush with the second nominal planed defined by the stiffener layer 158; and defining a multi-layer inductor 150 facing a magnetic element 181 located within the baseplate. The system 100 also includes the touch layer: formed of a flexible material (e.g., PET layer); including an array of drive and sense electrode pairs 105 arranged (e.g., printed) across the touch layer defining a touch sensor; and arranged across the convex top surface of the stiffener layer 158. The system 100 also includes the force touch layer: formed of the flexible material (e.g., PET); including a set of sense electrodes arranged (e.g., printed) across the force touch layer; and arranged across the flat bottom surface of the stiffener layer 158 in alignment to a set of drive electrodes arranged across a top surface of the baseplate to define a set of force sensors.

Therefore, the system 100 can: define a non-planar touch sensor surface 172; interpret a force magnitude for a touch input applied to the non-planar touch sensor surface 172; and execute haptic feedback cycles to oscillate the non-planar touch sensor surface 172 in response to interpreting a force magnitude exceeding a threshold force magnitude.

16.4 Stiffener Layer+Force Flex

Figure 32:
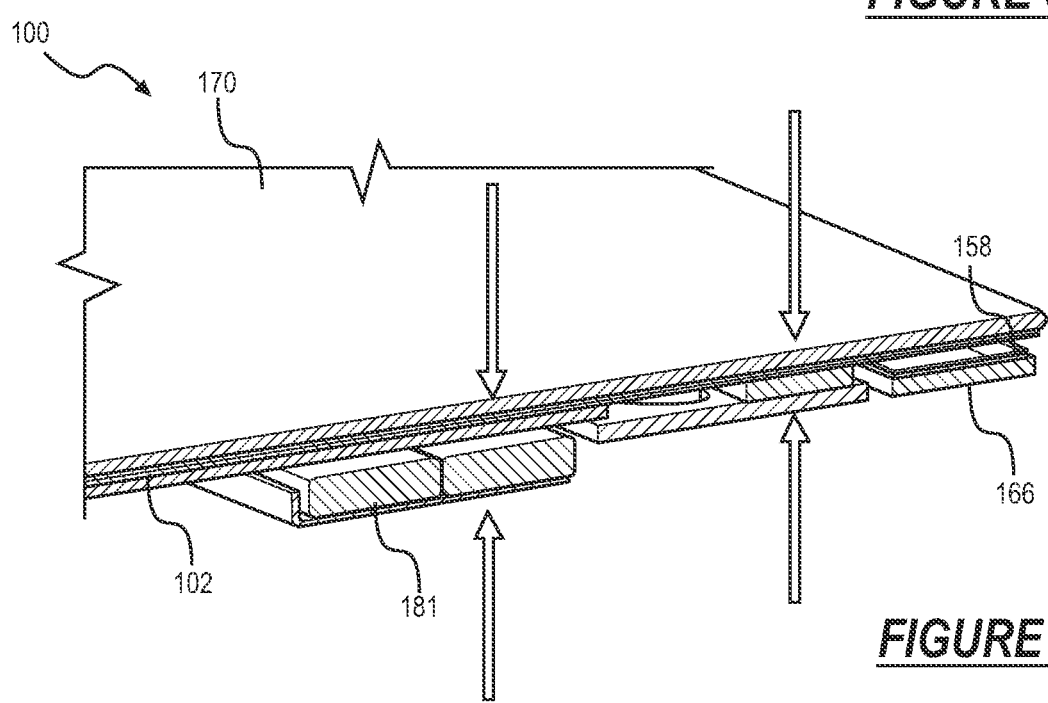
FIG. 32 is a schematic representation of one variation of the system.

In one implementation shown in FIGS. 31, 32, and 33, the system 100 includes the force sense layer: formed of a flexible material (e.g., PET); including a set of sense electrodes arranged across (e.g., printed) the force sense layer; and bonded to a bottom surface of the stiffener layer 158 in order to locate the set of sense electrodes facing the baseplate. Additionally, the system 100 includes the baseplate: arranged below the stiffener layer 158; and including a set of drive electrodes arranged across the top surface of the baseplate. In this implementation, the system 100 further includes a set of spacers 160: interposed between the stiffener layer 158 and the baseplate; and coupling the stiffener layer 158 to the baseplate to locate the set of drive electrodes on the baseplate in alignment with the set of sense electrodes on the force sense layer defining a set of capacitance force sensors below the stiffener layer 158.

In one example, the force sense layer: includes a first PET layer bonded to the bottom surface of the stiffener layer 158; and includes a set of sense electrodes arranged (e.g., printed) about the perimeter of the PET layer. Additionally, the baseplate: includes a second PET layer bonded to the top surface of the baseplate; and includes a set of drive electrodes arranged (e.g., printed) about the perimeter of the baseplate. In this example, the system 100 includes the set of spacers 160: interposed between the first PET layer and the second PET layer; and configured to locate the first set of sense electrodes in alignment with the second set of drive electrodes in order to define a set of force sensors.

Therefore, the system 100 can include the stiffener layer 158 to rigidly support the touch layer and the force touch layer at a target height while maintaining structural integrity of the system 100.

16.6 Example: Printed Touch+4-Layer PCBA+Plastic Top Surface

In one example, the system 100 includes: a cover layer 170; a touch layer; a stiffener layer 158; a substrate 102; a force sensing layer; a magnetic element 181; and a baseplate.

The cover layer 170: is formed of a flexible material (e.g., mylar); and defines a touch sensor surface 172 configured to receive touch inputs from a user.

The touch layer: is formed of a flexible material (e.g., PET layer); includes a first array of drive and sense electrode pairs 105 printed across the touch layer to form a touch sensor; spans a target area matching an area of the cover layer 170; and is bonded (e.g., PSA) below the cover layer 170.

The stiffener layer 158: is formed of a rigid material (e.g., metal); spans the target area matching the area of the cover layer 170 and the touch layer; is arranged below the touch layer; and is configured to rigidly support the touch layer and the cover layer 170 over the baseplate.

The substrate 102: spans an area less than the target area; is arranged below the stiffener layer 158; and includes a set of inductor layers 109 forming a multi-layer inductor 150. In this example, the system 100 can include the substrate 102: bonded (e.g., PSA) to a bottom surface of the stiffener layer 158; or embedded within a cutout (e.g., rectangular cutout) formed into the stiffener layer 158.

The force sensing layer: is formed of a flexible material (e.g., PET layer); is arranged (e.g., bonded) below the stiffener layer 158; and includes a first set of sense electrodes printed across the force sensing layer.

The baseplate: is arranged below the force sensing layer; includes a set of drive electrodes arranged across the baseplate and aligned with the set of sense electrodes to form an array of force sensors; includes a set of spring elements 162 arranged about the baseplate; and includes a set of spacers 160 located at the set of spring elements 162 and configured to support the stiffener layer 158 over the baseplate.

The magnetic element 181: is arranged within the baseplate; is facing the multi-layer inductor 150; and defines a first polarity.

In this example, the system 100 can also include a controller 190 configured to: read a first set of electrical values from the touch layer; read a second set of electrical values from the force sensing layer; interpret a touch input at a first location on the cover layer 170 based on the first set of electrical values; interpret a force magnitude for the touch input based the second set of electrical values; and, in response to the force magnitude exceeding a target force magnitude, trigger a haptic feedback cycle by driving an oscillating voltage across the multi-layer inductor 150 to magnetically couple the magnetic element 181.

The systems and methods described herein can be embodied and/or implemented at least in part as a machine configured to receive a computer-readable medium storing computer-readable instructions. The instructions can be executed by computer-executable components integrated with the application, applet, host, server, network, website, communication service, communication interface, hardware/firmware/software elements of a user computer or mobile device, wristband, smartphone, or any suitable combination thereof. Other systems and methods of the embodiment can be embodied and/or implemented at least in part as a machine configured to receive a computer-readable medium storing computer-readable instructions. The instructions can be executed by computer-executable components integrated by computer-executable components integrated with apparatuses and networks of the type described above. The computer-readable medium can be stored on any suitable computer readable media such as RAMs, ROMs, flash memory, EEPROMs, optical devices (CD or DVD), hard drives, floppy drives, or any suitable device. The computer-executable component can be a processor but any suitable dedicated hardware device can (alternatively or additionally) execute the instructions.

As a person skilled in the art will recognize from the previous detailed description and from the figures and claims, modifications and changes can be made to the embodiments of the invention without departing from the scope of this invention as defined in the following claims.

We claim:

1. A system comprising:
a set of touch layers:
spanning a first area; and
comprising a first set of electrodes arranged across the set of touch layers;
a set of inductor layers:
arranged below the set of touch layers;
spanning a second area less than the first area; and
comprising a first set of spiral traces arranged across the set of inductor layers to define a first multi-layer inductor;
a magnetic element arranged below the set of inductor layers and defining a first polarity facing the first multi-layer inductor; and
a controller configured to:
detect a first touch input at a first location over the set of touch layers;
read a first set of electrical values from the first set of electrodes;
interpret a first force magnitude of the first touch input based on the first set of electrical values; and
in response to the first force magnitude exceeding a target force magnitude, drive an oscillating voltage across the first multi-layer inductor to induce alternating magnetic coupling between the first multi-layer inductor and the first magnetic element.

2. The system of claim 1:
wherein the set of touch layers comprises a bottom layer:
comprising a first subset of sense electrodes, in the first set of electrodes, arranged proximal a set of support locations across the bottom layer; and
configured to electrically couple a subset of drive electrodes, in the first set of electrodes, arranged opposite the first set of electrodes; and
wherein the controller is configured to:
read the first set of electrical values from the first set of electrodes across the bottom layer representing variations in force magnitudes responsive to application of a touch input over the set of touch layers; and
interpret the first force magnitude of the first touch input based on deviations of the first set of electrical values from a baseline set of electrical values.

3. The system of claim 1:
wherein the set of touch layers comprises:
a first touch layer comprising a first subset of sense electrodes, in the set of electrodes, arranged across the first touch layer;
a second touch layer:
arranged below the first touch layer; and
comprising a second subset of drive electrodes, in the set of electrodes, arranged across the second touch layer and cooperating with the first subset of sense electrodes to form an array of drive and sense electrode pairs; and
a cover layer arranged over the first touch layer defining a touch sensor surface; and
wherein the controller is configured to:
read a second set of electrical values from the array of drive and sense electrode pairs; and
detect the first touch input at the first location on the touch sensor surface based on the second set of electrical values.

4. The system of claim 1:
wherein the set of inductor layers comprises:
a first inductor layer:
arranged below a bottom layer in the set of touch layers; and
comprising a first spiral trace, in the set of spiral traces, coiled in a first direction across the first layer; and
a second inductor layer:
arranged below the first inductor layer;
comprising a second spiral trace, in the set of spiral traces, coiled in a second direction, opposite the first direction, across the second layer; and
cooperating with the first inductor layer to define the first multi-layer inductor; and
wherein the controller is configured to, in response to the first force magnitude exceeding a target force magnitude, drive an oscillating voltage across the first spiral trace and the second spiral trace to induce alternating magnetic coupling between the first multi-layer inductor and the first magnetic element.

5. The system of claim 1:
wherein the set of touch layers comprises:
a first subset of touch layers comprising an array of drive and sense electrode pairs arranged across the first subset of touch layers;
a cover layer arranged over the first subset of touch layers defining a touch sensor surface; and
a second subset of touch layers arranged below the first subset of touch layers and comprising the first set of electrodes:
arranged proximal a set of support locations at a bottom layer in the subset of layers; and
configured to electrically couple a set of coupling regions arranged opposite the first set of electrodes; and
wherein the controller is configured to:
read a second set of electrical values from the array of drive and sense electrode pairs;
detect the first touch input at the first location on the touch sensor surface based on the second set of electrical values;
read the first set of electrical values from the first subset of sense electrodes, in the set of electrodes; and
interpret the first force magnitude of the first touch input based on deviations of the first set of electrical values from a baseline set of electrical values.

6. The system of claim 5:
wherein the second subset of touch layers comprises:
a third touch layer comprising a third spiral trace coiled in a first direction across the third touch layer; and
the bottom layer comprising a bottom spiral trace:
coiled in a second direction, opposite the first direction;
coupled to the third spiral trace; and
cooperating with the third spiral trace and the set of spiral traces across the set of inductor layers to form the first multi-layer inductor; and
wherein the controller is configured to, in response to the first force magnitude exceeding a target force magnitude, drive an oscillating voltage across the third spiral trace, bottom spiral trace, and the set of spiral traces to induce alternating magnetic coupling between the first multi-layer inductor and the first magnetic element.

7. The system of claim 1:
wherein the set of touch layers comprises:
a first touch layer comprising an array of drive and sense electrode pairs; and
a second touch layer:
arranged below the first touch layer;
defining a set of support locations about a periphery of the second touch layer; and
comprising the first set of electrodes arranged proximal the first set of support locations at the second touch layer; and
wherein the controller is configured to:
detect the first touch input based on a second set of electrical values output from the array of drive and sense electrode pairs on the first touch layer; and
interpret the first force magnitude based on the first set of electrical values output from the first set of electrodes on the second touch layer.

8. The system of claim 7, wherein the set of inductor layers comprises:
a first inductor layer comprising a first spiral trace, in the set of spiral traces, coiled in a first direction across the first inductor layer;
a second inductor layer:
arranged below the first inductor layer; and
comprising a second spiral trace, in the set of spiral traces:
coiled in a second direction opposite the first direction across the second inductor layer; and
coupled to the first spiral trace;

a third inductor layer:
  arranged below the second inductor layer; and
  comprising a third spiral trace, in the set of spiral traces:
    coiled in the first direction across the third inductor layer; and
    coupled to the second spiral trace; and
a fourth inductor layer:
  arranged below the third inductor layer; and
  comprising a fourth spiral trace, in the set of spiral traces:
    coiled in the second direction opposite the first direction across the fourth inductor layer;
    coupled to the third spiral trace; and
    cooperating with the third spiral trace, the second spiral trace, and the first spiral trace to form the first multi-layer inductor facing the magnetic element.

9. The system of claim 1:
wherein the set of touch layers:
  are formed of a flexible material; and
  comprises the set of electrodes printed across the first set of touch layers to define an array of drive and sense electrode pairs; and
further comprising a cover layer:
  bonded to a top layer in the set of touch layers;
  arranged over the array of drive and sense electrode pairs to define a touch sensor surface; and
  arranged opposite the set of inductor layers to locate the set of touch layers interposed between the cover layer and the set of inductor layers.

10. The system of claim 1:
further comprising a display element:
  spanning the first area; and
  defining a top surface and a bottom surface;
wherein the set of touch layers are formed of a flexible material and comprises:
  a first subset of touch layers:
    bonded to the top surface of the display element; and
    comprising an array of drive and sense electrode pairs printed across the first subset of touch layers; and
  a second subset of touch layers:
    bonded to the bottom surface, opposite the top surface, of the display element; and
    comprising the set of electrodes printed across the second subset of touch layers; and
further comprising a cover layer arranged over the array of drive and sense electrode pairs across the first subset of touch layers to define a touch sensor surface.

11. The system of claim 1:
wherein the set of touch layers are formed of a flexible material and comprises:
  a top touch layer defining a top surface;
  a bottom touch layer opposite the top touch layer defining a bottom surface; and
  the set of electrodes printed across the top touch layer and the bottom touch layer; and
further comprising:
  a cover layer bonded across the top surface of the top touch layer to define a touch sensor surface; and
  a stiffener layer:
    formed of a rigid material; and
    spanning the first area below the bottom touch layer; and
    interposed between the bottom touch layer and the set of inductor layers to rigidly support the set of touch layers below the touch sensor surface.

12. The system of claim 11:
wherein the stiffener layer defines a first non-planar geometry; and
further comprising:
  a baseplate:
    arranged below the stiffener layer; and
    defining a second non-planar geometry cooperating with the first non-planar geometry to define a cavity between the stiffener layer and the baseplate, the set of inductor layers arranged within the cavity; and
  a set of spacers:
    coupling the baseplate to the stiffener layer; and
    locating the first magnetic element facing the first multi-layer inductor.

13. The system of claim 11:
wherein the stiffener layer:
  defines a top surface of a non-planar geometry;
  defines a flat bottom surface opposite the top surface; and
  comprises a cavity inset from the flat bottom surface;
wherein the set of inductor layers are nested within the cavity of the stiffener layer; and
further comprising a baseplate arranged below the stiffener layer and supporting the first magnetic element facing the first multi-layer inductor.

14. The system of claim 1:
wherein the set of touch layers comprises a bottom layer:
  defining a set of support locations about a periphery of the bottom layer; and
  comprising a first subset of sense electrodes, in the first set of electrodes, arranged proximal the set of support locations; and
further comprising:
  a baseplate:
    arranged below the bottom layer in the set of touch layers; and
    comprising a second subset of drive electrodes arranged across a top surface of the baseplate in alignment with the first subset of sense electrodes across the bottom layer to form an array of capacitive force sensors;
  a set of spacers:
    interposed between the baseplate and the bottom layer;
    arranged at the set of support locations on the bottom layer; and
    configured to deflect the first subset of sense electrodes toward the second subset of drive electrodes responsive to application of a touch input over the set of touch layers.

15. A system comprising:
a set of touch layers spanning a first area and comprising:
  a first subset of touch layers comprising an array of drive and sense electrode pairs; and
  a second subset of touch layers arranged below the first subset of touch layers and comprising:
    an intermediate layer comprising a first spiral trace coiled in a first direction across the intermediate layer; and
    a bottom layer arranged below the intermediate layer and comprising:

a second spiral trace coupled to the first spiral trace and coiled in a second direction, opposite the first direction, across the bottom layer; and a set of electrodes arranged proximal a set of support locations at the bottom layer;

a set of inductor layers spanning a second area, less than the first area, below the set of touch layers and comprising:

a first inductor layer comprising a third spiral trace coupled to the second spiral trace and coiled in the first direction across the first inductor layer; and a second inductor layer comprising a fourth spiral trace:
coupled to the third spiral trace;
coiled in the second direction, opposite the first direction, across the second inductor layer; and
cooperating with the third spiral trace, second spiral trace, and first spiral trace to form an inductor; and a first magnetic element defining a first polarity facing the inductor and configured to magnetically couple the inductor to oscillate the set of touch layers.

16. The system of claim 15, further comprising a controller configured to:
read a first set of electrical values from the array of drive and sense electrode pairs;
detect a first touch input at a first location over the set of touch layers based on the first set of electrical values;
read a second set of electrical values from the set of electrodes on the bottom layer in the set of touch layers;
interpret a first force magnitude for the first touch input based on the second set of electrical values; and
in response to the first force magnitude exceeding a target force magnitude, drive an oscillating voltage across the inductor to induce alternating magnetic coupling between the inductor and the first magnetic element.

17. The system of claim 15:
wherein the set of touch layers comprises a bottom layer:
defining a set of support locations about a periphery of the bottom layer; and
comprising a first subset of sense electrodes, in the first set of electrodes, arranged proximal the set of support locations; and
further comprising:
a baseplate:
arranged below the bottom layer in the set of touch layers; and
comprising a second subset of drive electrodes arranged across a top surface of the baseplate in alignment with the first subset of sense electrodes across the bottom layer to form an array of capacitive force sensors; and
a set of spacers:
interposed between the baseplate and the bottom layer;
arranged at the set of support locations on the bottom layer; and
configured to deflect the first subset of sense electrodes toward the second subset of drive electrodes responsive to application of a touch input over the set of touch layers.

18. The system of claim 17, wherein the controller is configured to:
detect a first touch input at a first location over the set of touch layers;
read a set of electrical values from the array of capacitive force sensors;
interpret a first force magnitude of the first touch input based on the set of electrical values; and
in response to the first force magnitude exceeding a target force magnitude, drive an oscillating voltage across the inductor to induce alternating magnetic coupling between the inductor and the first magnetic element.

19. The system of claim 15:
wherein the first subset of touch layers are formed of a flexible material and comprises the array of drive and sense electrode pairs printed across the first subset of touch layers; and
further comprising:
a cover layer bonded across a top surface of first subset of touch layers to define a touch sensor surface; and
a stiffener layer:
formed of a rigid material; and
spanning the first area below the first subset of touch layers; and
interposed between a bottom surface of the first subset of touch layers and a top surface of the second subset of touch layers to rigidly support the first subset of touch layers below the touch sensor surface.

* * * * *